(12) United States Patent
Haneda et al.

(10) Patent No.: US 8,575,704 B2
(45) Date of Patent: Nov. 5, 2013

(54) SEMICONDUCTOR DEVICE AND MANUFACTURING METHOD OF THE SEMICONDUCTOR DEVICE

(75) Inventors: Masaki Haneda, Yokohama (JP); Akiyoshi Hatada, Yokohama (JP); Akira Katakami, Yokohama (JP); Yuka Kase, Yokohama (JP); Kazuya Okubo, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 90 days.

(21) Appl. No.: 13/415,482

(22) Filed: Mar. 8, 2012

(65) Prior Publication Data
US 2012/0261760 A1   Oct. 18, 2012

(30) Foreign Application Priority Data
Apr. 18, 2011   (JP) .................................. 2011-092285

(51) Int. Cl.
   *H01L 21/70*   (2006.01)
   *H01L 21/336*   (2006.01)
(52) U.S. Cl.
   USPC .......................................... 257/368; 438/294

(58) Field of Classification Search
   USPC .............. 257/368, E27.06, E21.409; 438/294
   See application file for complete search history.

(56) References Cited

U.S. PATENT DOCUMENTS
2007/0020828 A1   1/2007   Hara

FOREIGN PATENT DOCUMENTS
JP   2007-027231 A   2/2007

*Primary Examiner* — Fernando L Toledo
*Assistant Examiner* — Neil Prasad
(74) *Attorney, Agent, or Firm* — Westerman, Hattori, Daniels & Adrian, LLP

(57) ABSTRACT

A semiconductor device includes a semiconductor substrate, a device region including first and second parts, first and second gate electrodes formed in the first and the second parts, first and second source regions, first and second drain regions, first, second, third, and fourth embedded isolation film regions formed under the first source, the first drain, the second source, and the second drain regions, respectively. Further, the first drain region and the second source region form a single diffusion region, the second and the third embedded isolation film regions form a single embedded isolation film region, an opening is formed in a part of the single diffusion region so as to extend to the second and the third embedded isolation film regions, and the opening is filled with an isolation film.

14 Claims, 85 Drawing Sheets

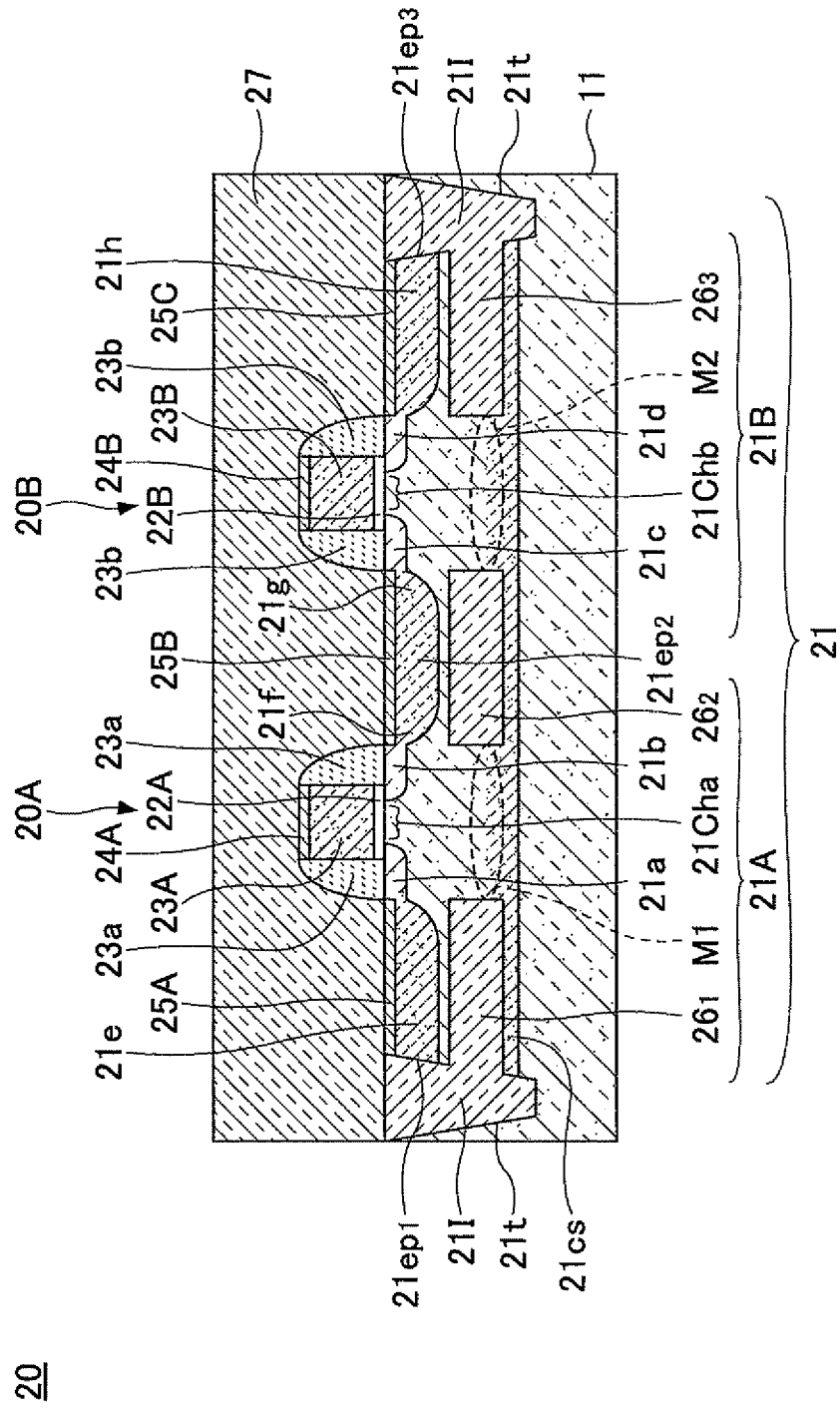

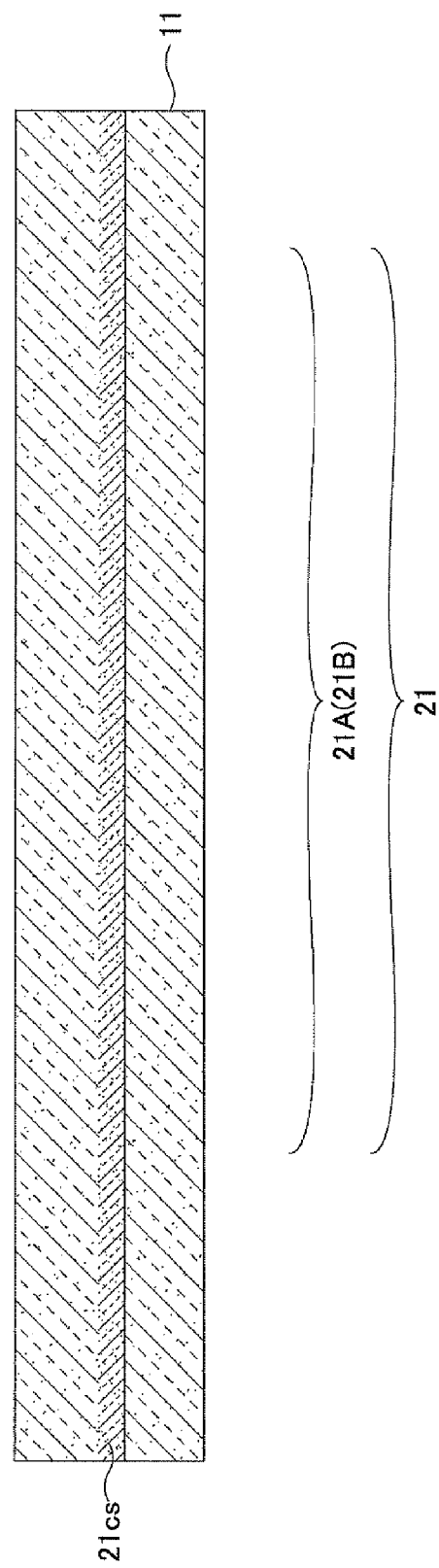

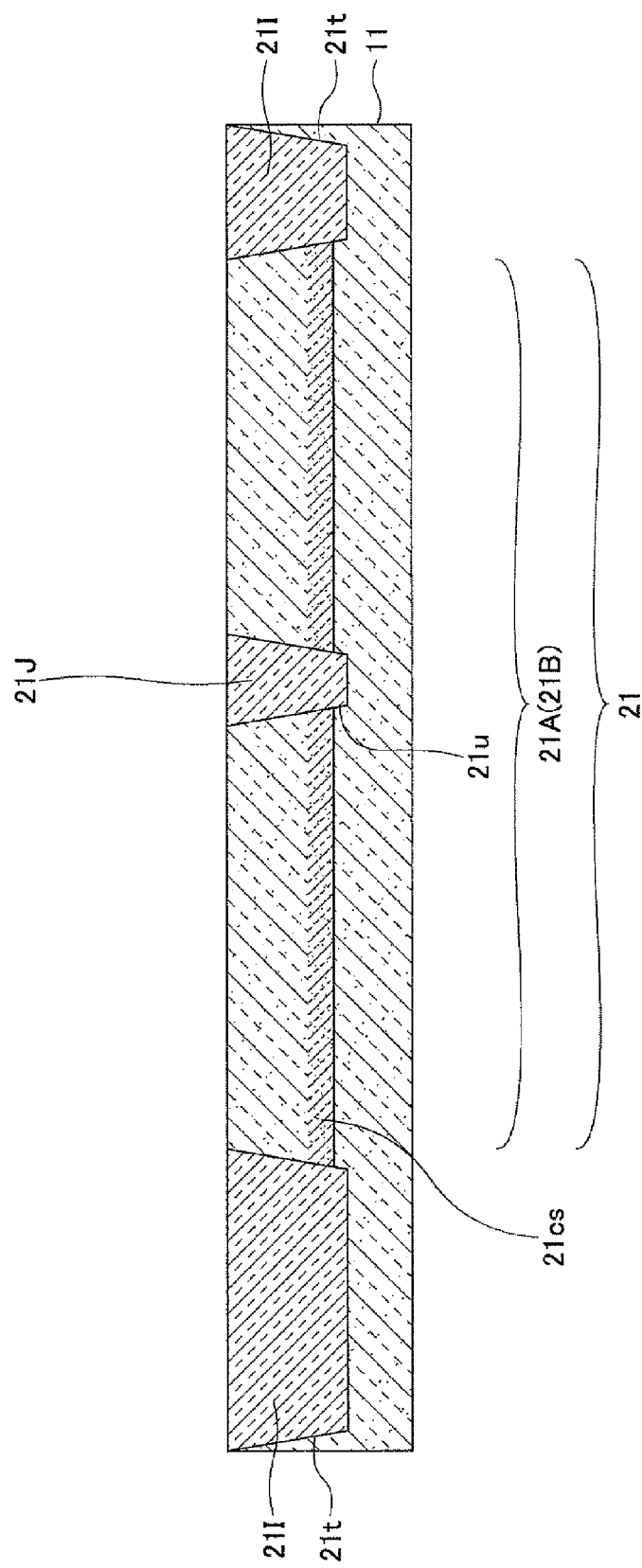

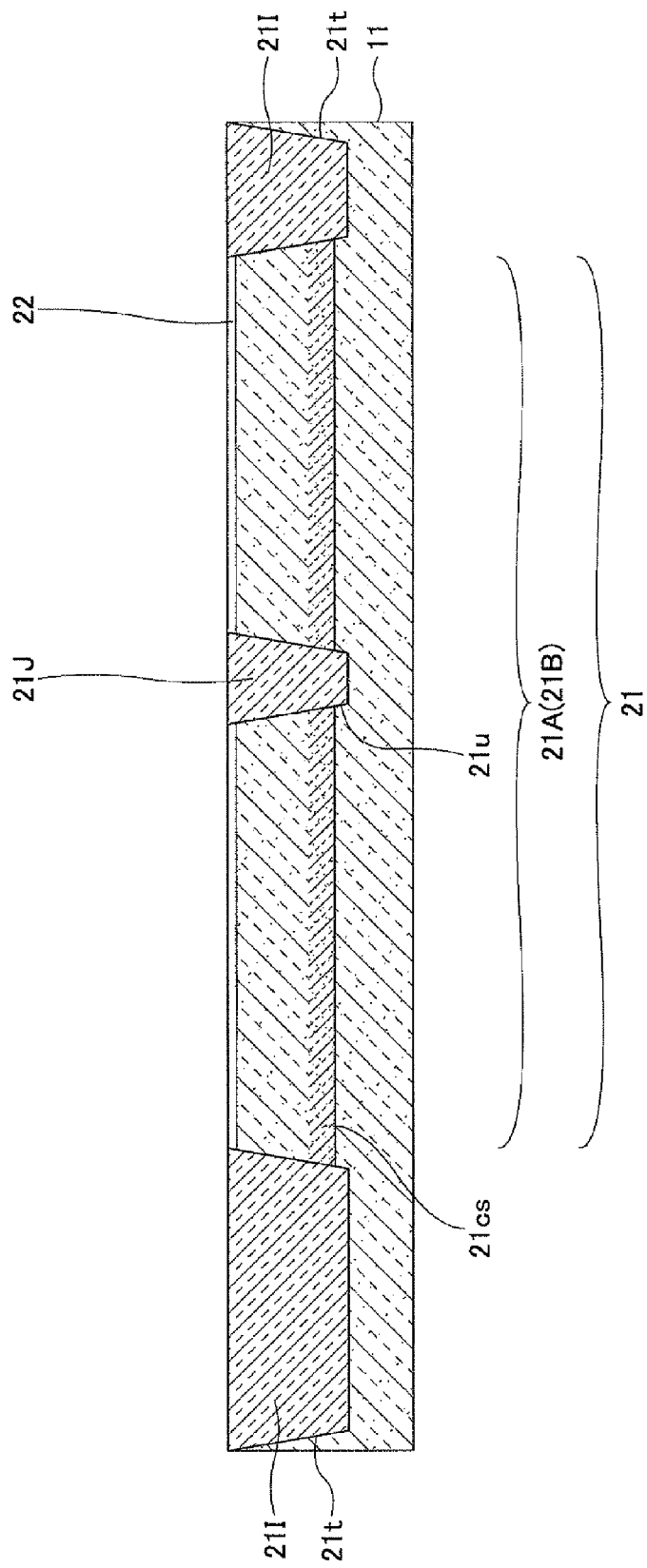

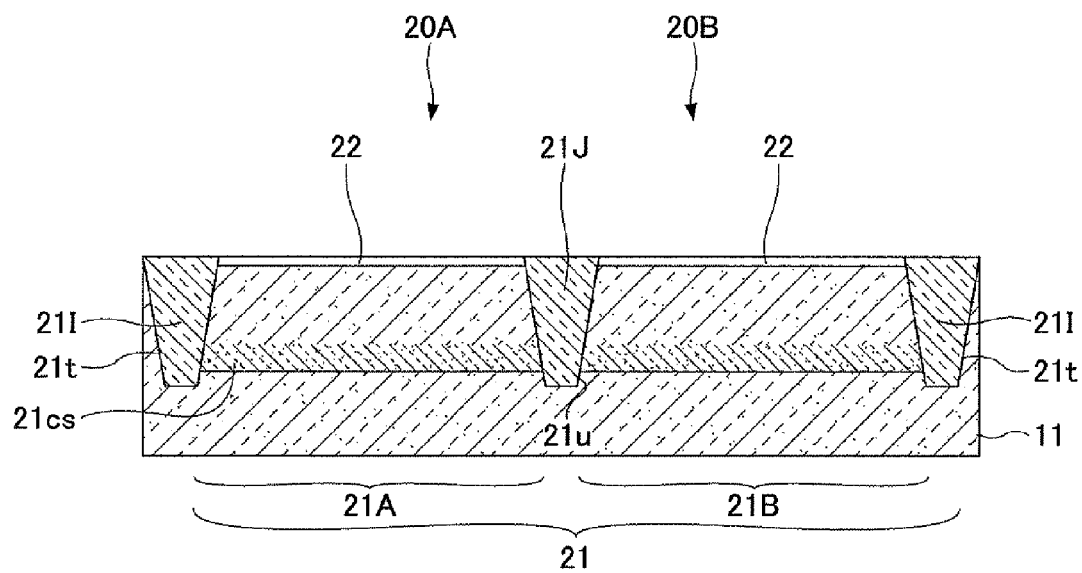
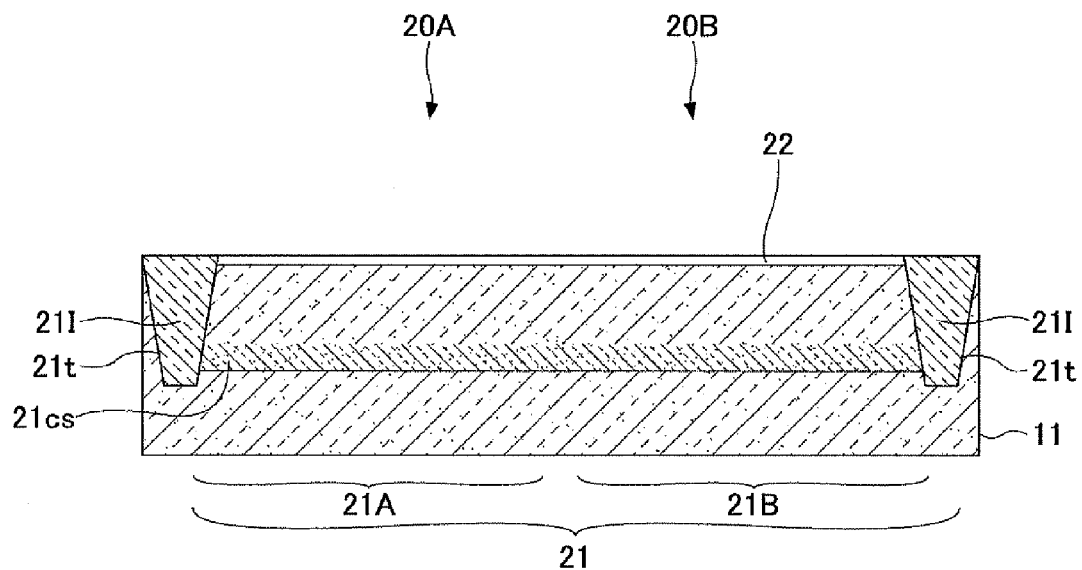

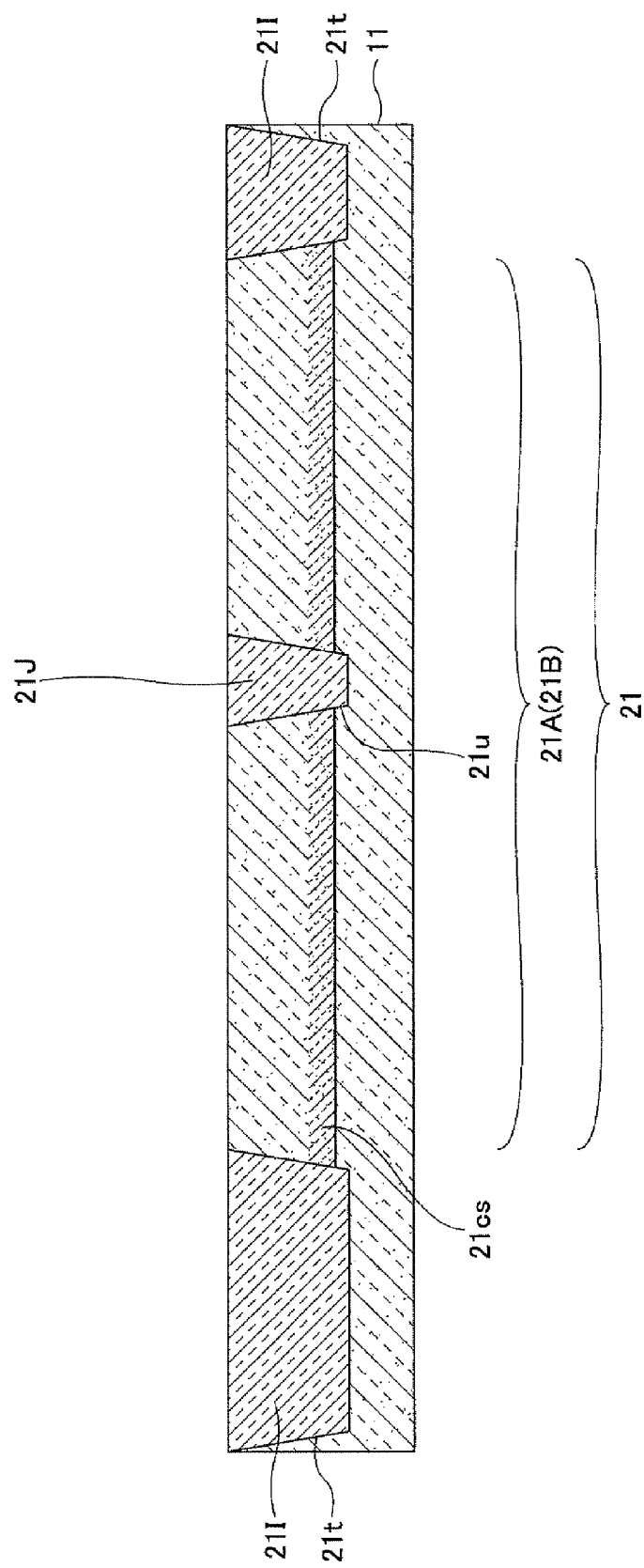

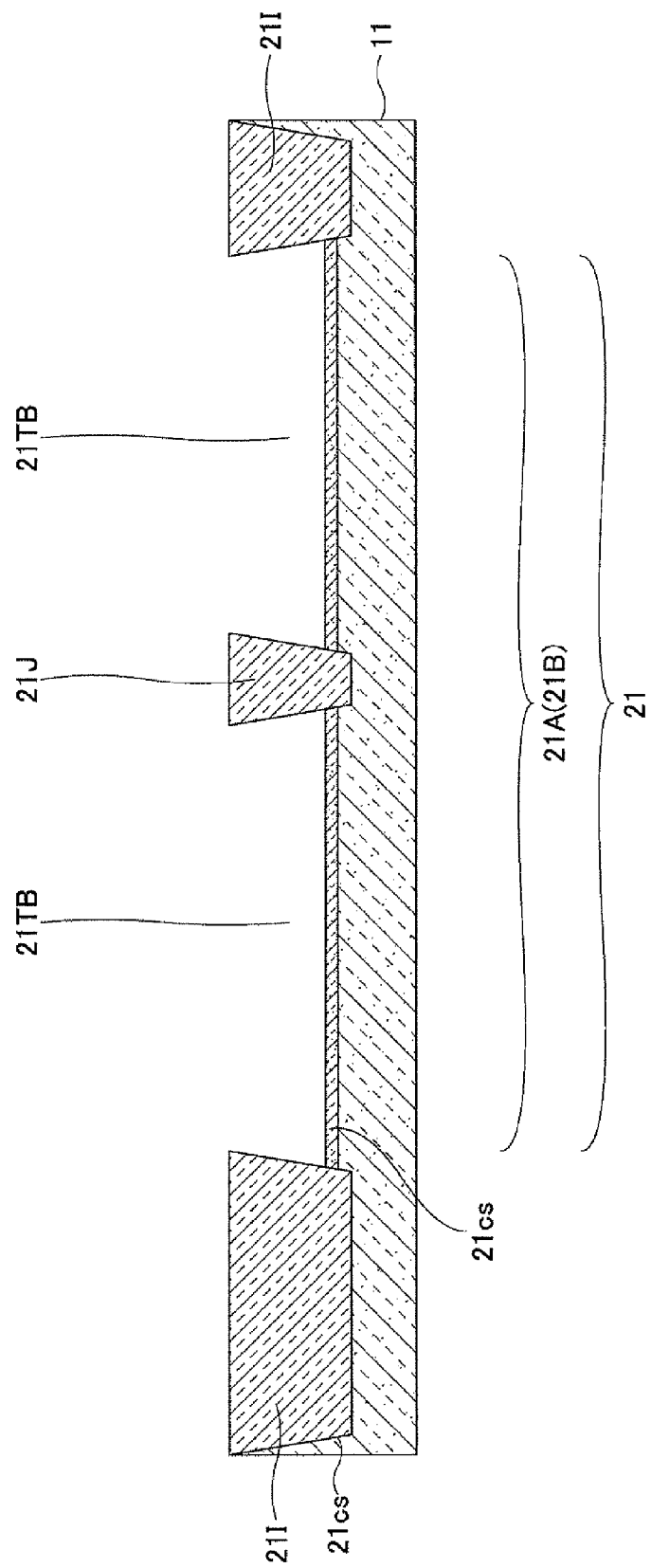

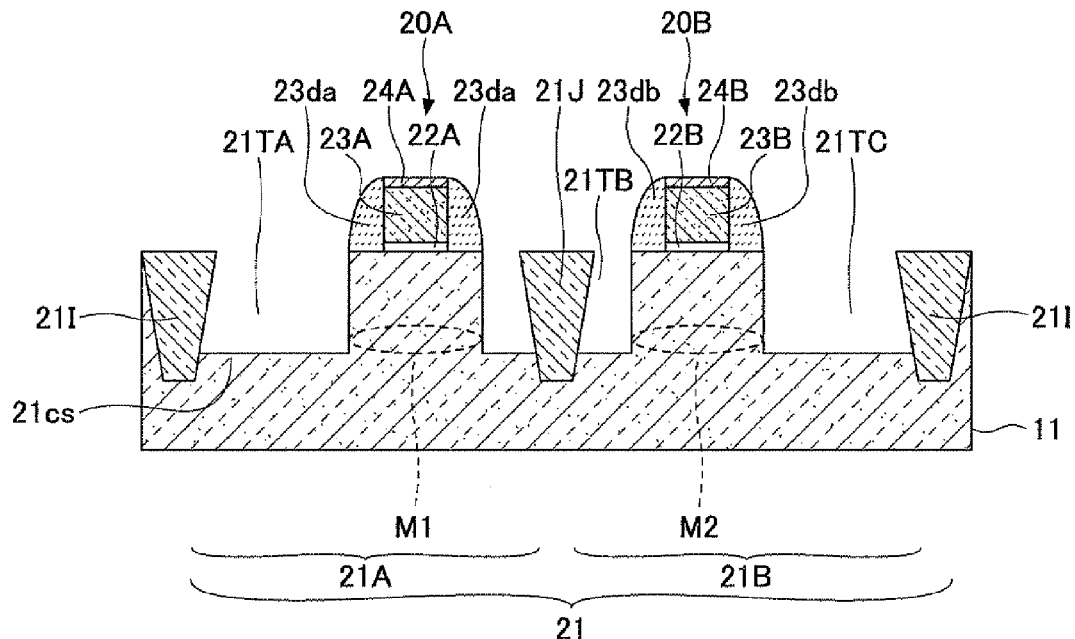
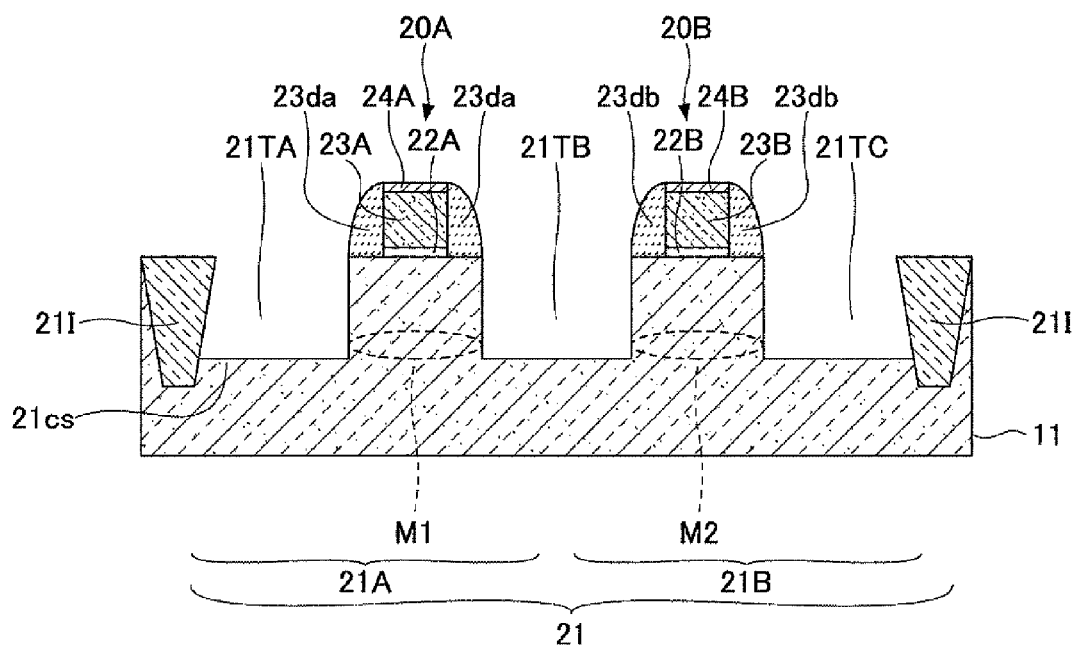

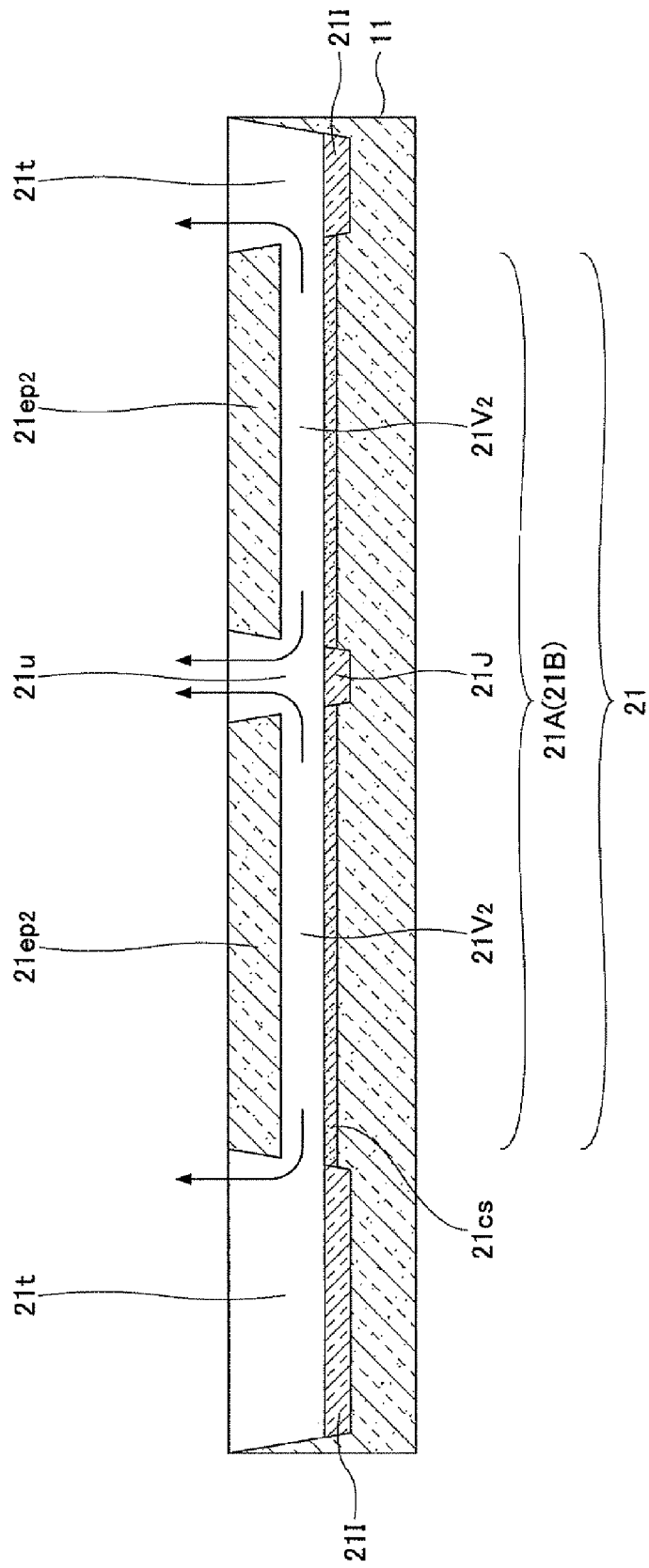

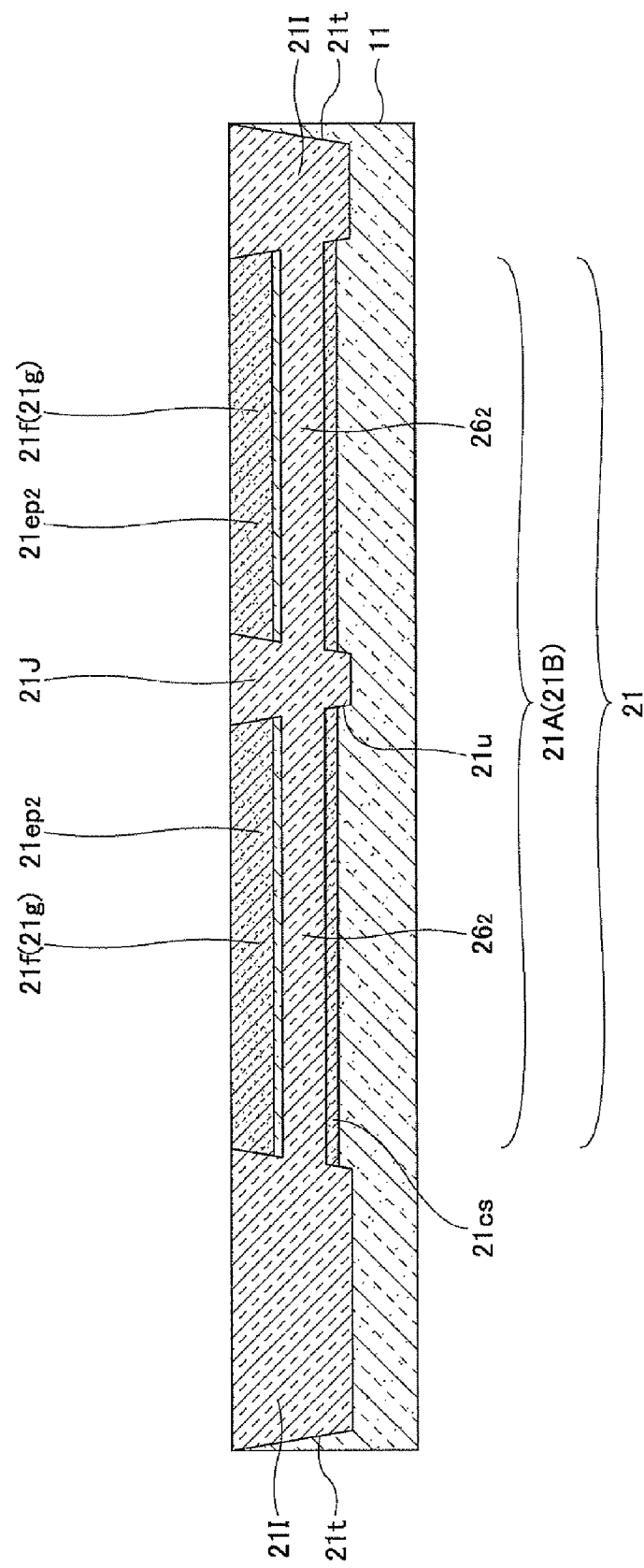

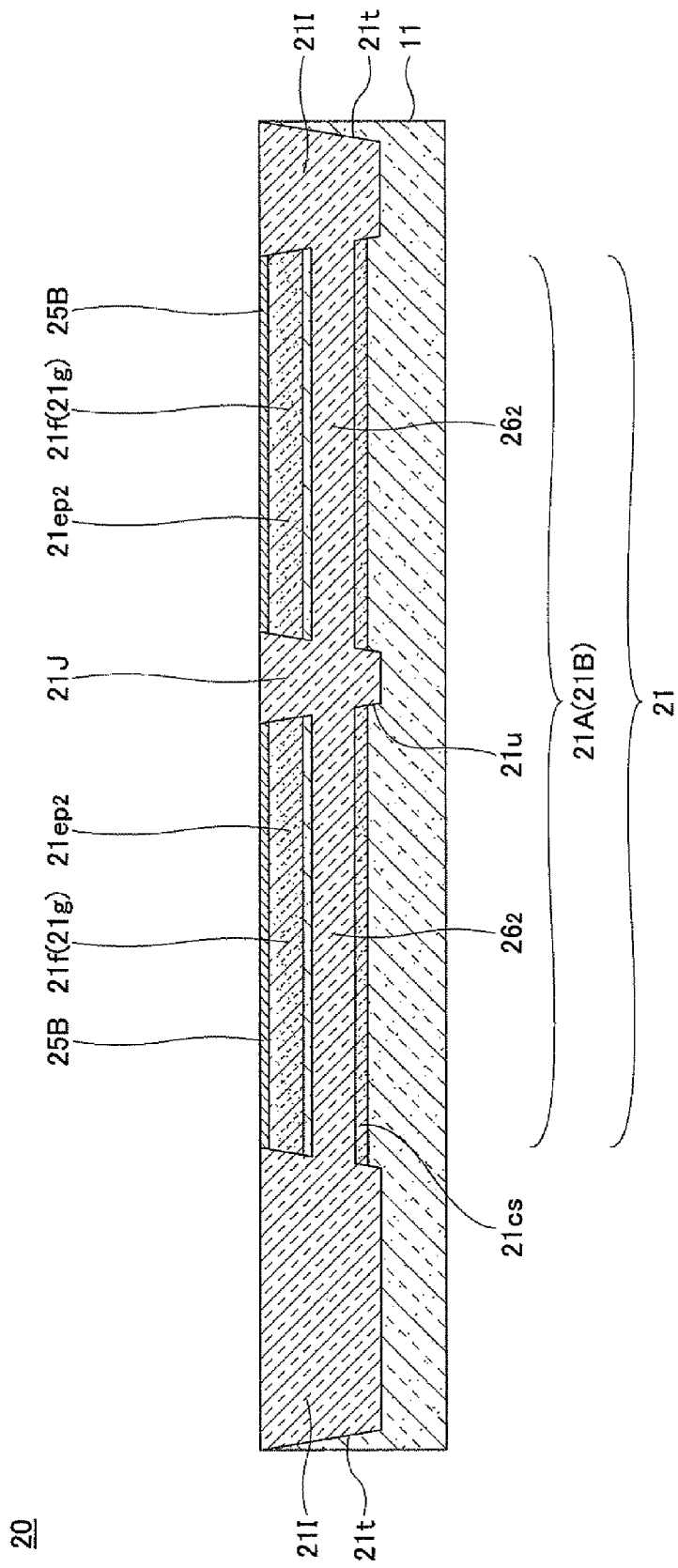

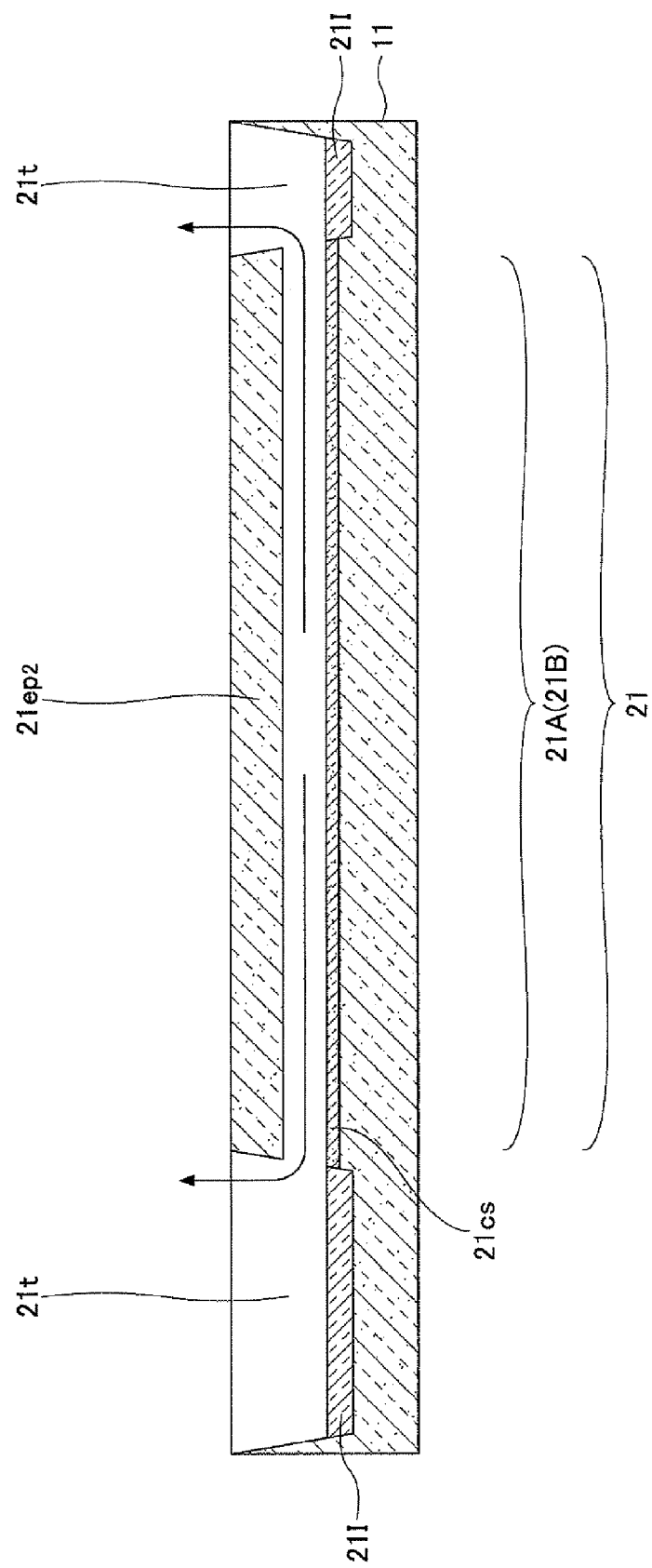

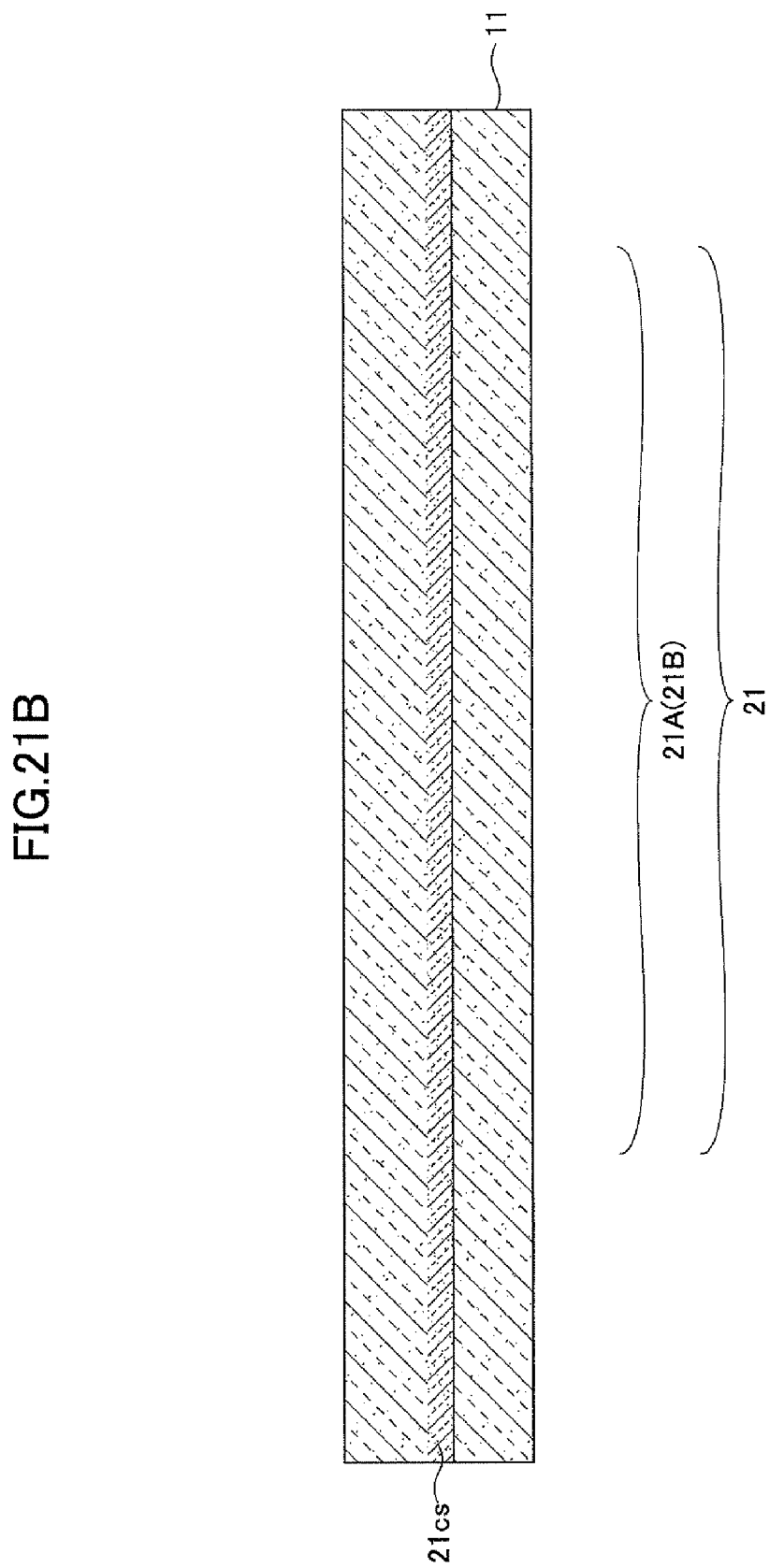

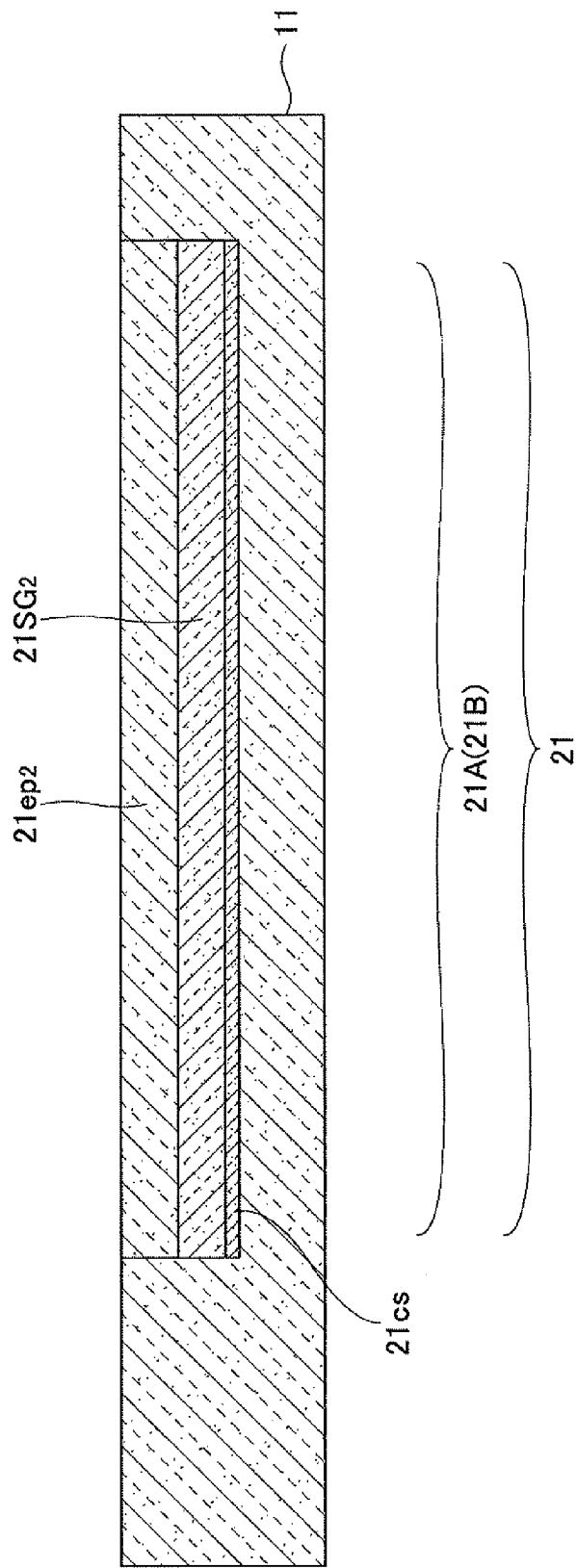

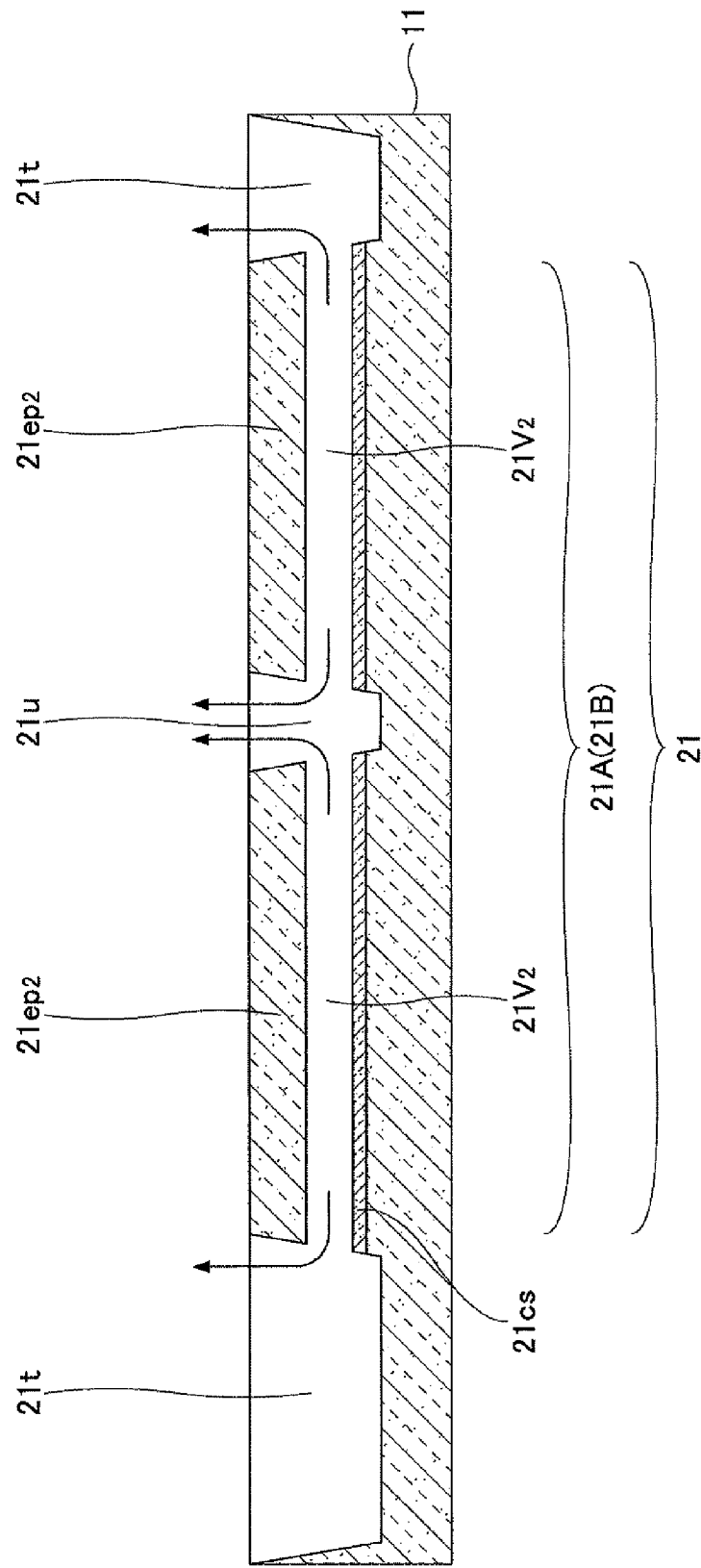

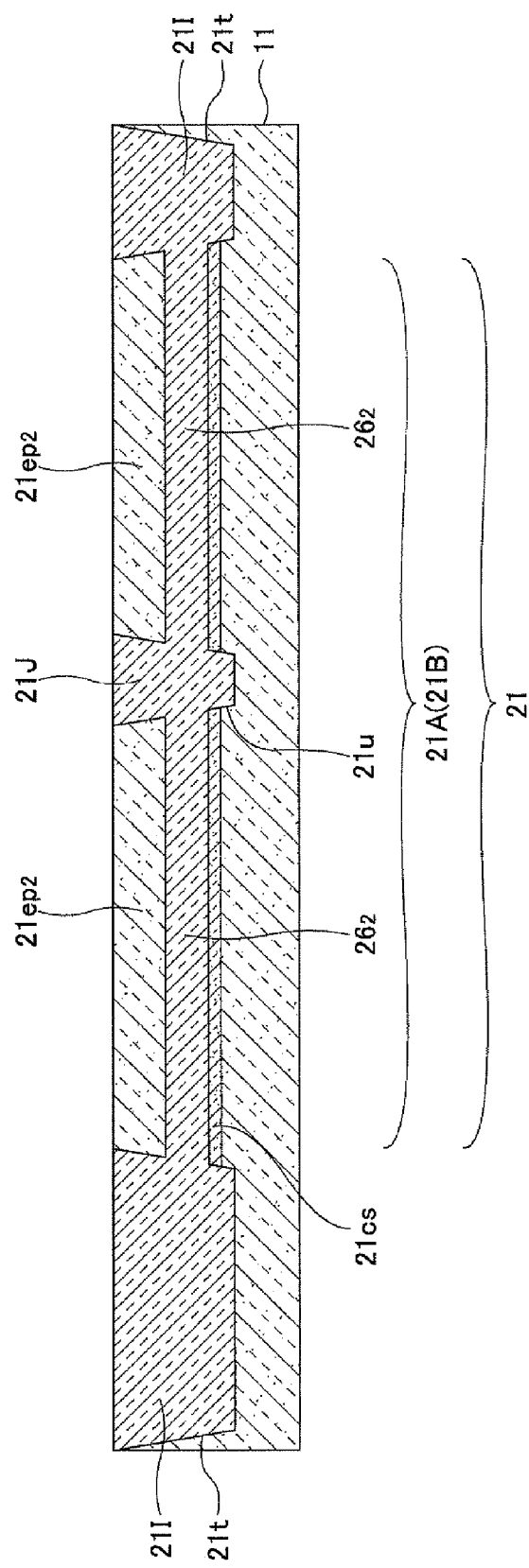

SEMICONDUCTOR DEVICE AND MANUFACTURING METHOD OF THE SEMICONDUCTOR DEVICE

CROSS-REFERENCE TO RELATED APPLICATION

This application is based upon and claims the benefit of priority of Japanese Patent Application No. 2011-092285, filed Apr. 18, 2011. The entire contents of which are incorporated herein by reference.

FIELD

The embodiment discussed herein is related to a semiconductor device and a manufacturing method of the semiconductor device.

BACKGROUND

Generally, in a MOS transistor, the source region or the drain region is formed in an opposite-conductivity-type well included in a device region. In this case, the source region or the drain region is isolated from the well by the PN junction formed between the source region and the well or between the drain region and the well.

However, in the MOS transistor having such a general structure, the operation speed may be reduced due the parasitic capacity of the PN junction, and a leakage current may occur.

To resolve the problem, there has been proposed a MOS transistor structure in which in the device region, the well is isolated from the source region or the drain region by an isolation structure using an oxide film, a nitride film, and a void (space) locally formed under the source region or the drain region. Such MOS transistor structure may be importance because it may be effective to reduce the junction capacitance and the leakage current.

As a forming process of forming the MOS transistor structure, for example, Japanese Laid-open Patent Publication No. 2007-27231 (hereinafter "Patent Document 1") discloses a method in which a laminated structure is formed in which a Si layer is formed on a Si—Ge mixed crystal layer, and then, only the Si—Ge mixed crystal layer is removed by using the etching-rate difference between the Si layer and the Si—Ge mixed crystal layer.

By filling the void (air hole) with a silicon oxide film the void being generated by removing the Si—Ge mixed crystal layer, it may become possible to locally form an embedded region where a silicon oxide film is locally embedded into under the source region or the drain region, so that so-called an SOI (Silicon-on-insulator) structure may locally be formed.

SUMMARY

According to an aspect, a semiconductor device includes a semiconductor substrate; a device region formed on the semiconductor substrate, defined by a device isolation region, and including a first device region part (first part) and a second device region part (second part); a first gate electrode formed in the first device region part; a first source region formed on a first side of the first gate electrode in the first device region part; a first drain region formed on a second side of the first gate electrode in the first device region part; a second gate electrode formed in the second device region part; a second source region formed on a first side of the second gate electrode in the second device region part; a second drain region formed on a second side of the second gate electrode in the second device region part; a first embedded isolation film region formed under the first source region; a second embedded isolation film region formed under the first drain region; a third embedded isolation film region formed under the second source region; and a fourth embedded isolation film region formed under the second drain region. Further, the first drain region and the second source region constitute (form) a single (the same) diffusion region between the first gate electrode and the second gate electrode. Further, in the second embedded isolation film region and the third embedded isolation film region constitute (form) a single (the same) embedded isolation film region between the first gate electrode and the second gate electrode. Further, between the first gate electrode and the second gate electrode, an opening is formed in a part of the diffusion region including (forming) the first drain region and the second source region, so that the opening extends to (reaches) the second embedded isolation film region and the third embedded isolation film region. Further, the opening is filled with an isolation film.

The objects and advantages of the embodiments disclosed herein will be realized and attained by means of the elements and combinations particularly pointed out in the claims.

It is to be understood that both the foregoing general description and the following detailed description are exemplary and explanatory and are not restrictive of the invention as claimed.

BRIEF DESCRIPTION OF DRAWINGS

FIG. 1D is a cross-sectional view cut along the line C-C' in FIG. 1A;

FIG. 2B is a cross-sectional view cut along the line E-E' in FIG. 2A;

FIG. 3B is a cross-sectional view cut along the line E-E' in FIG. 3A;

FIG. 4B is a cross-sectional view cut along the line E-E' in FIG. 4A;

FIG. 4C is a cross-sectional view cut along the line B-B' in FIG. 4A;

FIG. 4D is a cross-sectional view cut along the line C-C' in FIG. 4A;

FIG. 7B is a cross-sectional view cut along the line E-E' in FIG. 7A;

FIG. 8B is a cross-sectional view cut along the line E-E' in FIG. 8A;

FIG. 8C is a cross-sectional view cut along the line B-B' in FIG. 8A;

FIG. 8D is a cross-sectional view cut along the line C-C' in FIG. 8A;

FIG. 11B is a cross-sectional view cut along the line E-E' in FIG. 11A;

FIG. 17B is a cross-sectional view cut along the line E-E' in FIG. 17A;

FIG. 18B is a cross-sectional view cut along the line E-E' in FIG. 18A;

FIG. 20B is a cross-sectional view cut along the line E-E' in FIG. 20A;

FIG. 21B is a cross-sectional view cut along the line E-E' in FIG. 21A;

FIG. 23B is a cross-sectional view cut along the line E-E' in FIG. 23A;

FIG. 25B is a cross-sectional view cut along the line E-E' in FIG. 25A;

FIG. 26B is a cross-sectional view cut along the line E-E' in FIG. 26A;

DESCRIPTION OF EMBODIMENTS

In the method of Patent Document 1, the active region of the transistor including the source region and the drain region is formed in a shape of a mesa structure, so that the Si—Ge mixed crystal layer is disposed on the side wall surface of the mesa structure under the source region and the drain region.

In this structure, the Si—Ge mixed crystal layer may be easily removed by etching from the side wall surface of the mesa structure, and a desirable air hole (void) may be formed under the source region and the drain region and the air hole may be filled with an embedded isolation film.

To use the technique (method) of Patent Document 1, it may be necessary to form the mesa structure in the active region. However, it may not be always possible to form the mesa structure for each of the transistors.

For example, in a semiconductor device including first and second transistors where the drain region of the first transistor and the source region of the second transistor are commonly used, it may be difficult to form the mesa structure for each of the first and the second transistors. For example, even in such a case where a silicon epitaxial layer is formed on the Si—Ge mixed crystal layer, and first and second transistors are formed on the silicon epitaxial layer, it may still be difficult to selectively etch the Si—Ge mixed crystal layer under the diffusion region commonly used as the drain region of the first transistor and the source region of the second transistor to form a void (air hole) and form an embedded isolation film under the diffusion region by filling the void with an isolation film.

First Embodiment

Figure 1A:
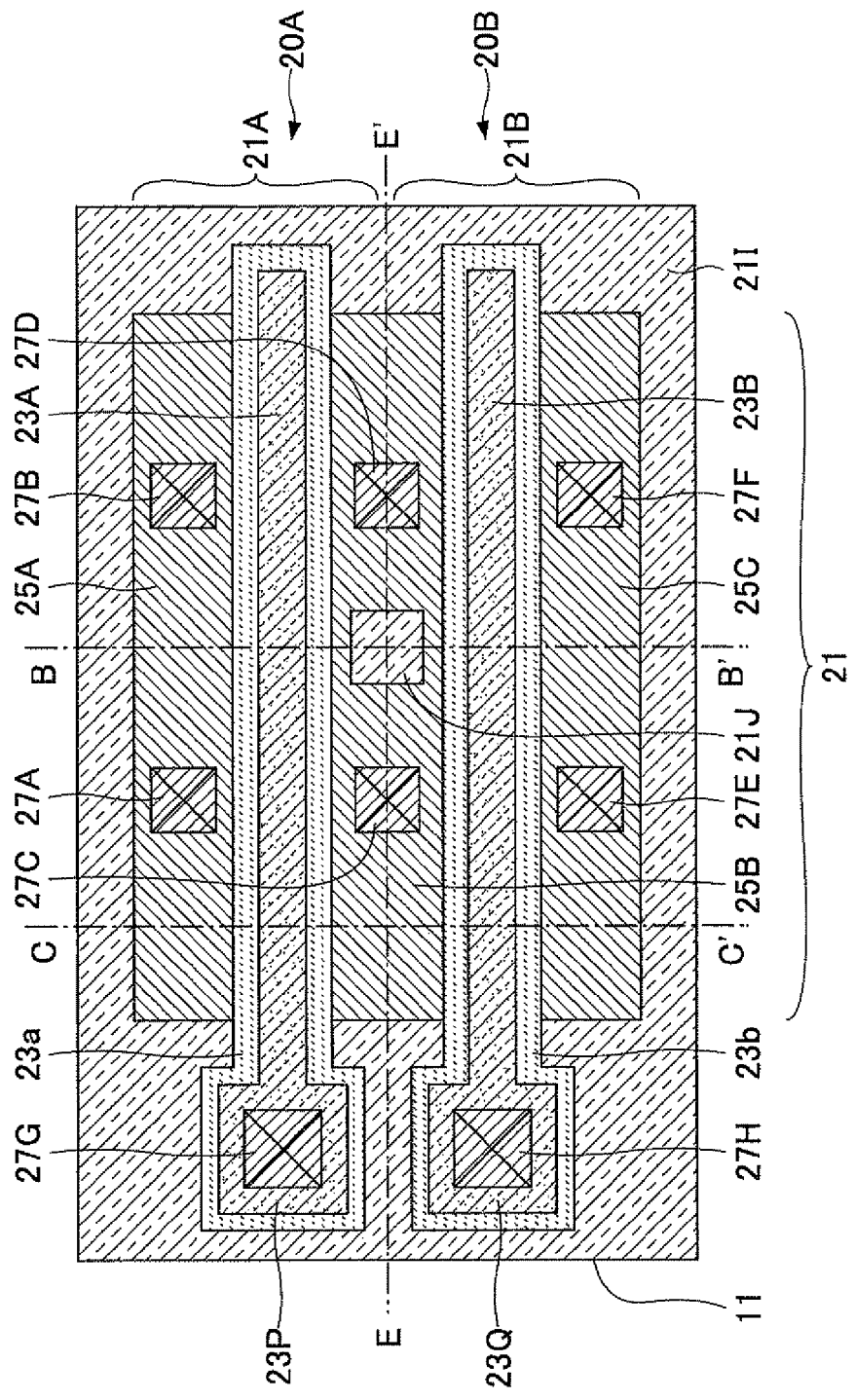
FIG. 1A is a top view illustrating an example configuration of a semiconductor device according to a first embodiment.
Figure 1B:
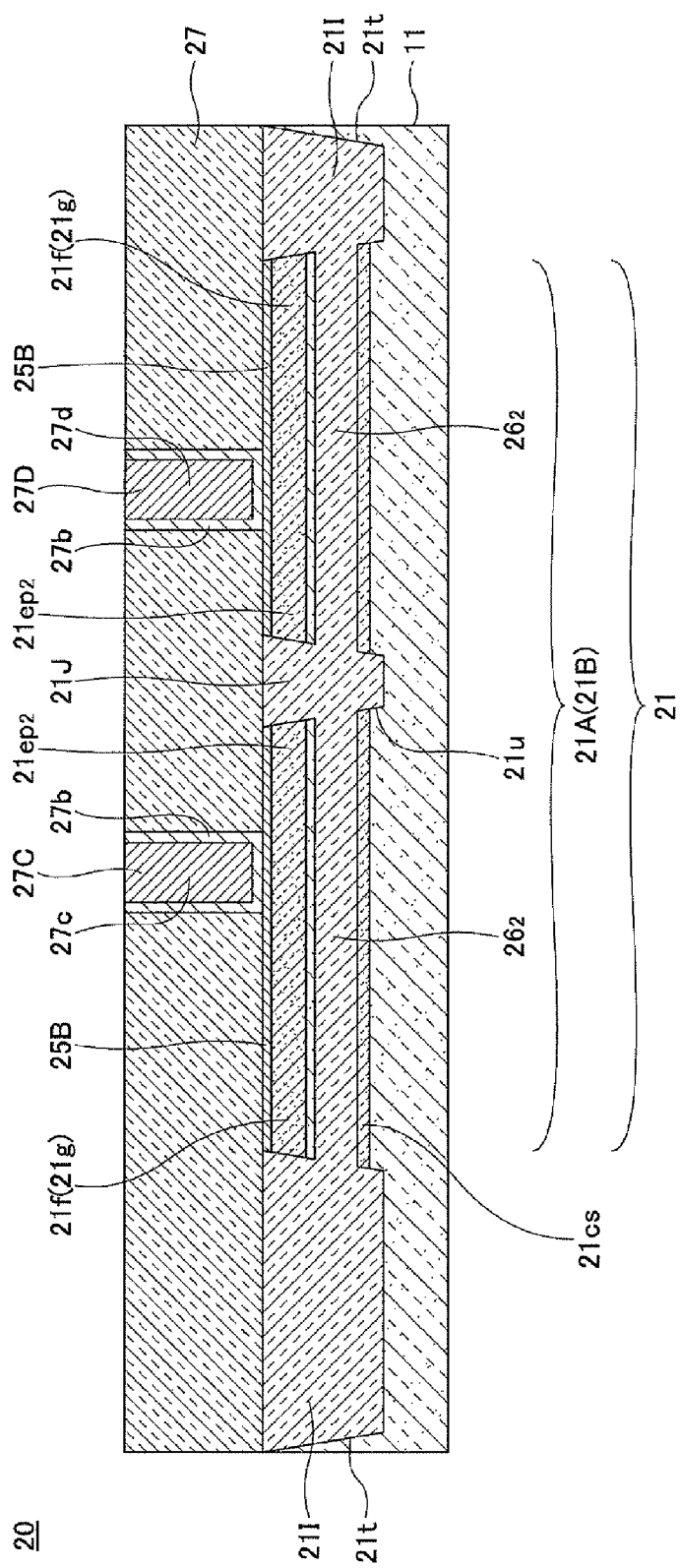
FIG. 1B is a cross-sectional view cut along the line E-E' in FIG. 1A.
Figure 1C:
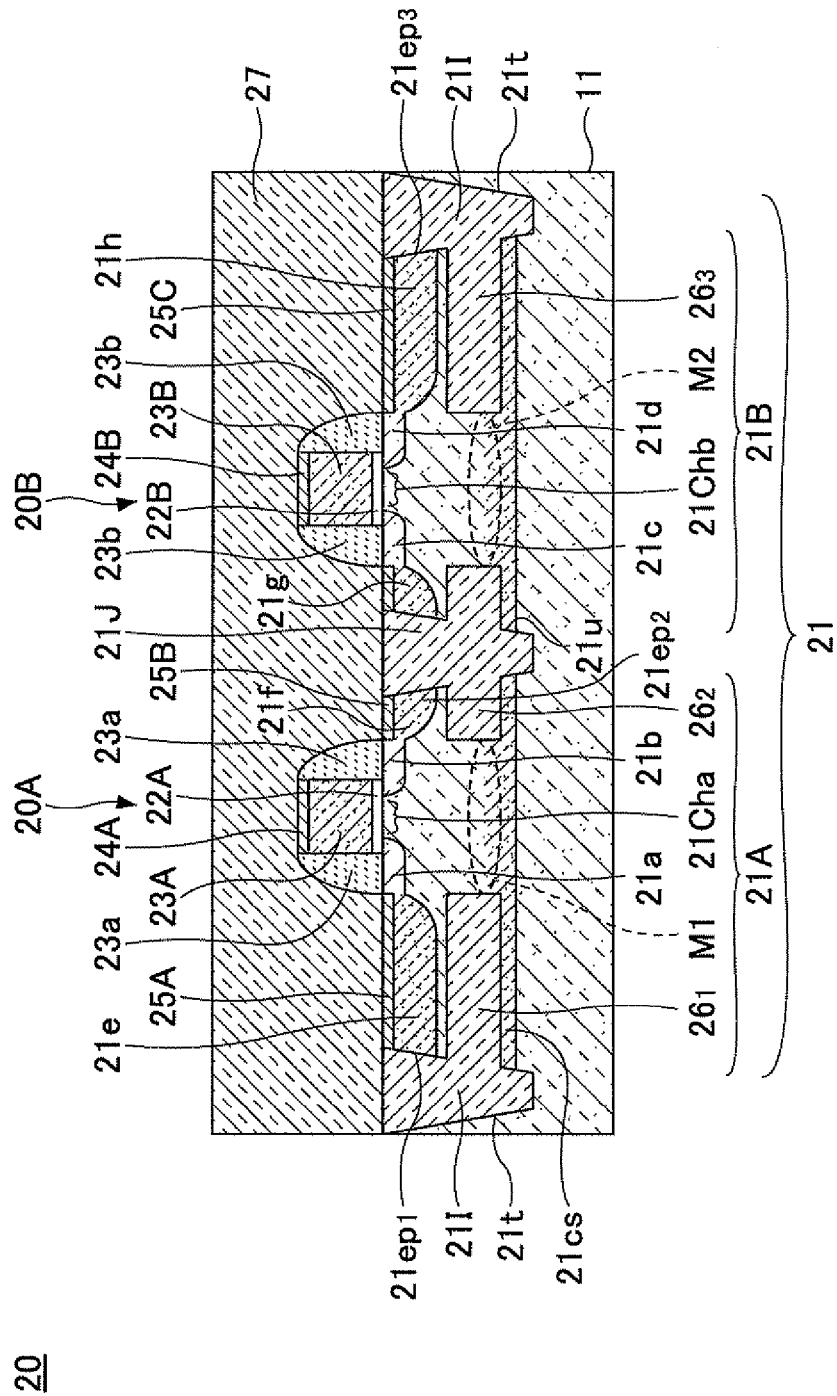
FIG. 1C is a cross-sectional view cut along the line B-B' in FIG. 1A.

FIGS. 1A through 1D illustrate an example configuration of a semiconductor device 20 according to a first embodiment. Specifically, FIG. 1A is a top view. FIG. 1B is a cross-sectional view cut along the line E-E' in FIG. 1A. FIG. 1C is a cross-sectional view cut along the line B-B' in FIG. 1A. FIG. 1D is a cross-sectional view cut along the line C-C' in FIG. 1A.

As illustrated in FIGS. 1A through 1D, for example, the semiconductor device 20 is formed on a device region (a.k.a active region) 21 defined by a device isolation region ("isolation region") 21I on a p-type silicon substrate 11. The device region 21 includes a first device region part (first part) 21A and a second device region part (second part) 21B which are adjacent (contiguous) to each other.

In the first device region part 21A, a first MOS transistor 20A is formed. In the second device region part 21B, a second MOS transistor 20B is formed. The device isolation region 21I is an STI-type device isolation region including a device isolation groove 21t surrounding the device region 21 and an isolation film such as a silicon oxide film filling the device isolation groove 21t.

Basically, the first device region part 21A is contiguous to (in contact with) the second device region part 21B. However, as illustrated in FIGS. 1A through 1D, in the connecting part between the first device region part 21A and the second device region part 21B, there is an isolation film region 21J formed by filling an insulation film such as an silicon oxide film into a trench, a concave part, or a hole (an opening) 21u besides the device isolation region 21I.

The isolation film region 21J is isolated from the device isolation region 21I. Namely, as illustrated in FIG. 1A, the isolation film region 21J is surrounded by the first device region part 21A and the second device region part 21B which (collectively) constitute (form) the device region 21.

As described in detail below, in this embodiment, for example, the isolation film region 21J is simultaneously formed with the device isolation region 21I. The depth of the trench 21u is the same as that of the device isolation groove 21t. Further, the same isolation film is used as the isolation film filled into the device isolation groove 21t and the isolation film filled into the trench 21u. In the example of the figures, the isolation films are made of a silicon oxide film formed by the CVD (Chemical Vapor Deposition) method.

Further, under the device region 21, as illustrated in FIGS. 1B through 1D, there is formed a channel stopper region 21cs having n-type conductivity opposite to that of the silicon substrate 11 and extended (reached) from the first device region part 21A to the second device region part 21B.

Further, in the first device region part 21A, there is a first gate electrode 23A formed on the silicon substrate 11 via a first gate isolation film 22A, the first gate electrode 23A being the gate of the first MOS transistor 20A and made of polysilicon or the like.

Similarly, in the second device region part 21B, there is a second gate electrode 23B formed on the silicon substrate 11 via a second gate isolation film 22B, the second gate electrode 23B being the gate of the second MOS transistor 20B and being made of polysilicon or the like. In this example of the figures, the first gate electrode 23A and the second gate electrode 23B extend in parallel to each other.

Further, the first gate electrode 23A has (two) side walls facing each other, and includes first side wall isolation films 23a formed on the respective side walls. The first side wall isolation films 23a are made of SiN, SiON, a silicon oxide film or the like. Under the first gate electrode 23A, there is formed a first channel region 21Cha.

Further, in the p-type silicon substrate 11 and under the first side wall isolation films 23a, there are formed n-type source extension regions 21a and 21b on the left-hand side and the right-hand side, respectively, of the first channel region 21Cha. Similarly, the second gate electrode 23B has side walls facing each other, and includes second side wall isolation films 23b formed on the respective side walls. The second side wall isolation films 23b are made of SiN, SiON, a silicon oxide film or the like. Under the second gate electrode 23B, there is formed a second channel region 21Chb.

Further, in the p-type silicon substrate 11 and under the second side wall isolation films 23b, there are formed n-type source extension regions 21c and 21d on the left-hand side and the right-hand side, respectively, of the second channel region 21Chb. In this embodiment, it should be noted that each of the first channel region 21Cha and the second channel region 21Chb is formed in a part of the p-type silicon substrate 11.

Further, in the configuration (structure) of FIGS. 1A through 1D, in a part where the first channel region 21Cha and the n-type source extension regions 21a and 21b are formed in the silicon substrate 11, there is formed a mesa structure $M_1$ rising upward from the lower side of the silicon substrate 11 where the channel stopper region 21cs are formed in the first device region part 21A.

Similarly, in a part where the second channel region 21Chb and the n-type source extension regions 21c and 21d are formed in the silicon substrate 11, there is formed a mesa structure $M_2$ rising upward from the lower side of the silicon substrate 11 where the channel stopper region 21cs are formed in the second device region part 21B.

Further, in the upper side of the mesa structure $M_1$, there is a silicon epitaxial layer $21ep_1$ epitaxially formed relative to the p-type silicon substrate 11 so that the silicon epitaxial layer $21ep_1$ is in contact with the left-hand side of the side wall surface of the mesa structure $M_1$. Similarly, there is a silicon epitaxial layer $21ep_2$ epitaxially formed relative to the p-type silicon substrate 11 so that the silicon epitaxial layer $21ep_2$ is in contact with the right-hand side of the side wall surface of the mesa structure $M_1$ and the left-hand side of the side wall surface of the mesa structure $M_2$ as well.

Also, there is a silicon epitaxial layer $21ep_3$ epitaxially formed relative to the p-type silicon substrate 11 so that the silicon epitaxial layer $21ep_3$ is in contact with the right-hand side of the side wall surface of the mesa structure $M_2$. Further, as the source region of the first MOS transistor 20A, there is an n+ type diffusion region 21e formed in the silicon epitaxial layer $21ep_1$ outside the left-hand first side wall isolation films 23a of the first gate electrode 23A.

Further, as the drain region of the first MOS transistor 20A, there is an n+ type diffusion region 21f formed in the silicon epitaxial layer $21ep_2$ outside the right-hand first side wall isolation films 23a of the first gate electrode 23A. Further, as the source region of the second MOS transistor 20B, there is an n+ type diffusion region 21g formed in the silicon epitaxial layer $21ep_2$ outside the left-hand second side wall isolation films 23b of the second gate electrode 23B.

As illustrated in FIG. 1D, the n+ type diffusion region 21f is contiguous to the n+ type diffusion region 21g in the connecting part between the first device region part 21A and the second device region part 21B. Therefore, the diffusion regions are commonly used by the first MOS transistor 20A and the second MOS transistor 20B.

Further, as the drain region of the second MOS transistor 20B, there is an n+ type diffusion region 21h formed in the silicon epitaxial layer $21ep_3$ outside the right-hand second side wall isolation films 23b of the second gate electrode 23B.

As illustrated in the cross-sectional views of FIGS. 1B through 1D, under the silicon epitaxial layer $21ep_1$, there is a first embedded isolation film $26_1$ formed so as to be contiguous to a part of the device isolation region 21I and a part of the isolation film region 21J.

Similarly, under the silicon epitaxial layer $21ep_2$, there is a second embedded isolation film $26_2$ formed so as to be contiguous to a part of the isolation film region 21J and a part of the device isolation region 21I. Further, under the silicon epitaxial layer $21ep_3$, there is a third embedded isolation film $26_3$ formed so as to be contiguous to a part of the device isolation region 21I and a part of the isolation film region 21J.

As illustrated in FIGS. 1A through 1D, there are silicide layers 25A through 25C formed on the exposure (upper) surfaces of the embedded isolation films $26_1$ though $26_3$, respectively. Further, there are also silicide layers 24A and 24B formed on the exposure surfaces of the first gate electrode 23A and the second gate electrode 23B, respectively.

Further, an isolation film 27 is formed on the silicon substrate 11 so as to coat the first gate electrode 23A and the second gate electrode 23B. Further, as illustrated in top view of FIG. 1A, in the isolation film 27, as the source contact of the first MOS transistor 20A, there are formed via plugs 27A and 27B on the silicide layer 25A.

Further, as the drain contact of the first MOS transistor 20A and the source contact of the second MOS transistor 20B, there are formed via plugs 27C and 27D on the silicide layer 25B. Further, as the drain contact of the second MOS transistor 20B, there are formed via plugs 27E and 27F on the silicide layer 25C.

Further, as illustrated in top view of FIG. 1A, in parts of the device isolation region 21I, there are formed contact pads 23P and 23Q on the first gate electrode 23A and the second gate electrode 23B, respectively. Further, there are formed via plugs 27G and 27H which are in contact with the contact pads 23P and 23Q, respectively.

As illustrated in FIG. 1B, the via plugs 27C and 27D have a configuration including metal plugs $27c$ and $27d$ made of copper (Cu), tungsten (W) or the like and a barrier metal film $27b$ coating the surface of the metal plugs $27c$ and $27d$, respectively, the barrier metal film $27b$ having a Ta/TaN or Ti/TiN laminated structure. The same applies to the other via plugs 27A, 27B, and 27E through 27F.

In this embodiment, the isolation film region 21J is isolated from the device isolation region 21I, and is surrounded by silicon epitaxial layer $21ep_2$. However, to prevent the increase of the device surface, it is preferable that the isolation film region 21J has the same size and the same shape (figure) as those of the via plugs 27A through 27F.

Figure 19:
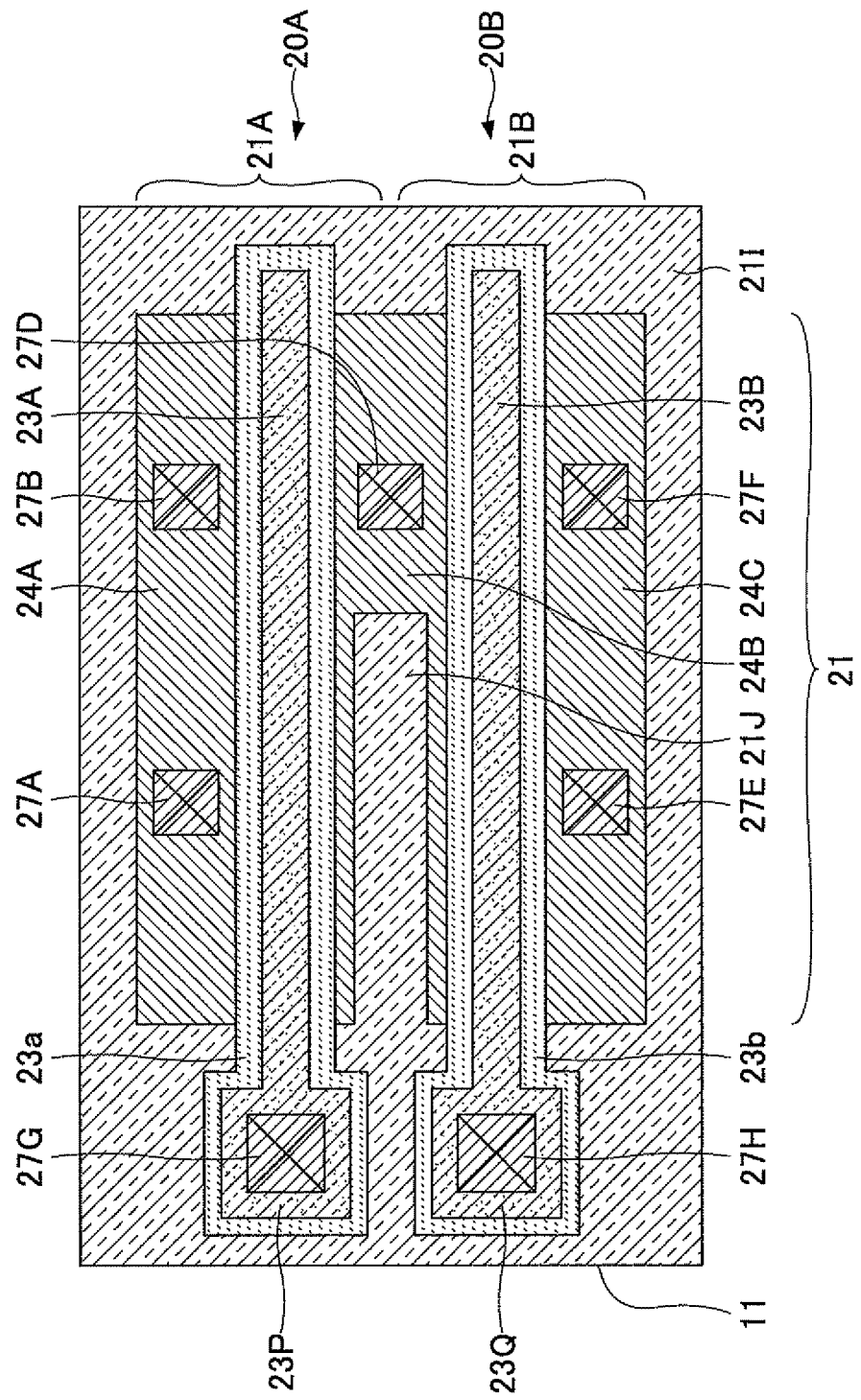
FIG. 19 is a top view illustrating an example configuration of a semiconductor device according to a modified example of the first embodiment.

However, it is not always necessary that the he isolation film region 21J is isolated from the device isolation region 21I. For example, when permitted by circuit design, as illustrated in a modified example of FIG. 19, the isolation film region 21J may be contiguous to a part of the device isolation region 21I. However, in the modified example of FIG. 19, the isolation film region 21J is extended; therefore, there is no via plug (via contact) 27C unlike the semiconductor device in the embodiment of FIGS. 1A through 1D.

In the following, an example method of manufacturing the semiconductor device according to the first embodiment is described with reference to FIGS. 2A through 18D.

Figure 2A:
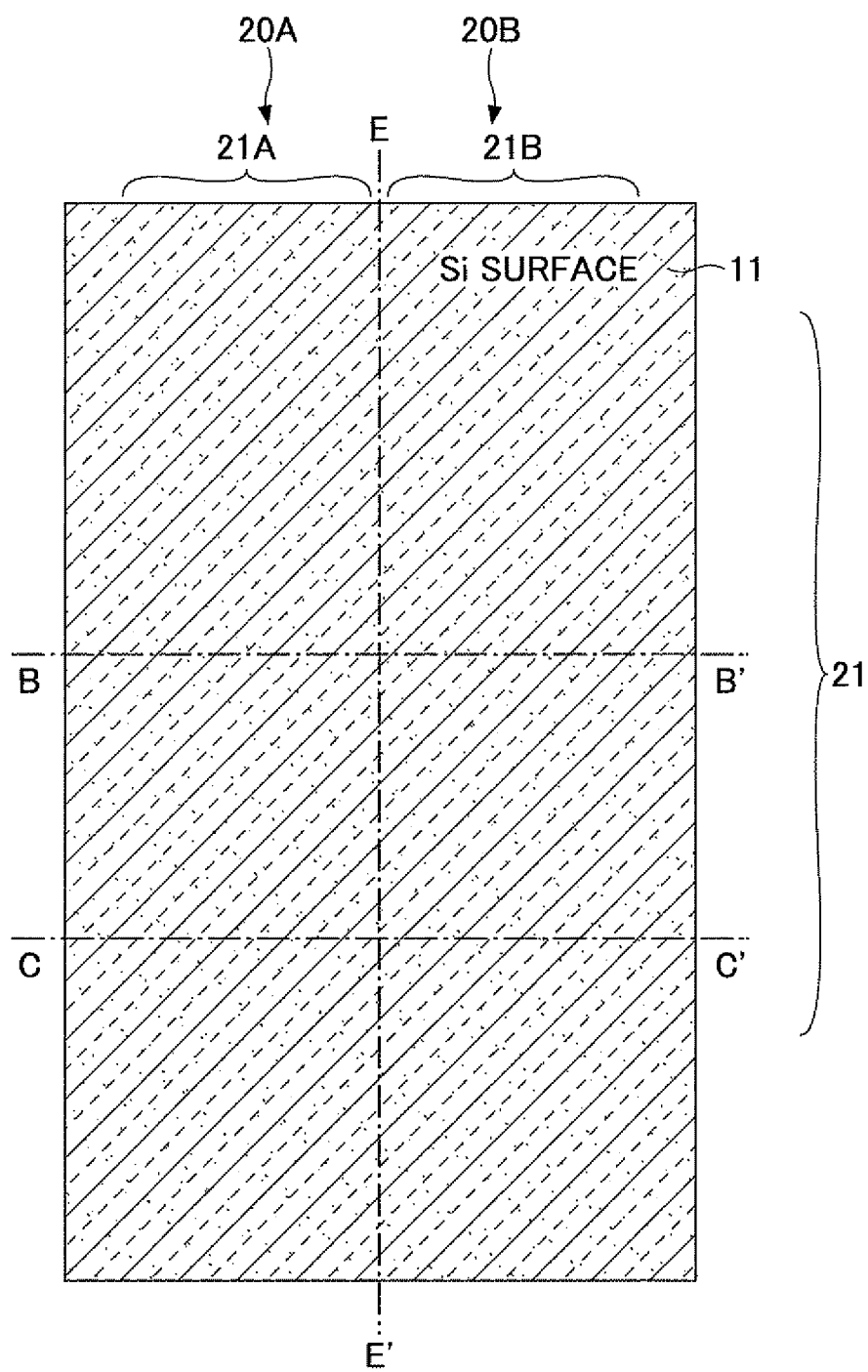
FIG. 2A is a top view illustrating a step of a manufacturing process of the semiconductor device according to the first embodiment.
Figure 2C:
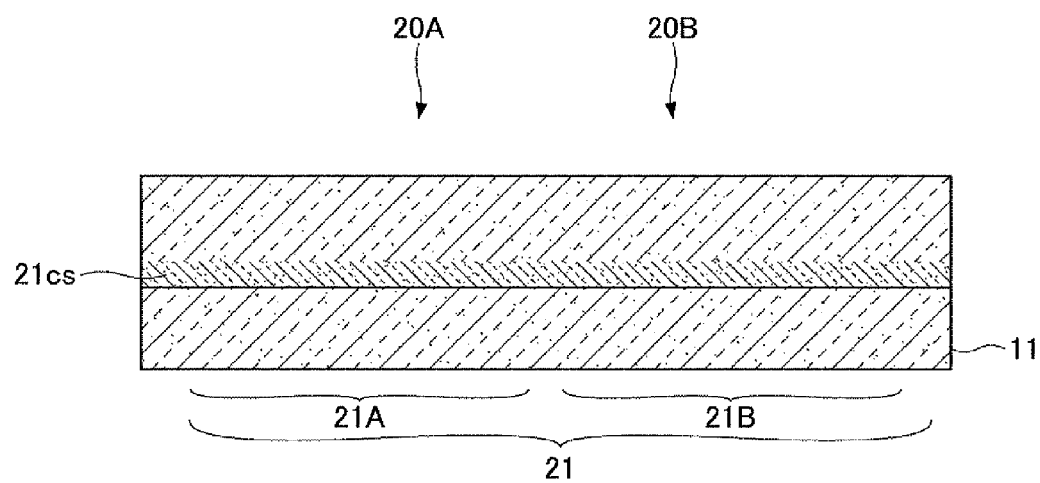
FIG. 2C is a cross-sectional view cut along the line B-B' in FIG. 2A.
Figure 2D:
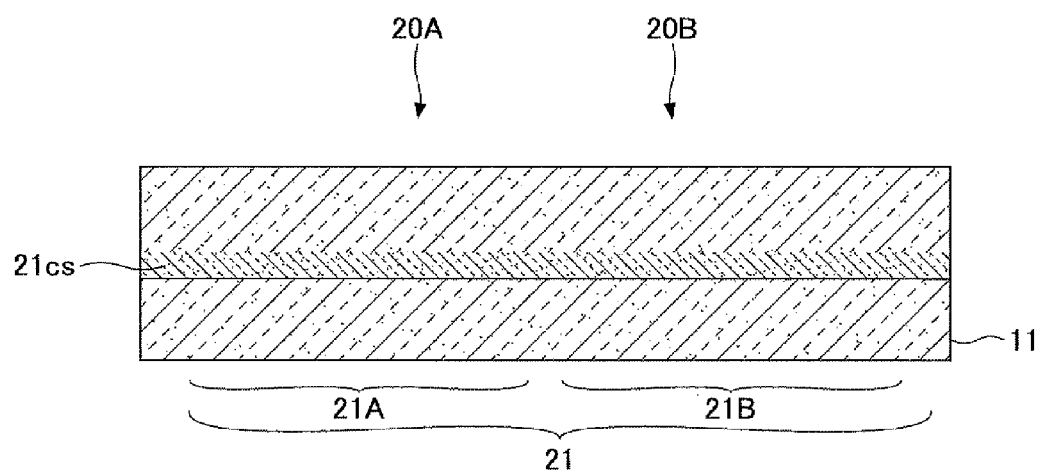
FIG. 2D is a cross-sectional view cut along the line C-C' in FIG. 2A.

FIGS. 2A through 2D illustrate a step of a manufacturing process of the semiconductor device 20 according to the first embodiment. Specifically, FIG. 2A is a top view. FIG. 2B is a cross-sectional view cut along the line E-E' in FIG. 2A. FIG. 2C is a cross-sectional view cut along the line B-B' in FIG. 2A. FIG. 2D is a cross-sectional view cut along the line C-C' in FIG. 2A.

As illustrated in FIG. 2A through 2D, an n-type impurity element such as P, As or the like is introduced by ion implantation into the p-type silicon substrate 11 to form the channel stopper region $21cs$ in the p-type silicon substrate 11. Further, in this case, the upper end of the channel stopper region $21cs$ is formed at the depth of approximately 90 nm from the upper surface of the p-type silicon substrate 11 and a PN junction is formed.

Figure 3A:
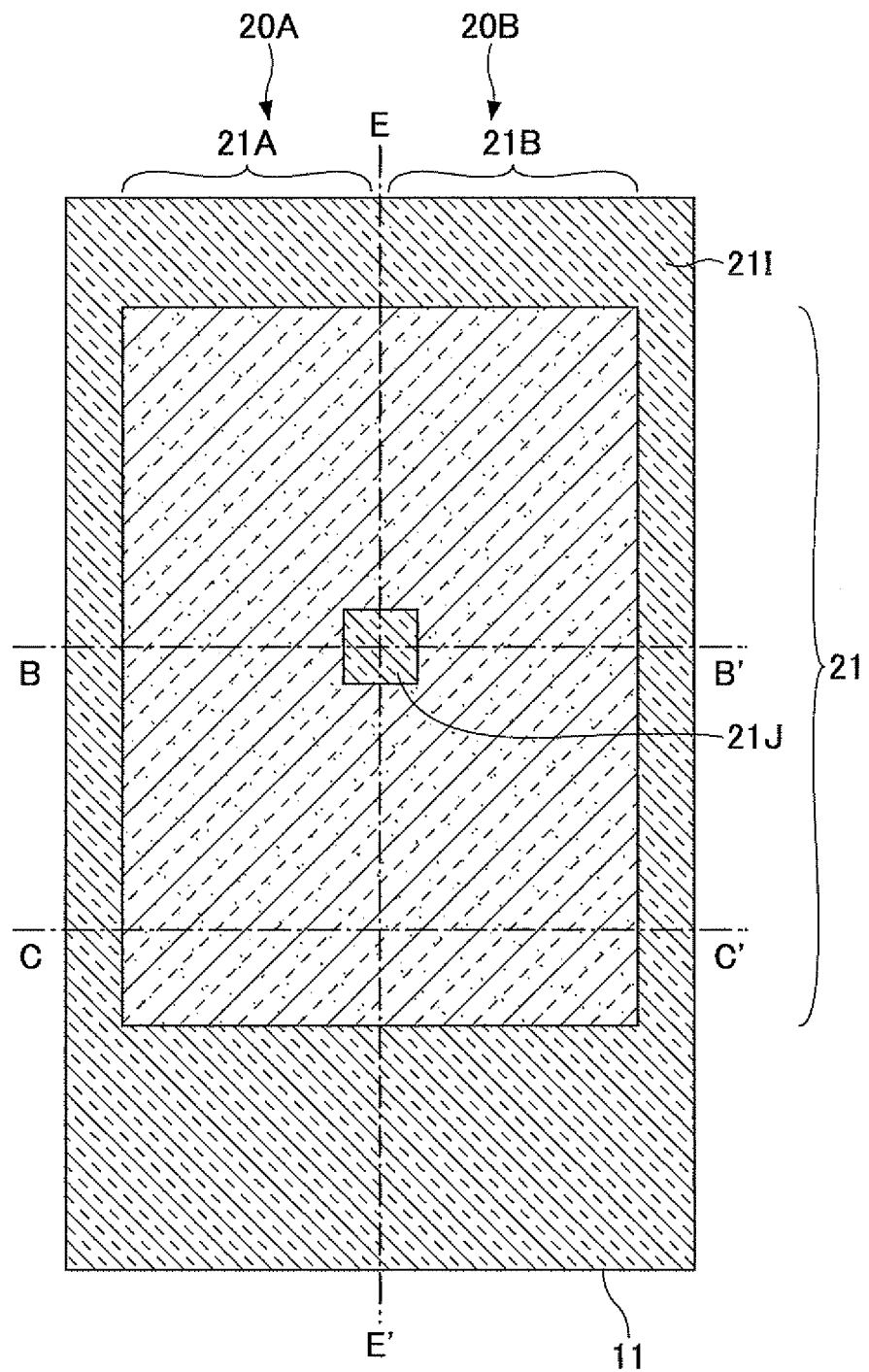
FIG. 3A is a top view illustrating a step of the manufacturing process of the semiconductor device according to the first embodiment.
Figure 3C:
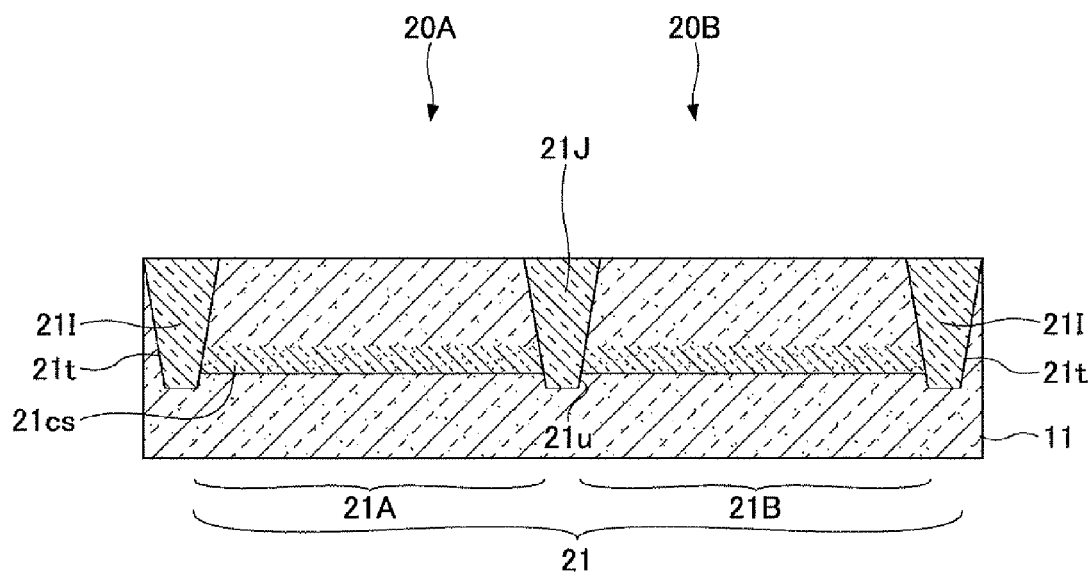
FIG. 3C is a cross-sectional view cut along the line B-B' in FIG. 3A.
Figure 3D:
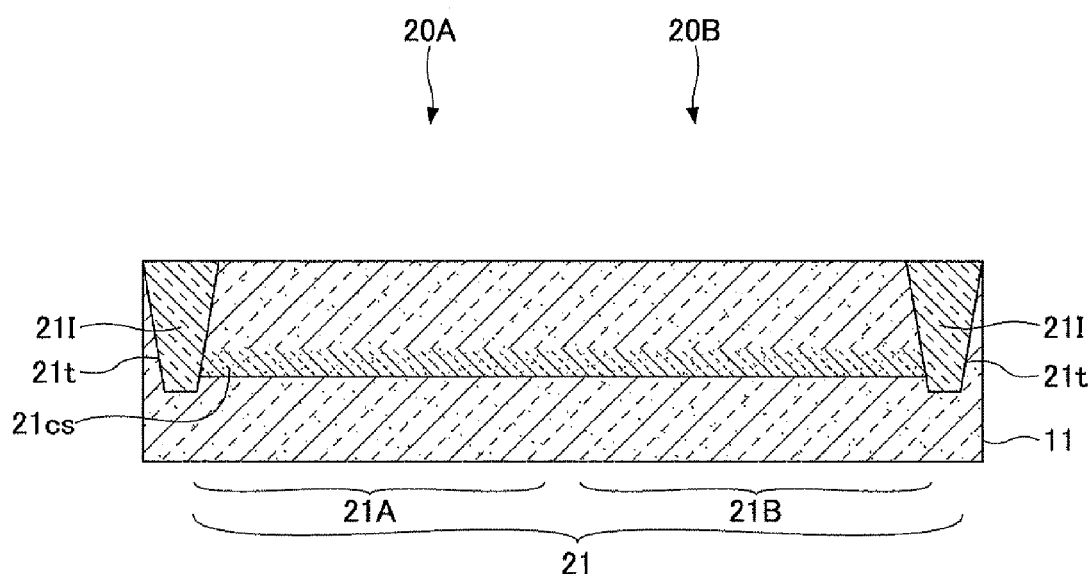
FIG. 3D is a cross-sectional view cut along the line C-C' in FIG. 3A.

FIGS. 3A through 3D illustrate a step of the manufacturing process of the semiconductor device 20 according to the first embodiment following the step of FIGS. 2A through 2D. Specifically, FIG. 3A is a top view corresponding to FIG. 2A. FIG. 3B is a cross-sectional view cut along the line E-E' in FIG. 3A. FIG. 3C is a cross-sectional view cut along the line B-B' in FIG. 3A. FIG. 3D is a cross-sectional view cut along the line C-C' in FIG. 3A.

As illustrated in FIG. 3A through 3D, in the p-type silicon substrate 11, a first device isolation groove ("first trench") $21t$ is formed so as to be deeper than the PN junction to define the device region 21. At the same time, being isolated from the first trench $21t$, a second trench, a concave portion, or a hole (an opening) $21u$ is also formed so as to have the same depth as that of the first trench $21t$.

However, it is not always necessary that the second trench $21u$ has the same depth as that of the first trench $21t$. For example, the second trench $21u$ may be formed so as to have a shallower than the first trench $21t$. Further, the first trench $21t$ and the second trench $21u$ may be separately formed (i.e., may not be simultaneously formed).

Further, in the step of FIGS. 3A through 3D, the first trench $21t$ and the second trench $21u$ are filled with the silicon oxide film. Specifically, the first trench $21t$ and the second trench $21u$ are filled with the silicon oxide film using the CVD method, and a chemical mechanical polishing is performed so that the surface of the silicon substrate 11 is exposed.

Figure 4A:
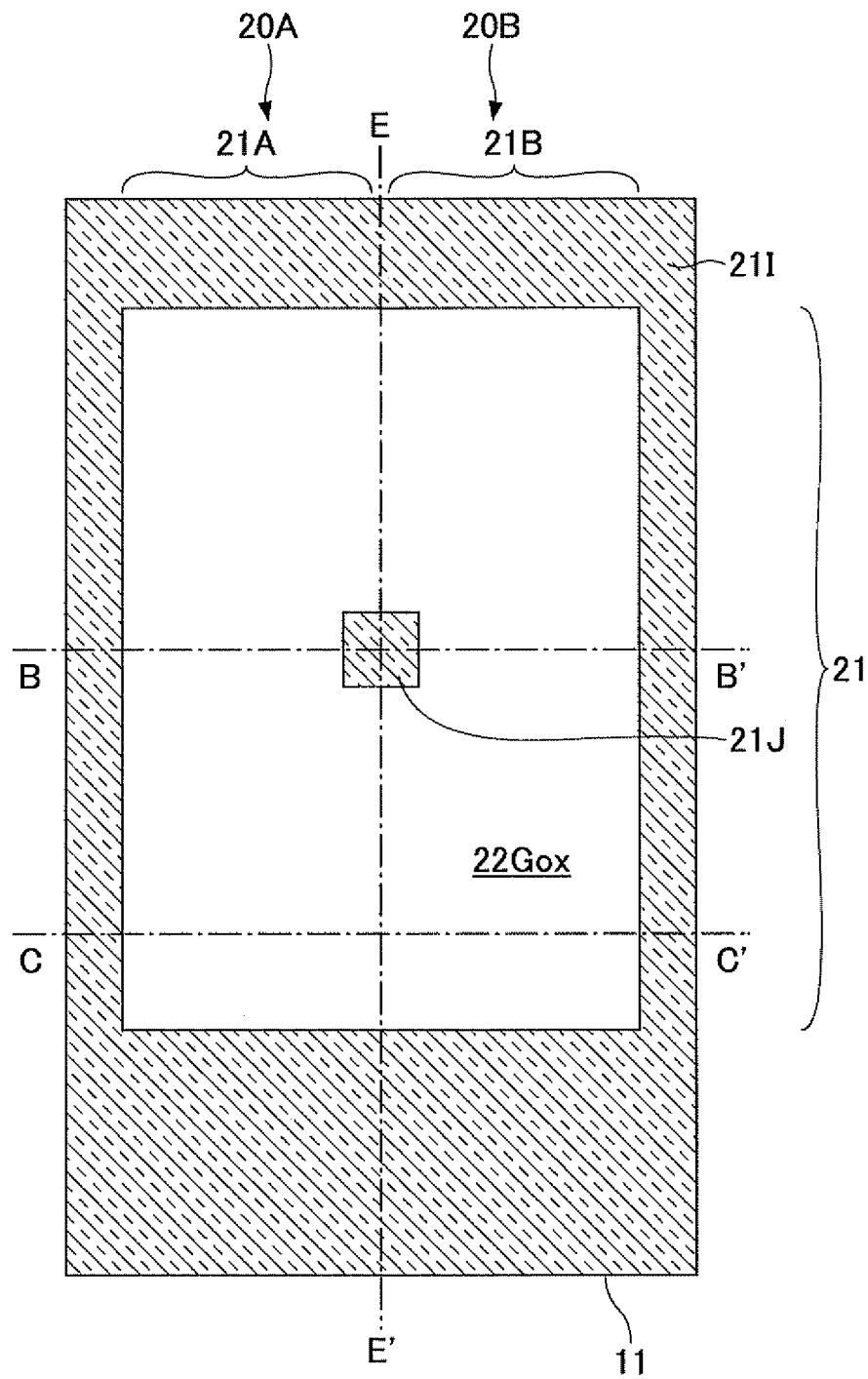
FIG. 4A is a top view illustrating a step of the manufacturing process of the semiconductor device according to the first embodiment.

FIGS. 4A through 4D illustrate a step of the manufacturing process of the semiconductor device 20 according to the first embodiment following the step of FIGS. 3A through 3D. Specifically, FIG. 4A is a top view corresponding to FIG. 3A. FIG. 4B is a cross-sectional view cut along the line E-E' in FIG. 4A. FIG. 4C is a cross-sectional view cut along the line B-B' in FIG. 4A. FIG. 4D is a cross-sectional view cut along the line C-C' in FIG. 4A.

As illustrated in FIG. 4A through 4D, in this step, the silicon substrate 11 is thermally oxidized in an oxidizing atmosphere to form a thermally-oxidized film 22 having a film thickness in a range from 0.3 nm to 1 nm in the device region 21. Herein, the oxidizing atmosphere refers to an atmosphere including oxygen such as an ozone atmosphere, an oxygen atmosphere, an oxidation nitride gas atmosphere or the like.

In the step of FIG. 4A through 4D, a heating process or a plasma process may further be performed on the thermally-oxidized film 22 in a nitrogen atmosphere to transform the thermally-oxidized film into a silicon oxynitride film. For example, the thermally-oxidized film 22 having a film thickness of 0.7 nm is formed, and the formed thermally-oxidized film 22 is further heated in an NO gas atmosphere to transform the thermally-oxidized film into an isolation film made of the silicon oxynitride film.

In the following, it is assumed that the thermally-oxidized film (isolation film) 22 is the silicon oxynitride film formed as described above.

Figure 5A:
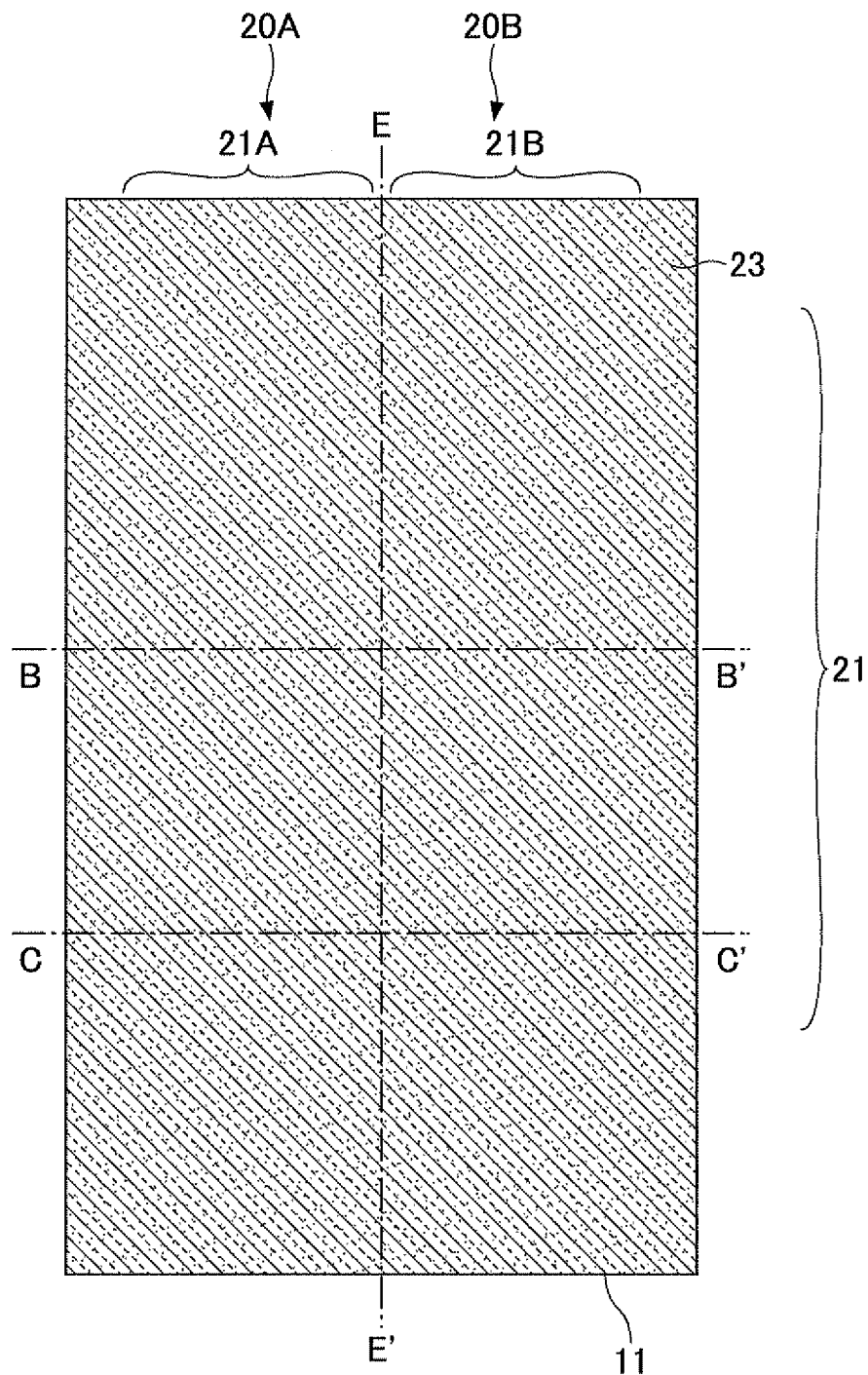
FIG. 5A is a top view illustrating a step of the manufacturing process of the semiconductor device according to the first embodiment.
Figure 5B:
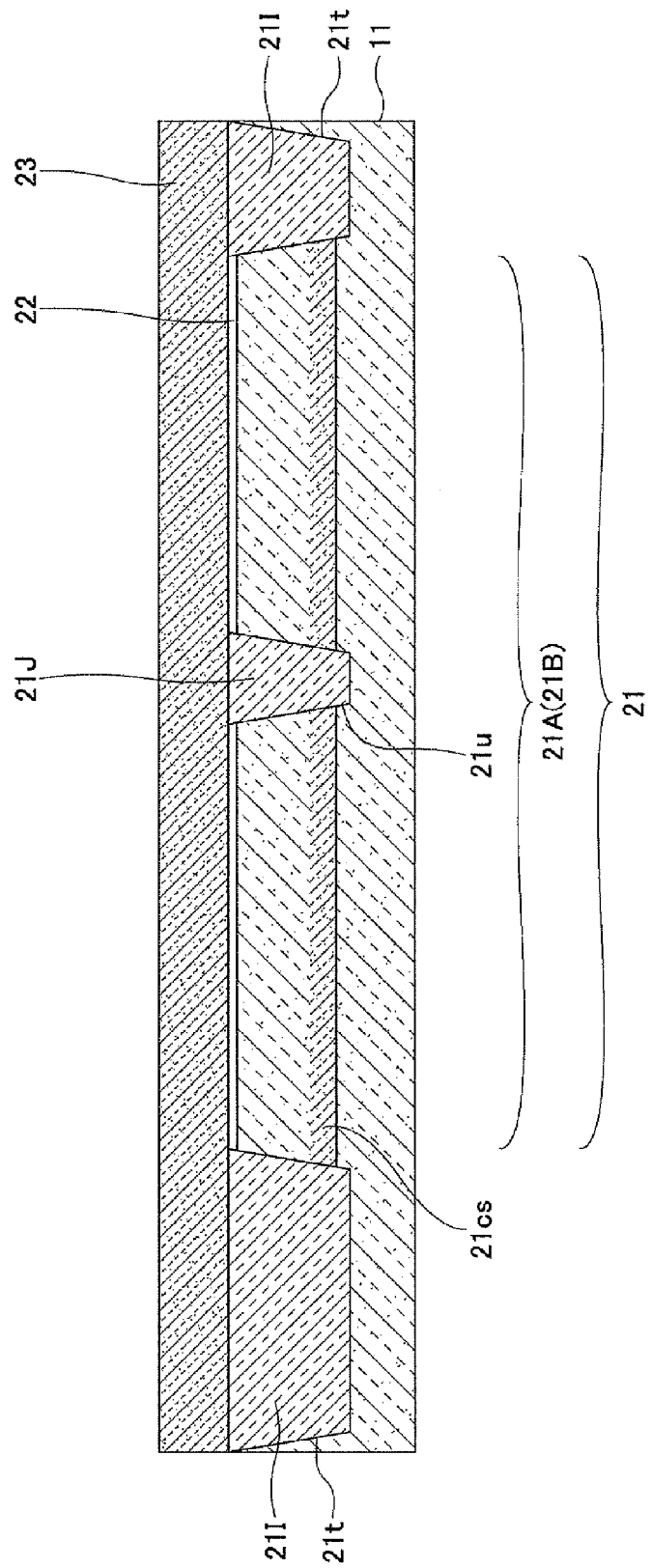
FIG. 5B is a cross-sectional view cut along the line E-E' in FIG. 5A.
Figure 5C:
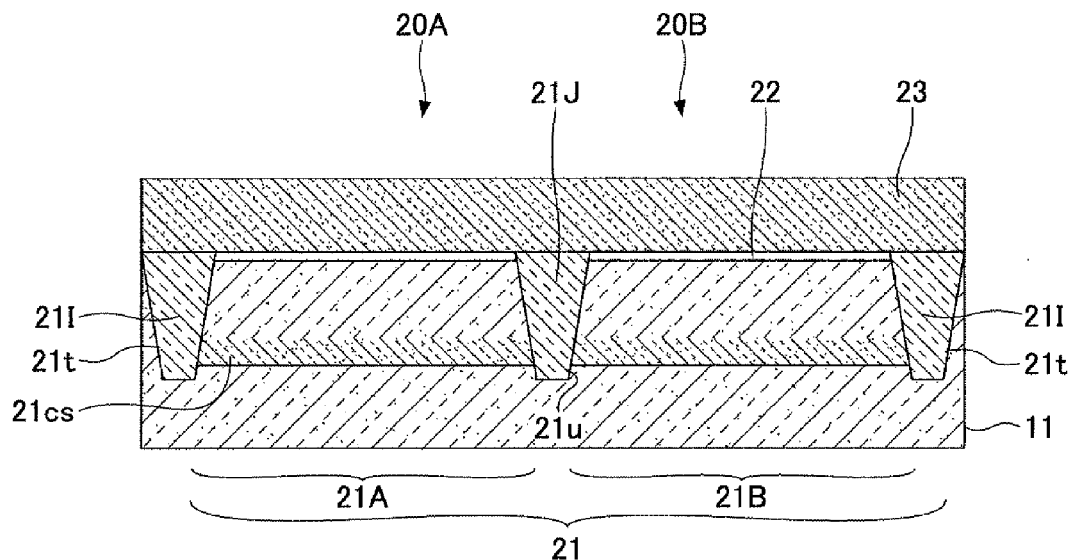
FIG. 5C is a cross-sectional view cut along the line B-B' in FIG. 5A.
Figure 5D:
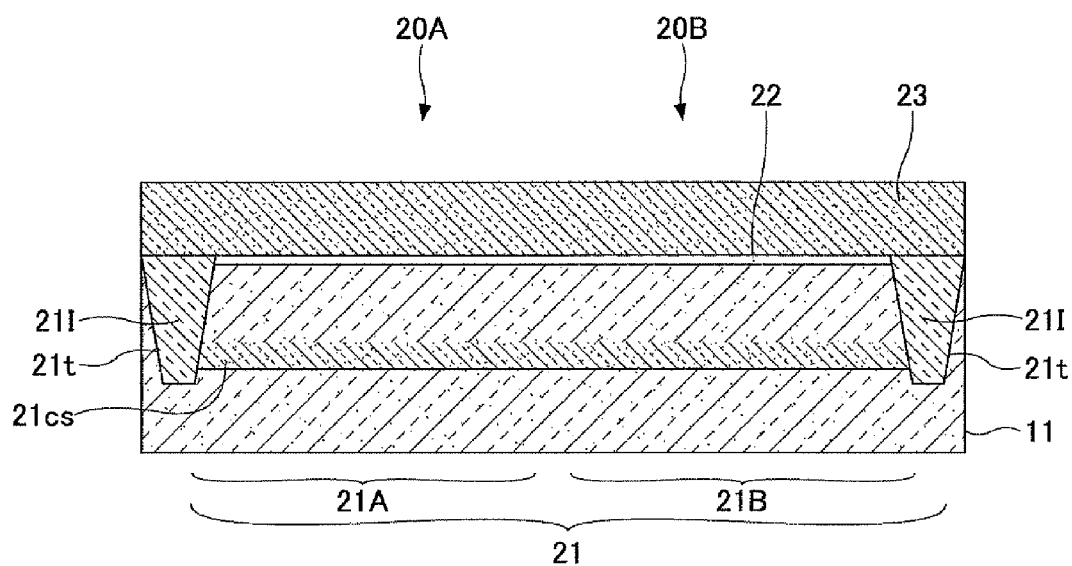
FIG. 5D is a cross-sectional view cut along the line C-C' in FIG. 5A.

FIGS. 5A through 5D illustrate a step of the manufacturing process of the semiconductor device 20 according to the first embodiment following the step of FIGS. 4A through 4D. Specifically, FIG. 5A is a top view corresponding to FIG. 4A. FIG. 5B is a cross-sectional view cut along the line E-E' in FIG. 5A. FIG. 5C is a cross-sectional view cut along the line B-B' in FIG. 5A. FIG. 5D is a cross-sectional view cut along the line C-C' in FIG. 5A.

As illustrated in FIG. 5A through 5D, in this step, a polysilicon film 23 is deposited on the silicon substrate 11 via the isolation film 22 so that the polysilicon film 23 has the thickness approximately in a range from 10 nm to 100 nm using, for example, a heating CVD method. By doing this, the device isolation region 21I, the first device region part 21A, and the second device region part 21B, including the isolation film region 21J are continuously coated. The polysilicon film 23 may be deposited as a form of amorphous silicon film and then crystallized.

Figure 6A:
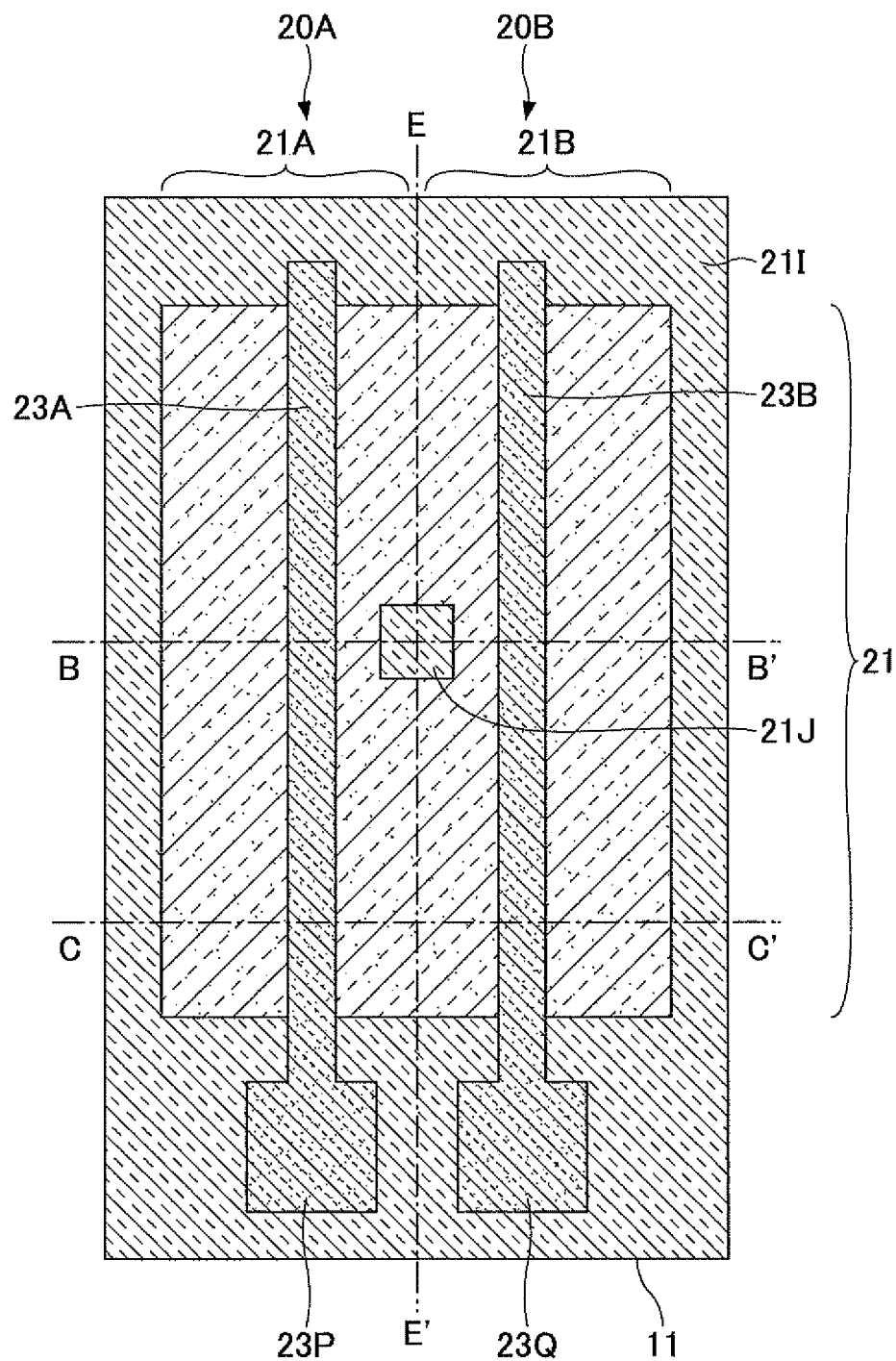
FIG. 6A is a top view illustrating a step of the manufacturing process of the semiconductor device according to the first embodiment.
Figure 6B:
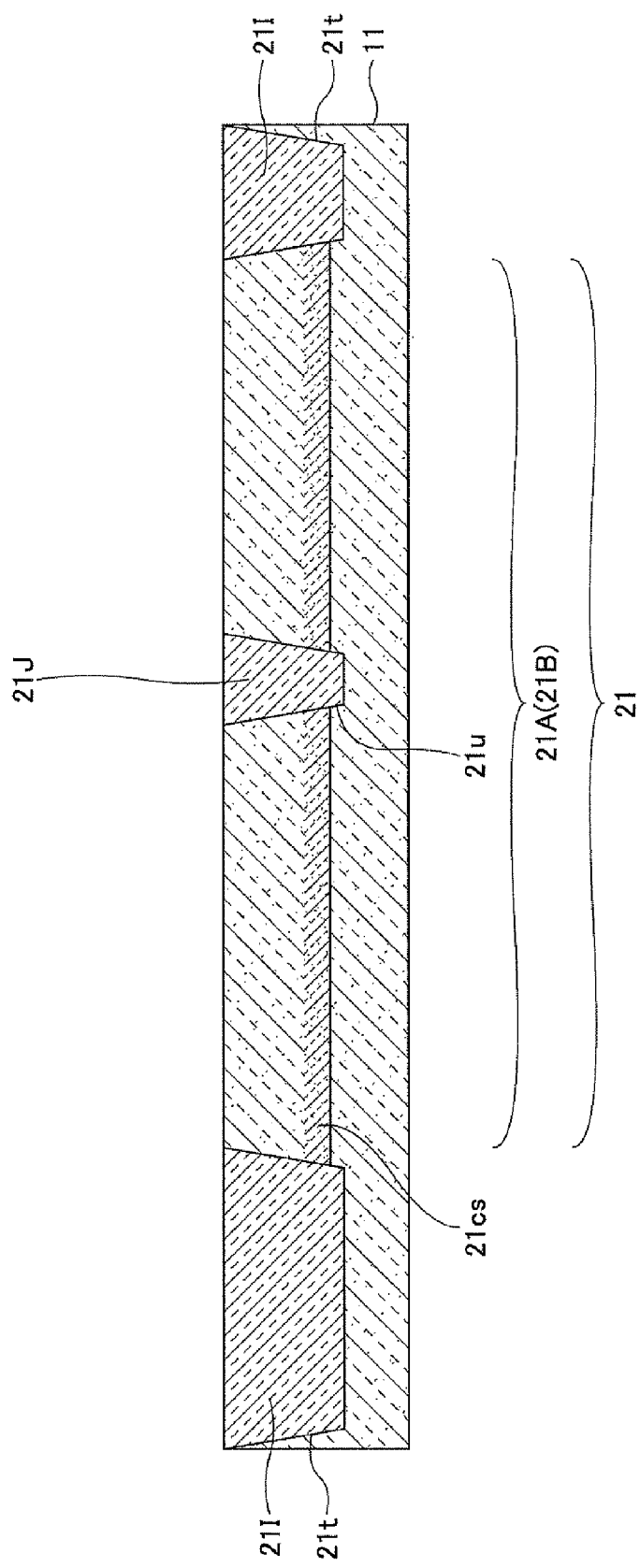
FIG. 6B is a cross-sectional view cut along the line E-E' in FIG. 6A.
Figure 6C:
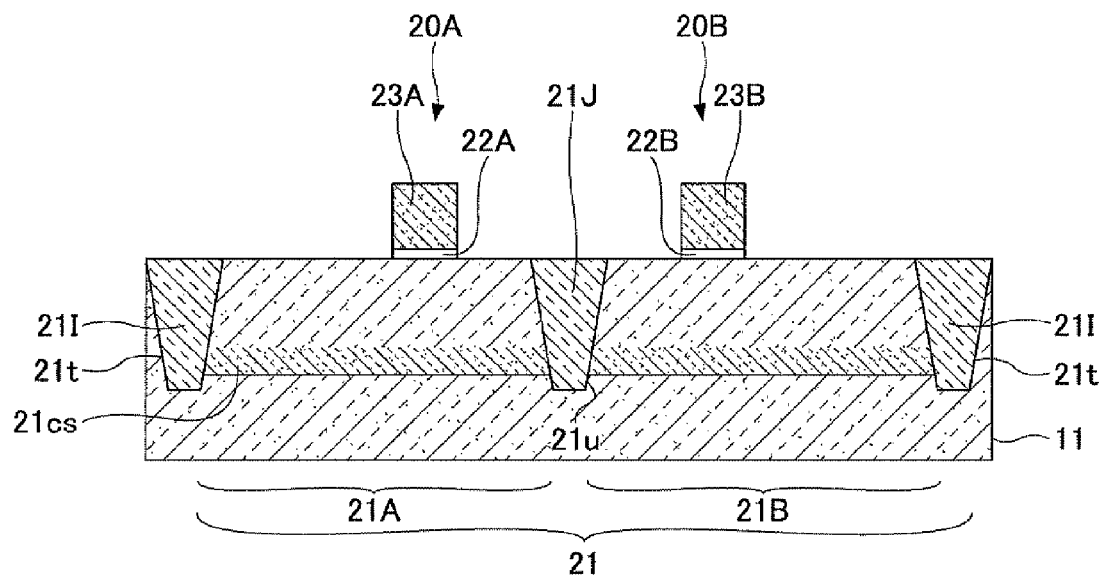
FIG. 6C is a cross-sectional view cut along the line B-B' in FIG. 6A.
Figure 6D:
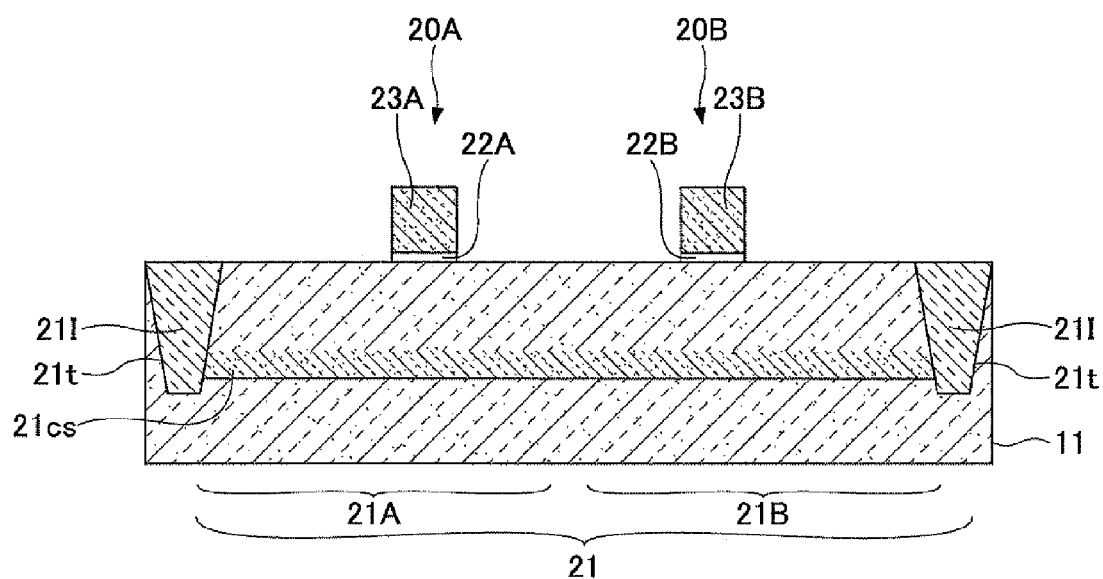
FIG. 6D is a cross-sectional view cut along the line C-C' in FIG. 6A.

FIGS. 6A through 6D illustrate a step of the manufacturing process of the semiconductor device 20 according to the first embodiment following the step of FIGS. 5A through 5D. Specifically, FIG. 6A is a top view corresponding to FIG. 5A. FIG. 6B is a cross-sectional view cut along the line E-E' in FIG. 6A. FIG. 6C is a cross-sectional view cut along the line B-B' in FIG. 6A. FIG. 6D is a cross-sectional view cut along the line C-C' in FIG. 6A.

As illustrated in FIG. 6A through 6D, in this step, the polysilicon film 23 is patterned. Further, the first gate electrode 23A is formed on a first side (i.e., on the left-hand side) in FIGS. 6C and 6D, and the second gate electrode 23B is formed on a second side (i.e., on the right-hand side) in FIGS. 6C and 6D.

When the polysilicon film 23 is patterned, the isolation film 22 is also patterned so that the first gate isolation film 22A is formed between the first gate electrode 23A and the silicon substrate 11 and under the first gate electrode 23A, and the second gate isolation film 22B is formed between the second gate electrode 23B and the silicon substrate 11 and under the second gate electrode 23B.

Further, the first gate electrode 23A extends on the device isolation region 21I to form the contact pad 23P. Similarly, the second gate electrode 23B extends on the device isolation region 21I to form the contact pad 23Q.

Figure 7A:
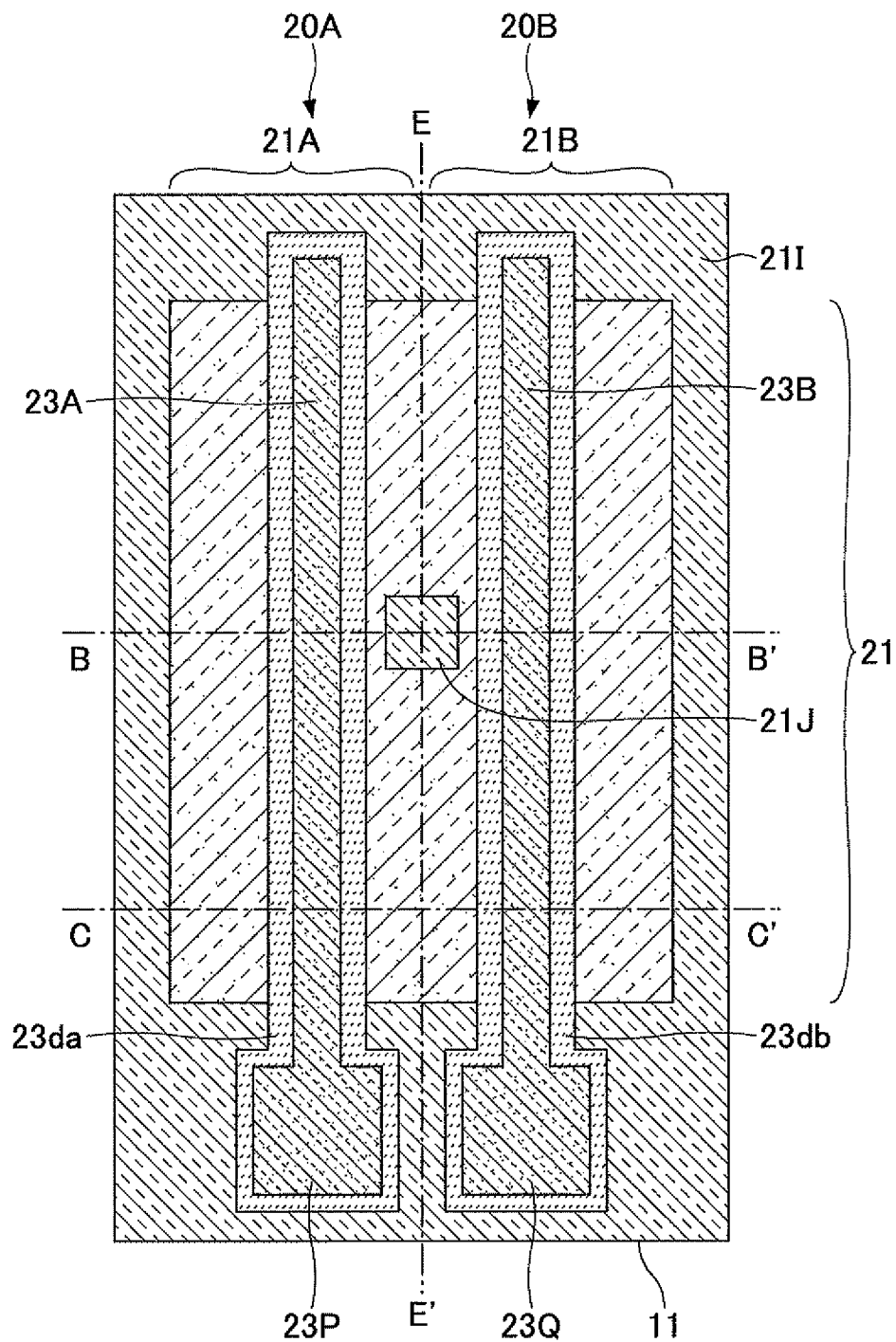
FIG. 7A is a top view illustrating a step of the manufacturing process of the semiconductor device according to the first embodiment.
Figure 7C:
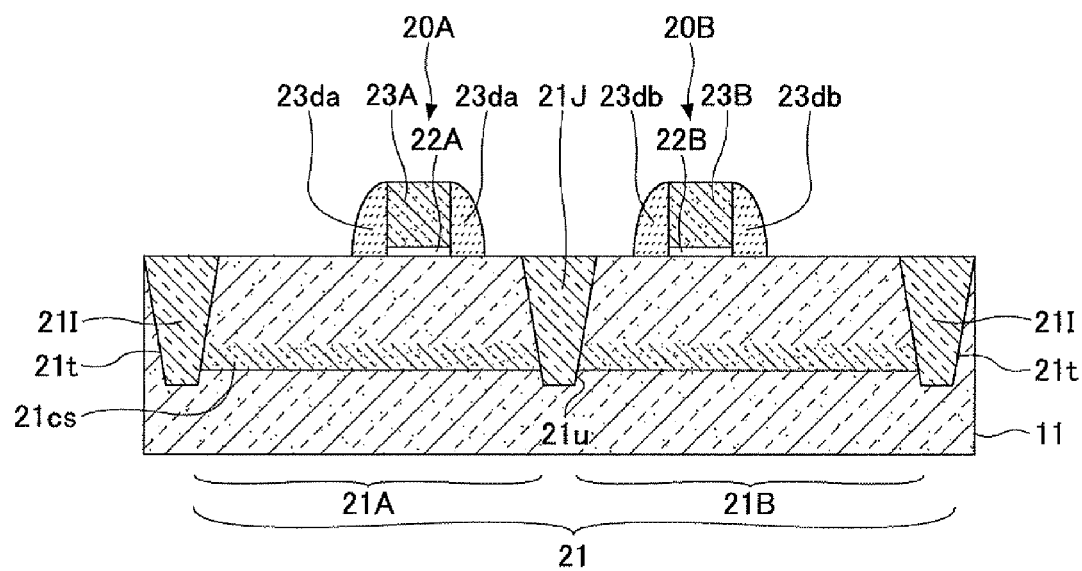
FIG. 7C is a cross-sectional view cut along the line B-B' in FIG. 7A.
Figure 7D:
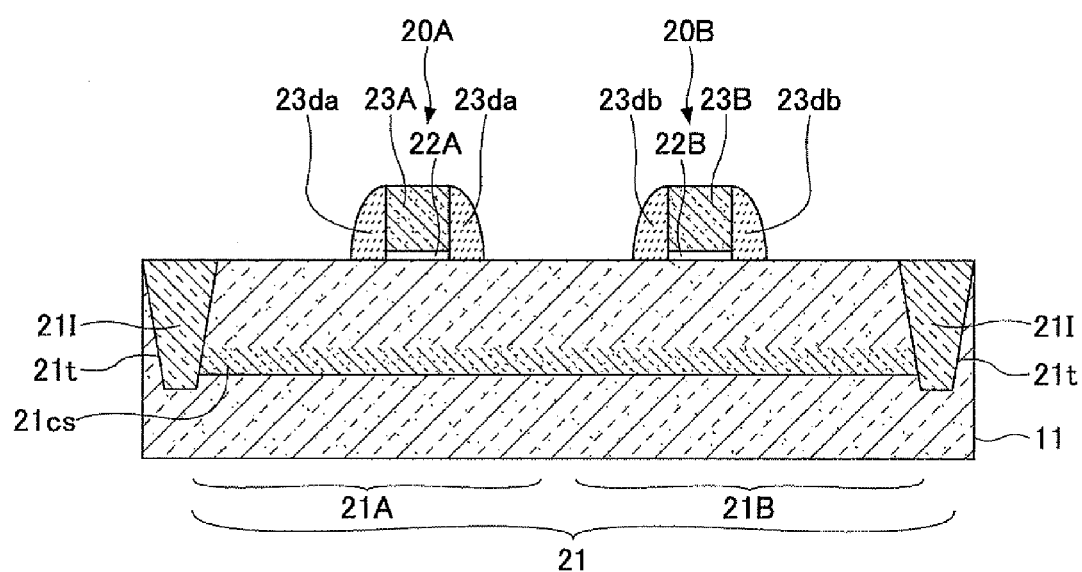
FIG. 7D is a cross-sectional view cut along the line C-C' in FIG. 7A.

FIGS. 7A through 7D illustrate a step of the manufacturing process of the semiconductor device 20 according to the first embodiment following the step of FIGS. 6A through 6D. Specifically, FIG. 7A is a top view corresponding to FIG. 6A. FIG. 7B is a cross-sectional view cut along the line E-E' in FIG. 7A. FIG. 7C is a cross-sectional view cut along the line B-B' in FIG. 7A. FIG. 7D is a cross-sectional view cut along the line C-C' in FIG. 7A.

As illustrated in FIG. 7A through 7D, in this step, a pair of side wall isolation films 23da is formed on the respective side walls of the first gate electrode 23A, the side walls being disposed opposite to each other. Also, a pair of side wall isolation films 23db is formed on the respective side walls of the second gate electrode 23B, the side walls being disposed opposite to each other. The side wall isolation films 23da and 23db are made of a material (e.g., SiN) having an etching selectivity with respect to silicon of the silicon substrate 11 and silicon oxide film of the device isolation region 21I and the isolation film region 21J. Further, the side wall isolation films 23da and 23db will be removed; therefore, the side wall isolation films 23da and 23db may also be called dummy side wall isolation films 23da and 23db.

The dummy side wall isolation films 23da and 23db extent on the device isolation region 21I and are formed on the side wall surfaces of the contact pad 23P and 23Q.

Figure 8A:
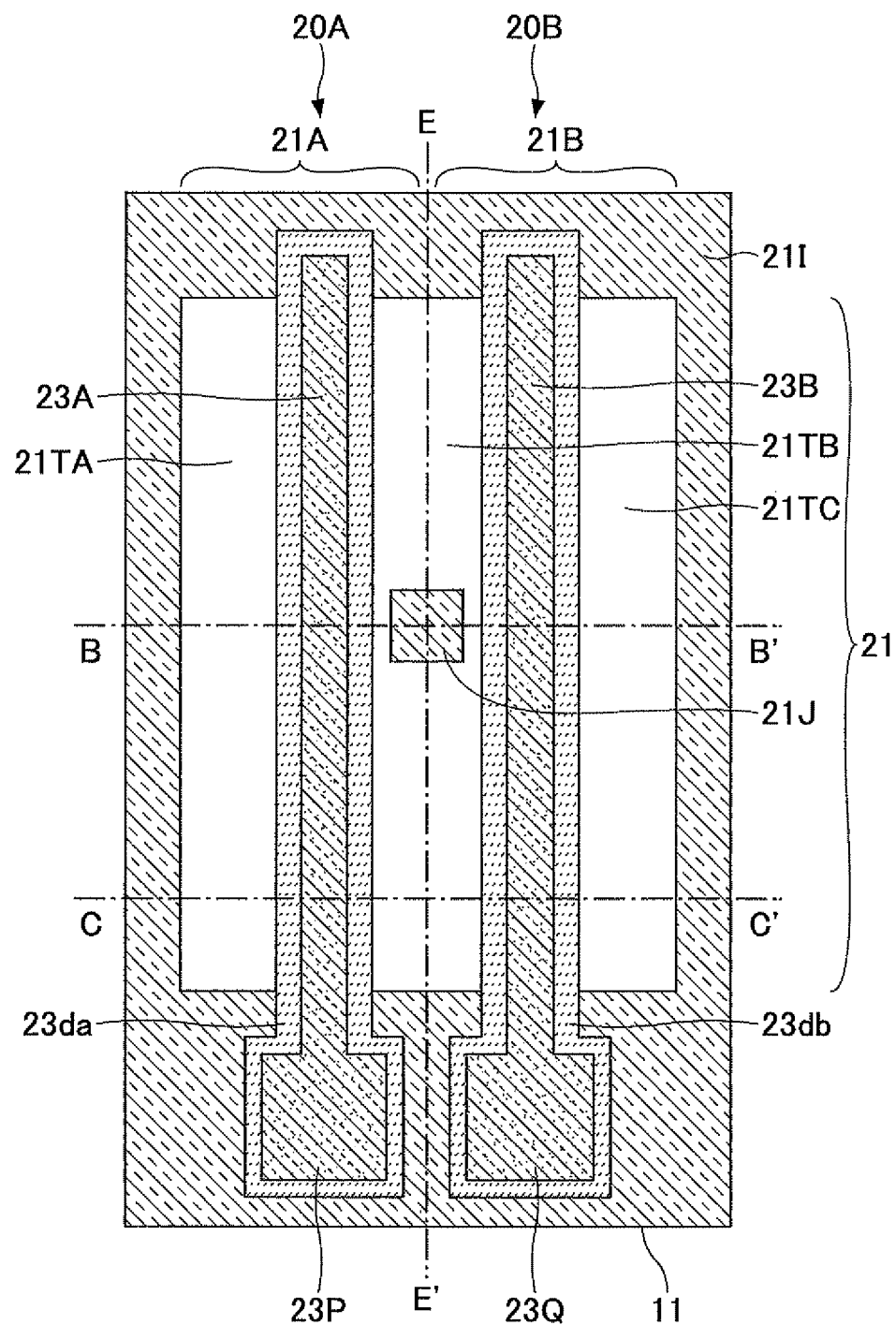
FIG. 8A is a top view illustrating a step of the manufacturing process of the semiconductor device according to the first embodiment.

FIGS. 8A through 8D illustrate a step of the manufacturing process of the semiconductor device 20 according to the first embodiment following the step of FIGS. 7A through 7D. Specifically, FIG. 8A is a top view corresponding to FIG. 7A. FIG. 8B is a cross-sectional view cut along the line E-E' in FIG. 8A. FIG. 8C is a cross-sectional view cut along the line B-B' in FIG. 8A. FIG. 8D is a cross-sectional view cut along the line C-C' in FIG. 8A.

As illustrated in FIG. 8A through 8D, in this step, dry etching is performed on the silicon substrate 11 by using the first gate electrode 23A, the second gate electrode 23B, and the dummy side wall isolation films 23da and 23db as a mask and by applying, for example, chlorine gas ($Cl_2$) or hydrochloric gas (HCl) as etching gas. By the dry etching, the part outside the dummy side wall isolation films 23da when viewed from the first gate electrode 23A and the part outside dummy side wall isolation films 23db when viewed from the second gate electrode 23B in the silicon substrate 11 are etched in a manner such that the depth of the etched parts does not exceed the depth of the device isolation region 21I and the isolation film region 21J.

In this case, the silicon substrate 11 is etched to a depth of, for example, 80 nm. As a result, a first trench 21TA, a second trench 21TB, and a third trench 21TC are formed. Specifically, the first trench 21TA is formed on the first side (i.e., on the left-hand side) of the first gate electrode 23A. The third trench 21TC are formed on the second side (i.e., on the right-hand side) of the second gate electrode 23B. Further, the second trench 21TB is formed between the first gate electrode 23A and the second gate electrode 23B. Though it is not illustrated, on the upper parts of the first gate electrode 23A and the second gate electrode 23B, in the step of FIGS. 5A through 5D, silicon oxide films are formed to be used as an etching mask.

As a result of forming the trenches 21TA, 21TB, and 21TC, as a part of the p-type silicon substrate 11, the mesa structure $M_1$ rising upward from the bottom of the trenches 21TA and 21TB is formed under the first gate electrode 23A and the (first) dummy side wall isolation films 23da. Also, as a part of the p-type silicon substrate 11, the mesa structure $M_2$ rising upward from the bottom of the trenches 21TB and 21TC is formed under the second gate electrode 23B and the (second) dummy side wall isolation films 23db.

Figure 9A:
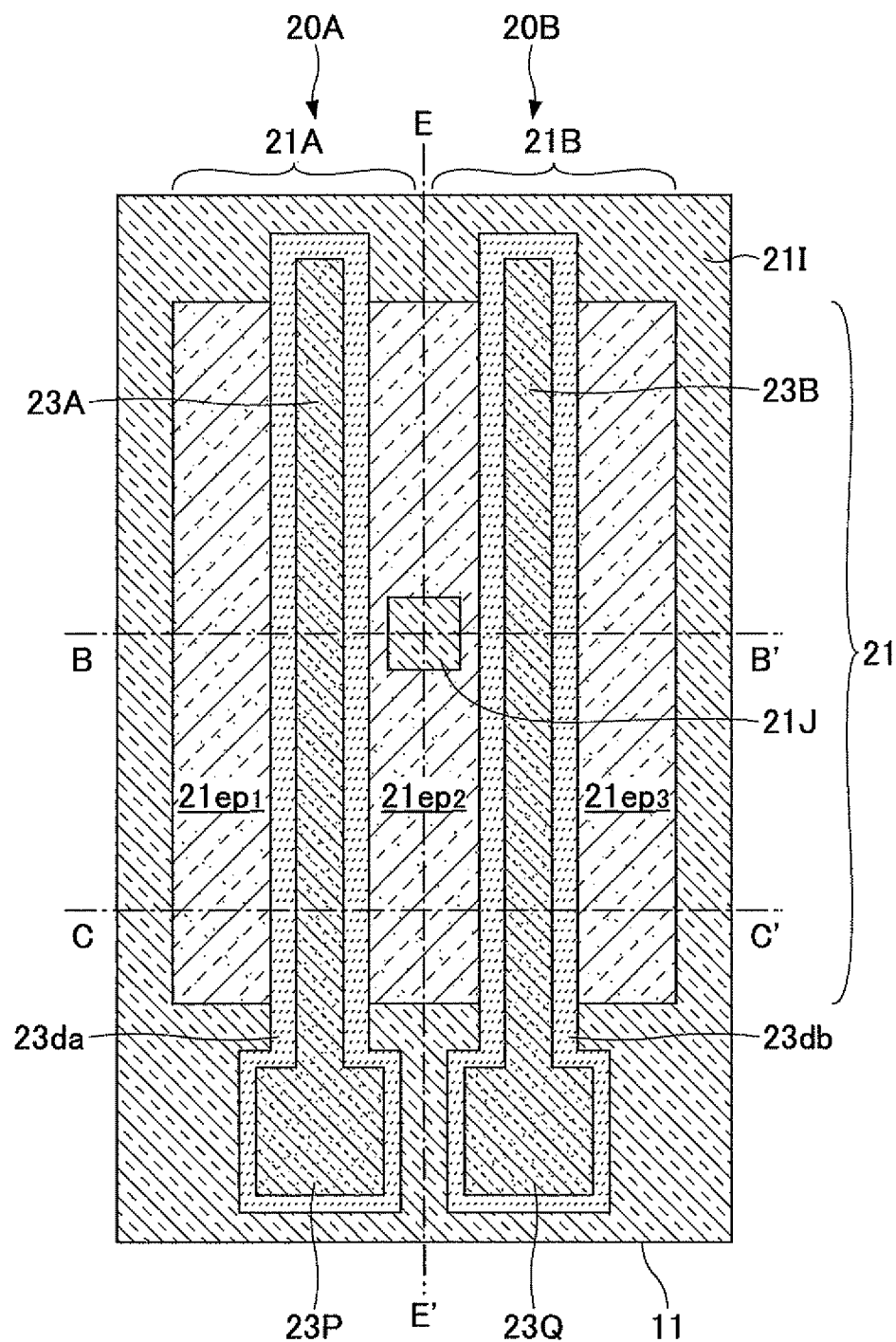
FIG. 9A is a top view illustrating a step of the manufacturing process of the semiconductor device according to the first embodiment.
Figure 9B:
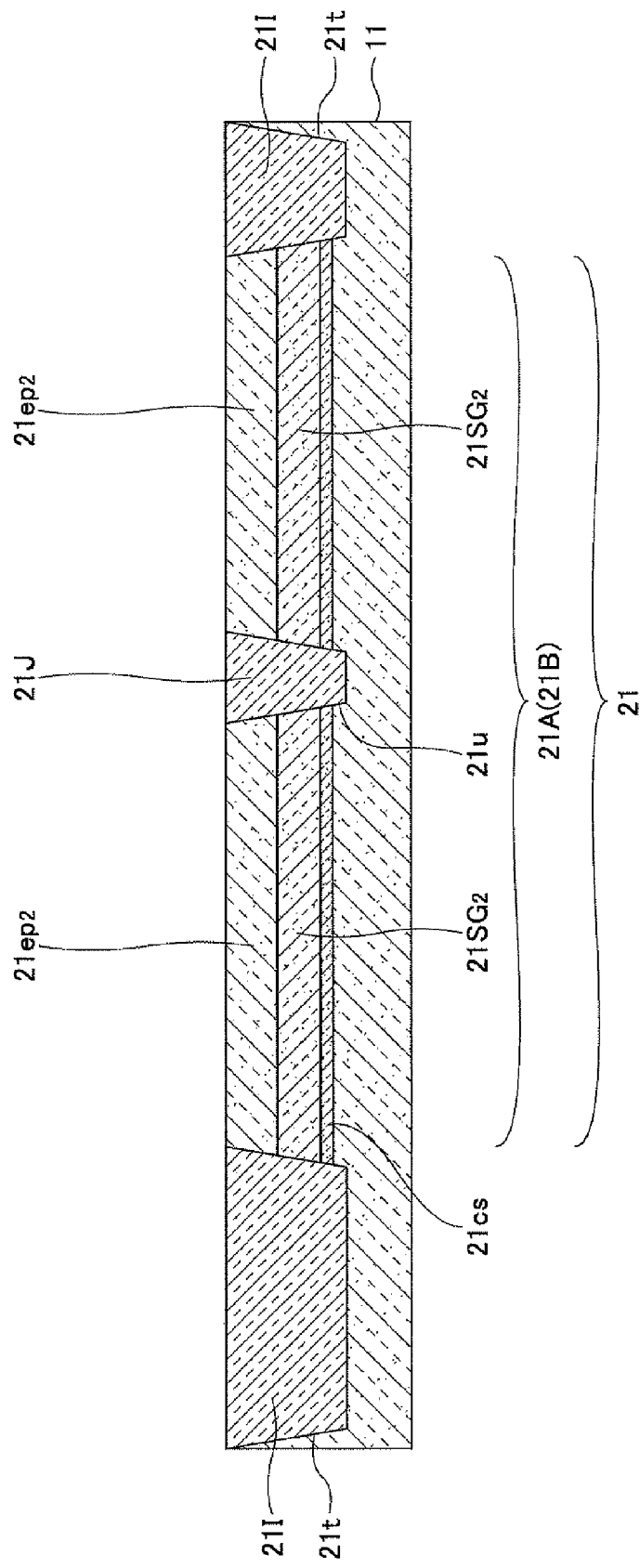
FIG. 9B is a cross-sectional view cut along the line E-E' in FIG. 9A.
Figure 9C:
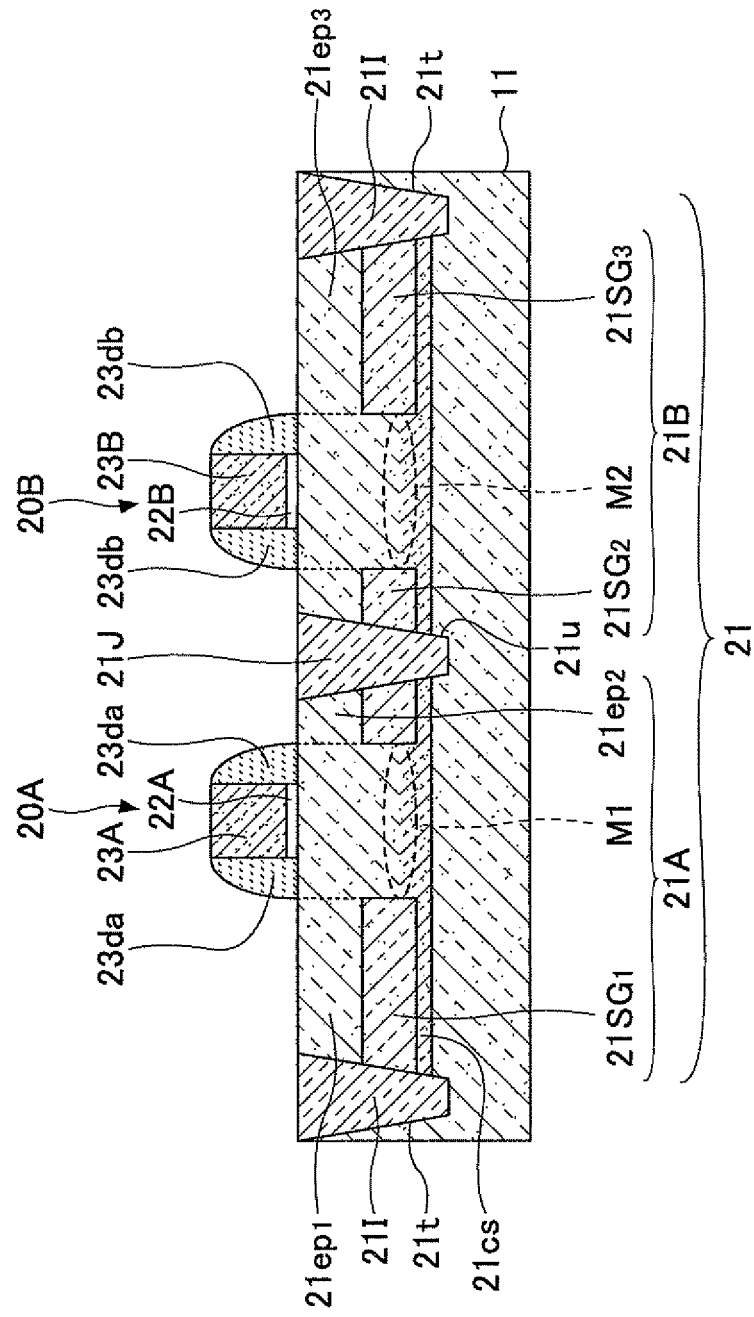
FIG. 9C is a cross-sectional view cut along the line B-B' in FIG. 9A.
Figure 9D:
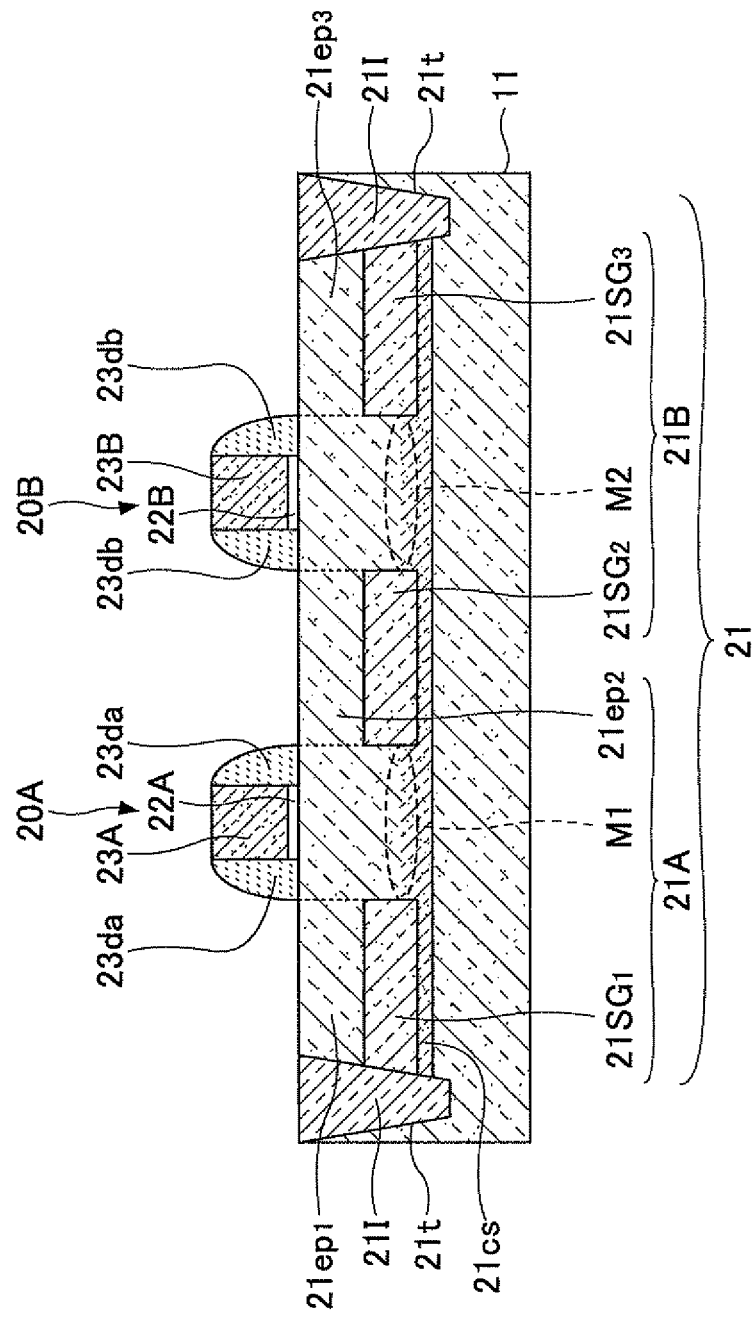
FIG. 9D is a cross-sectional view cut along the line C-C' in FIG. 9A.

FIGS. 9A through 9D illustrate a step of the manufacturing process of the semiconductor device 20 according to the first embodiment following the step of FIGS. 8A through 8D. Specifically, FIG. 9A is a top view corresponding to FIG. 8A. FIG. 9B is a cross-sectional view cut along the line E-E' in FIG. 9A. FIG. 9C is a cross-sectional view cut along the line B-B' in FIG. 9A. FIG. 9D is a cross-sectional view cut along the line C-C' in FIG. 9A.

As illustrated in FIG. 9A through 9D, in this step, a Si—Ge mixed layer is selectively and epitaxially grown to have a thickness of in a range, for example, from 20 nm to 80 nm by the CVD method using a mixed gas of, for example, silane ($SiH_4$) or dichlosilane ($SiH_2Cl_2$), monogermane ($GeH_4$), hydrogen chloride (HCl), and hydrogen ($H_2$) as a material. Herein, the term Si—Ge mixed layer may be a mixed layer including any other element in addition to Si and Ge.

For example, the Si—Ge mixed layer may be epitaxially grown at a growth speed of, for example, 45 nm/min under a pressure in a range from 1330 Pa to 13300 Pa (i.e., 10 Torr to 100 Torr), preferably at 5320 Pa (40 Torr), a substrate temperature in a range from 650° C. to 750° C., preferably at 700° C., a hydrogen gas partial pressure in a range from 4000 Pa to 6000 Pa, preferably at 5300 Pa, a dichlorosilane gas partial pressure in a range from 20 Pa to 30 Pa, preferably at 26 Pa, a monogermane gas partial pressure in a range from 10 Pa to 15 Pa, preferably at 12 Pa, and a hydrogen chloride gas partial pressure in a range from 10 Pa to 15 Pa, preferably at 12 Pa.

As a result of the growth of the Si—Ge mixed layer, a first Si—Ge mixed layer region $SG_1$, a second Si—Ge mixed layer region $SG_2$, and a third Si—Ge mixed layer region $SG_3$ are epitaxially formed relative to the p-type silicon substrate 11 corresponding to the first trench 21TA, the second trench 21TB, and the third trench 21TC, respectively, so as to have a thickness in a range from 20 nm to 80 nm.

Here, for example, the Si—Ge mixed layer regions $SG_1$ through $SG_3$ having approximately 20% of Ge atomic fraction are used. However, Ge composition in the Si—Ge mixed layer regions $SG_1$ through $SG_3$ may be increased as long as the Si—Ge mixed layer regions $SG_1$ through $SG_3$ may epitaxially grow relative to the silicon substrate 11. For example, it may be possible to use the Si—Ge mixed layer having approximately 40% of the Ge atomic fraction may be used as the Si—Ge mixed layer regions $SG_1$ through $SG_3$. Further, as the Si—Ge mixed layer regions $SG_1$ through $SG_3$, it may also be possible to use the Si—Ge mixed layer further includes C (Carbon).

Further, in the step of FIGS. 9A through 9D, on the Si—Ge mixed layer regions $SG_1$, $SG_2$, and $SG_3$ in the trenches 21TA, 21TB, and 21TC, the silicon epitaxial layers $21ep_1$, $21ep_2$, and $21ep_3$, respectively, are epitaxially grown relative to the silicon substrate 11 using mixed gas including, for example, disilane gas, hydrogen chloride gas, and hydrogen gas.

For example, the silicon epitaxial layers $21ep_1$, $21ep_1$, and $21ep_1$ may be grown at a growth speed of, for example, 0.7 nm/min under a pressure in a range from 1330 Pa to 13300 Pa (i.e., 10 Torr to 100 Torr), preferably at 5320 Pa (40 Torr), a substrate temperature in a range from 650° C. to 750° C., preferably at 700° C., a hydrogen gas partial pressure in a range from 4000 Pa to 6000 Pa, preferably at 5300 Pa, a dichlorosilane gas partial pressure in a range from 15 Pa to 25 Pa, preferably at 21 Pa, and a hydrogen chloride gas partial pressure in a range from 3 Pa to 10 Pa, preferably at 5 Pa.

As a result of the growth of the Si—Ge mixed layer, it may become possible to fill the trenches 21TA, 21TB, and 21TC up to the upper surface of the silicon substrate 11 with the silicon epitaxial layers $21ep_1$, $21ep_2$, and $21ep_3$ on the Si—Ge mixed layer regions $SG_2$, $SG_2$, and $SG_2$, respectively. However, in this embodiment, the silicon epitaxial layers $21ep_1$, $21ep_2$, and $21ep_3$ may be grown so as to exceed the upper surface of the silicon substrate 11.

Figure 10A:
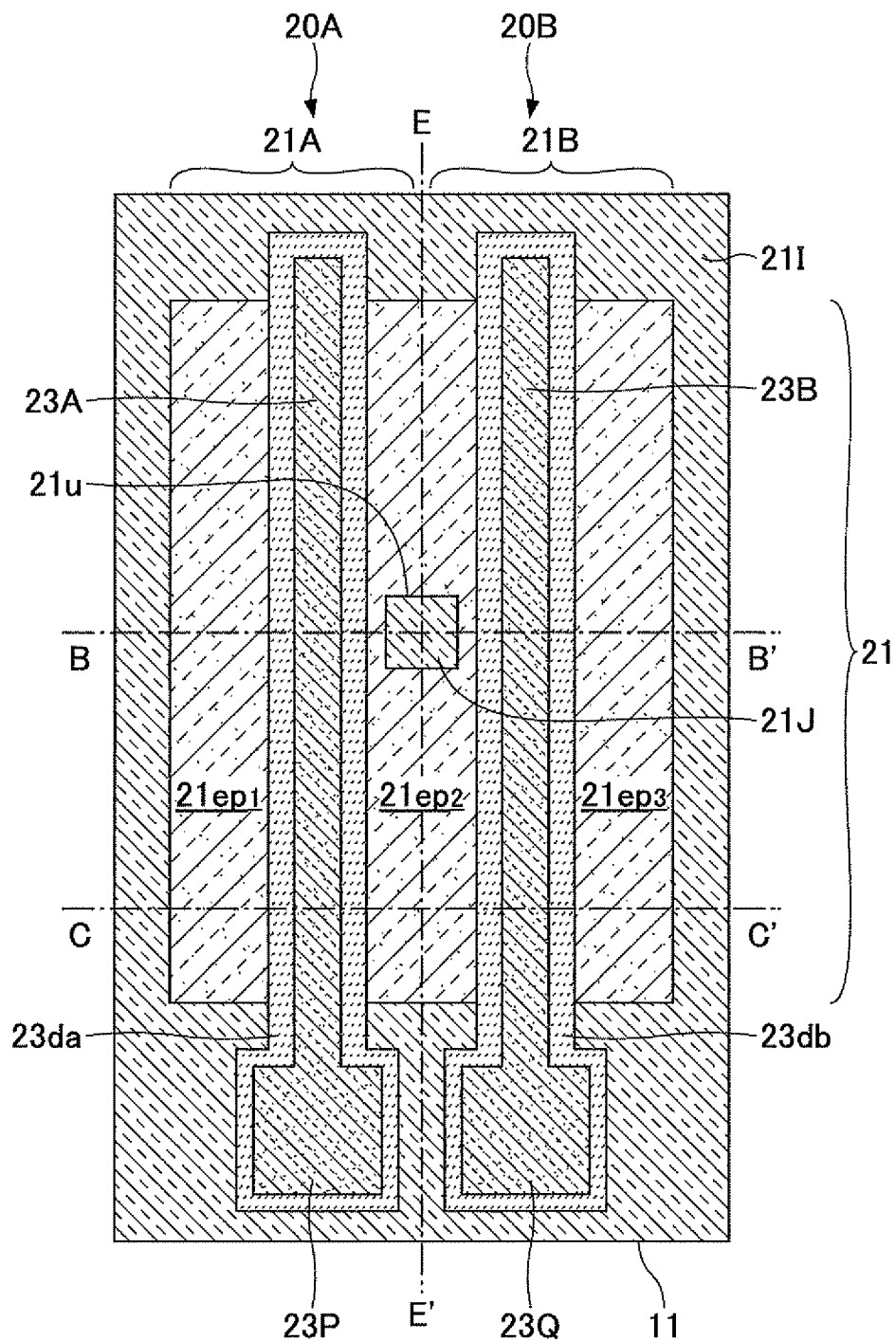
FIG. 10A is a top view illustrating a step of the manufacturing process of the semiconductor device according to the first embodiment.
Figure 10B:
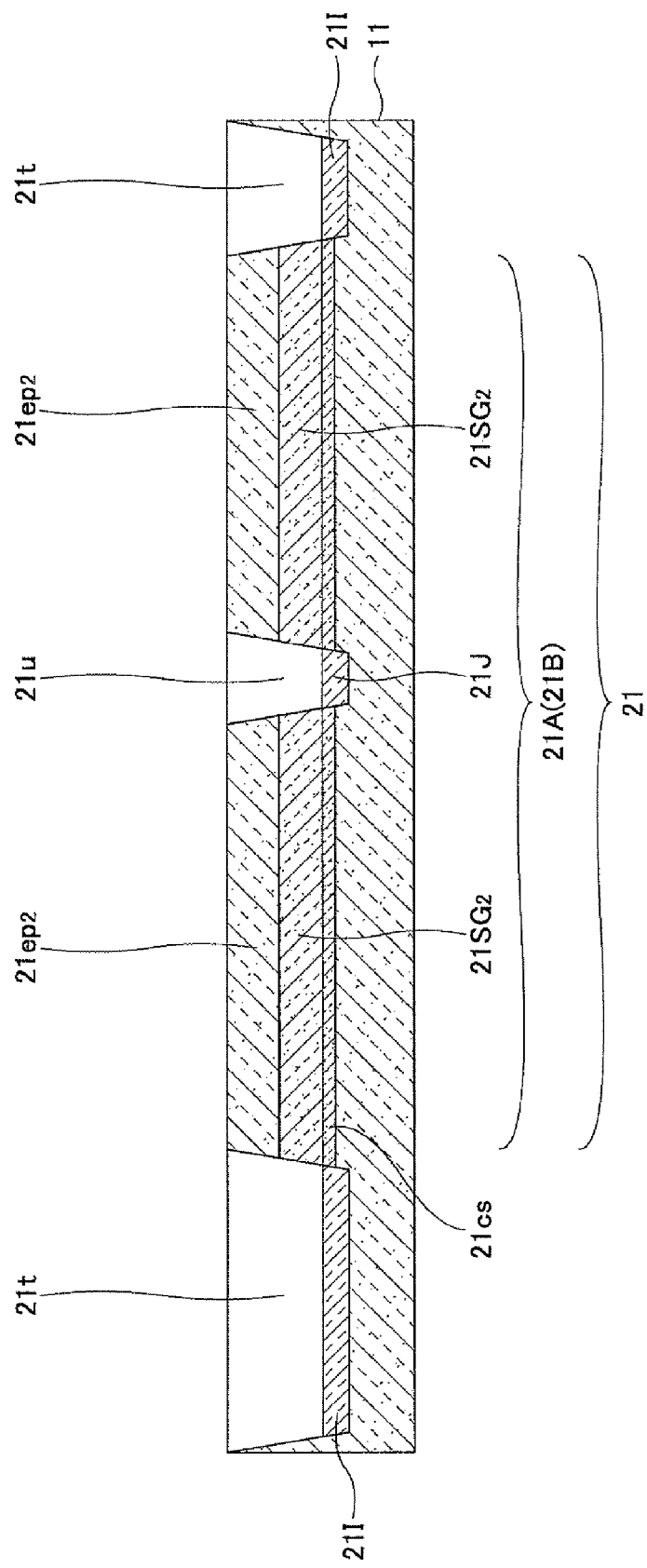
FIG. 10B is a cross-sectional view cut along the line E-E' in FIG. 10A.
Figure 10C:
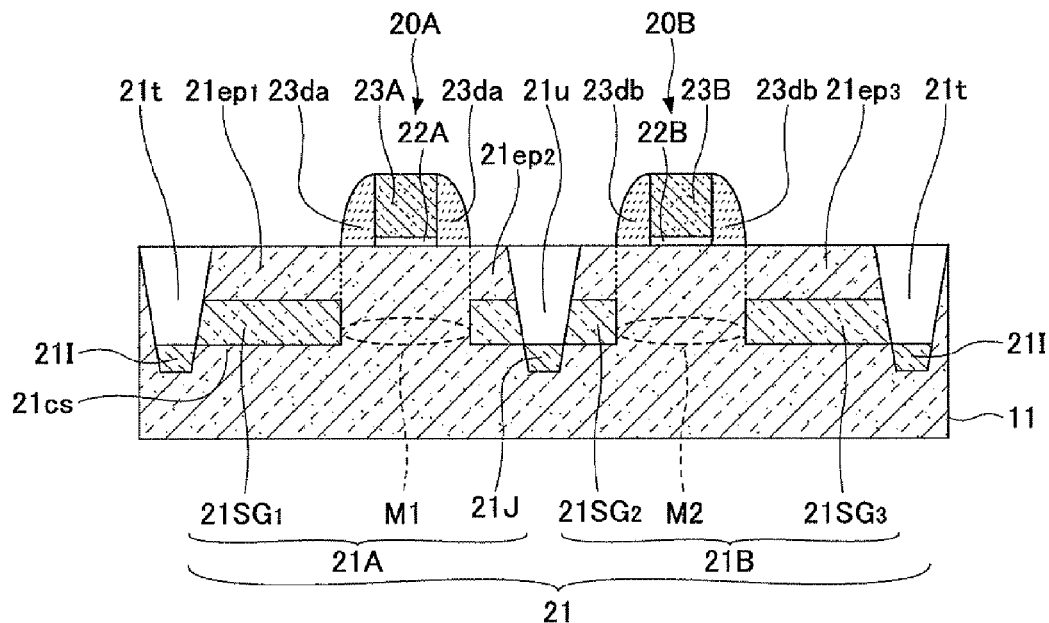
FIG. 10C is a cross-sectional view cut along the line B-B' in FIG. 10A.
Figure 10D:
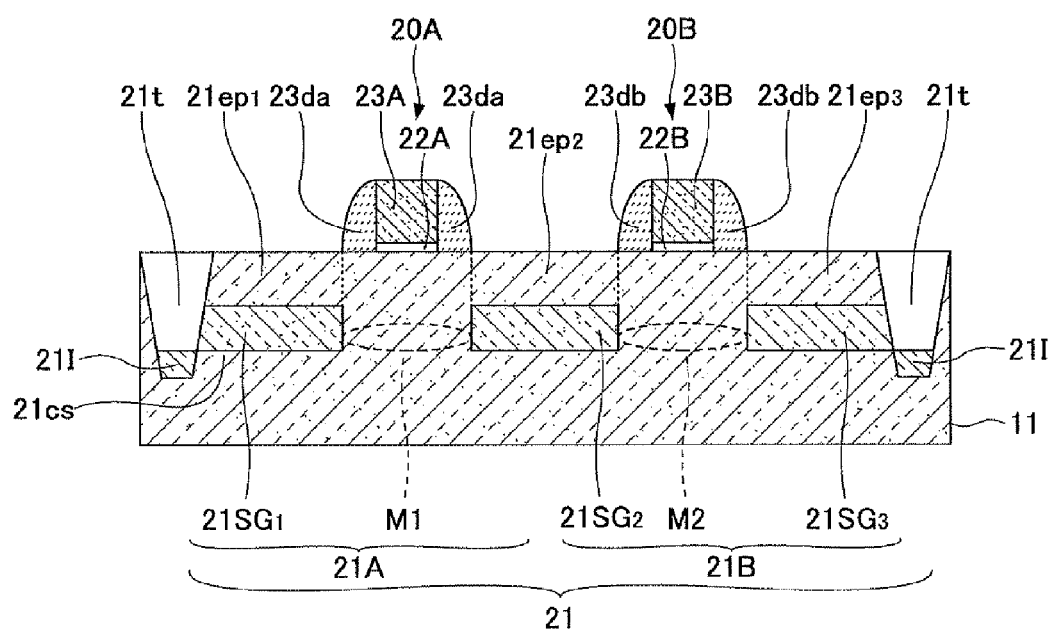
FIG. 10D is a cross-sectional view cut along the line C-C' in FIG. 10A.

FIGS. 10A through 10D illustrate a step of the manufacturing process of the semiconductor device 20 according to the first embodiment following the step of FIGS. 9A through 9D. Specifically, FIG. 10A is a top view corresponding to FIG. 9A. FIG. 10B is a cross-sectional view cut along the line E-E' in FIG. 10A. FIG. 10C is a cross-sectional view cut along the line B-B' in FIG. 10A. FIG. 10D is a cross-sectional view cut along the line C-C' in FIG. 10A.

As illustrated in FIG. 10A through 10D, in this step, dry etching or wet etching using HF is performed on the structure illustrated in FIGS. 9A through 9D to remove the silicon oxide films filling the device isolation groove (first trench) 21t and the second trench 21u in the device isolation region 21I and the isolation film region 21J, respectively and expose the side wall surfaces of the Si—Ge mixed layer regions $SG_2$, $SG_2$, and $SG_2$ filling the trenches 21TA, 21TB, and 21TC, respectively.

In the example of FIGS. 10A through 10D, in the device isolation groove (first trench) 21t and the second trench 21u, the silicon oxide films corresponding to the device isolation region 21I and the isolation film region 21J remain at the same depth as the lower end of the silicon epitaxial layers $21ep_1$, $21ep_2$, and $21ep_3$. However, this is not always necessary. Namely, for example, the silicon oxide films may be completely removed from the device isolation groove (first trench) 21t and the second trench 21u.

Further, in the device isolation groove (first trench) 21t and the second trench 21u, the silicon oxide films may remain at the depth higher than the level illustrated in the figures, as long as sufficient areas of the side walls of the silicon epitaxial layers $21ep_1$, $21ep_2$, and $21ep_3$ are exposed.

Figure 11A:
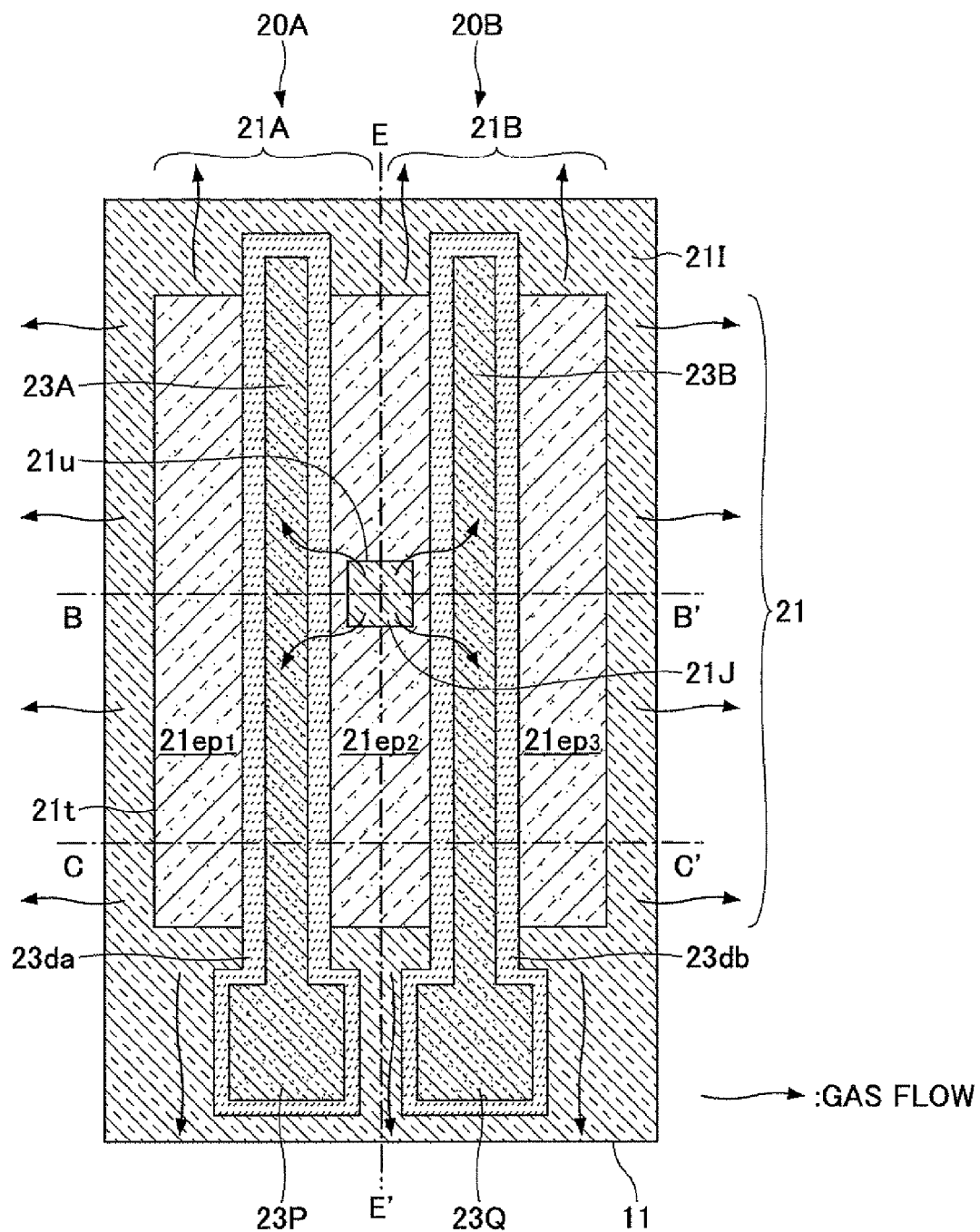
FIG. 11A is a top view illustrating a step of the manufacturing process of the semiconductor device according to the first embodiment.
Figure 11C:
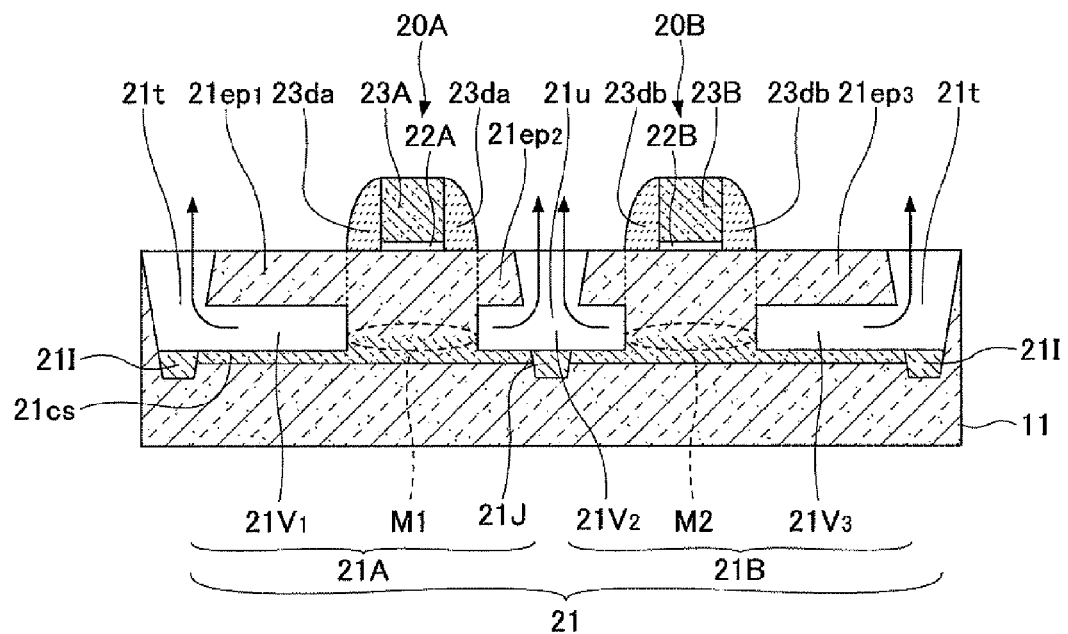
FIG. 11C is a cross-sectional view cut along the line B-B' in FIG. 11A.
Figure 11D:
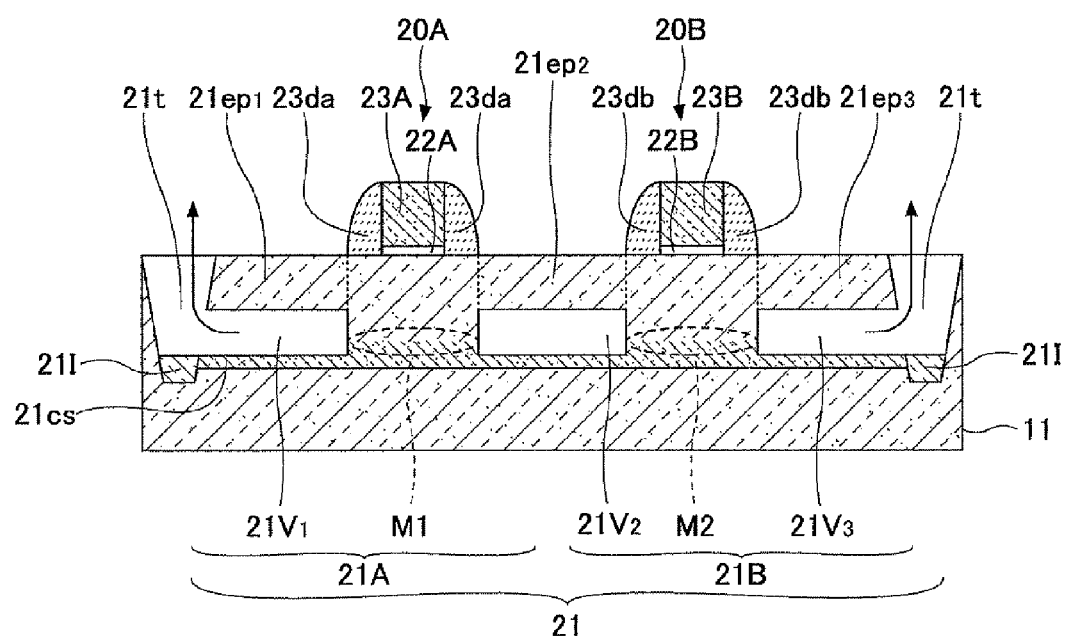
FIG. 11D is a cross-sectional view cut along the line C-C' in FIG. 11A.

FIGS. 11A through 11D illustrate a step of the manufacturing process of the semiconductor device 20 according to the first embodiment following the step of FIGS. 10A through 10D. Specifically, FIG. 11A is a top view corresponding to FIG. 10A. FIG. 11B is a cross-sectional view cut along the line E-E' in FIG. 11A. FIG. 11C is a cross-sectional view cut along the line B-B' in FIG. 11A. FIG. 11D is a cross-sectional view cut along the line C-C' in FIG. 11A.

As illustrated in FIG. 11A through 11D, in this step, through the device isolation groove (first trench) 21t and the second trench 21u, etching is performed on the silicon epitaxial layers $21ep_1$, $21ep_2$, and $21ep_3$ and the silicon substrate 11 from the side wall surfaces of the silicon epitaxial layers $21ep_1$, $21ep_2$, and $21ep_3$ so as to selectively remove the silicon epitaxial layers $21ep_1$, $21ep_2$, and $21ep_3$ and the silicon substrate 11 along gas flowing paths as illustrated in arrows in the figures. As a result, voids (air holes) $21V_1$, $21V_2$, and $21V_3$ corresponding to the Si—Ge mixed layer regions $SG_1$, $SG_2$, and $SG_3$ are formed.

For example, the selective etching of the silicon epitaxial layers $21ep_1$, $21ep_2$, and $21ep_3$ may be performed by dry etching using hydrogen gas and chlorine-based gas such as hydrogen gas, chlorine gas or the like at a temperature of, for example, 700° C. or dry etching using CF4 radical. Further, the selective etching may be performed by wet etching using a mixture of acetic acid and hydrofluoric acid.

The voids $21V_1$ and $21V_3$ formed as described above are in communication with the device isolation groove (first trench) 21t. Further, the void $21V_2$ formed as described above is in communication with the second trench 21u.

As described above, in this embodiment, when the Si—Ge mixed layer regions $SG_1$, $SG_2$, and $SG_3$ are selectively etched, by forming the isolation film region 21J (in advance), it may become possible to perform etching by way of the second trench 21u. As a result, it may become possible to effectively perform etching.

Figure 20A:
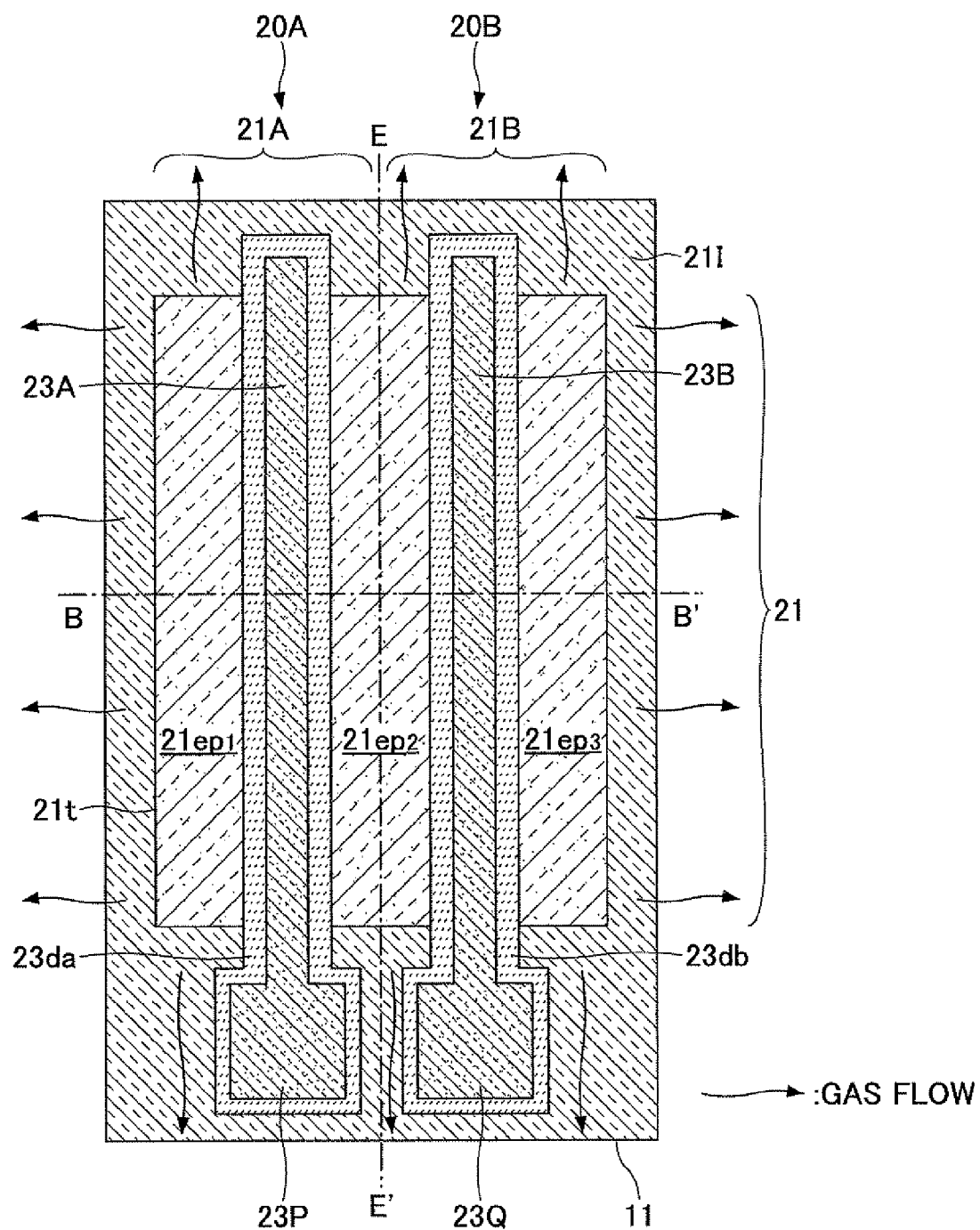
FIG. 20A is a top view illustrating a step of a manufacturing process of the semiconductor device according to a comparative example.
Figure 20C:
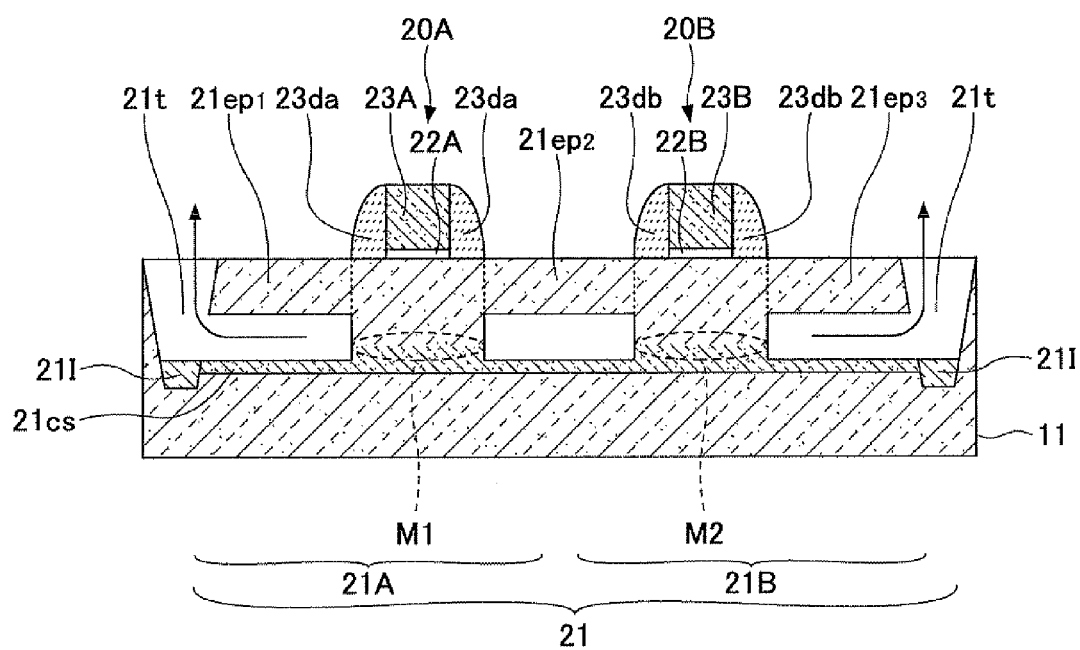
FIG. 20C is a cross-sectional view cut along the line B-B' in FIG. 20A.

On the other hand, in an comparative example where no isolation film region 21J is formed, as illustrated in FIGS. 20A through 20C, the etching is performed only bay way of the device isolation groove (first trench) 21t. As a result, the Si—Ge mixed layer regions $SG_1$ and $SG_3$ may be effectively removed in the multiple directions of the device isolation groove (first trench) 21t along the gas flow directions as illustrated in the figures from the device isolation groove (first trench) 21t.

However, in the Si—Ge mixed layer region $SG_2$ formed between the mesa structures $M_1$ and $M_2$, there are only two portions along the extending directions of the gate electrodes 23A and 23B where the Si—Ge mixed layer region $SG_2$ is exposed to the device isolation groove (first trench) 21t. Therefore, it may be difficult to (effectively) remove the Si—Ge mixed layer region $SG_2$ by etching. Herein, FIGS. 20A through 20C illustrate a semiconductor device according to a comparative example of this embodiment. FIG. 20B is a cross-sectional view cut along the line E-E' in FIG. 20A. FIG. 20C is a cross-sectional view cut along the line B-B' in FIG. 20A.

Figure 12A:
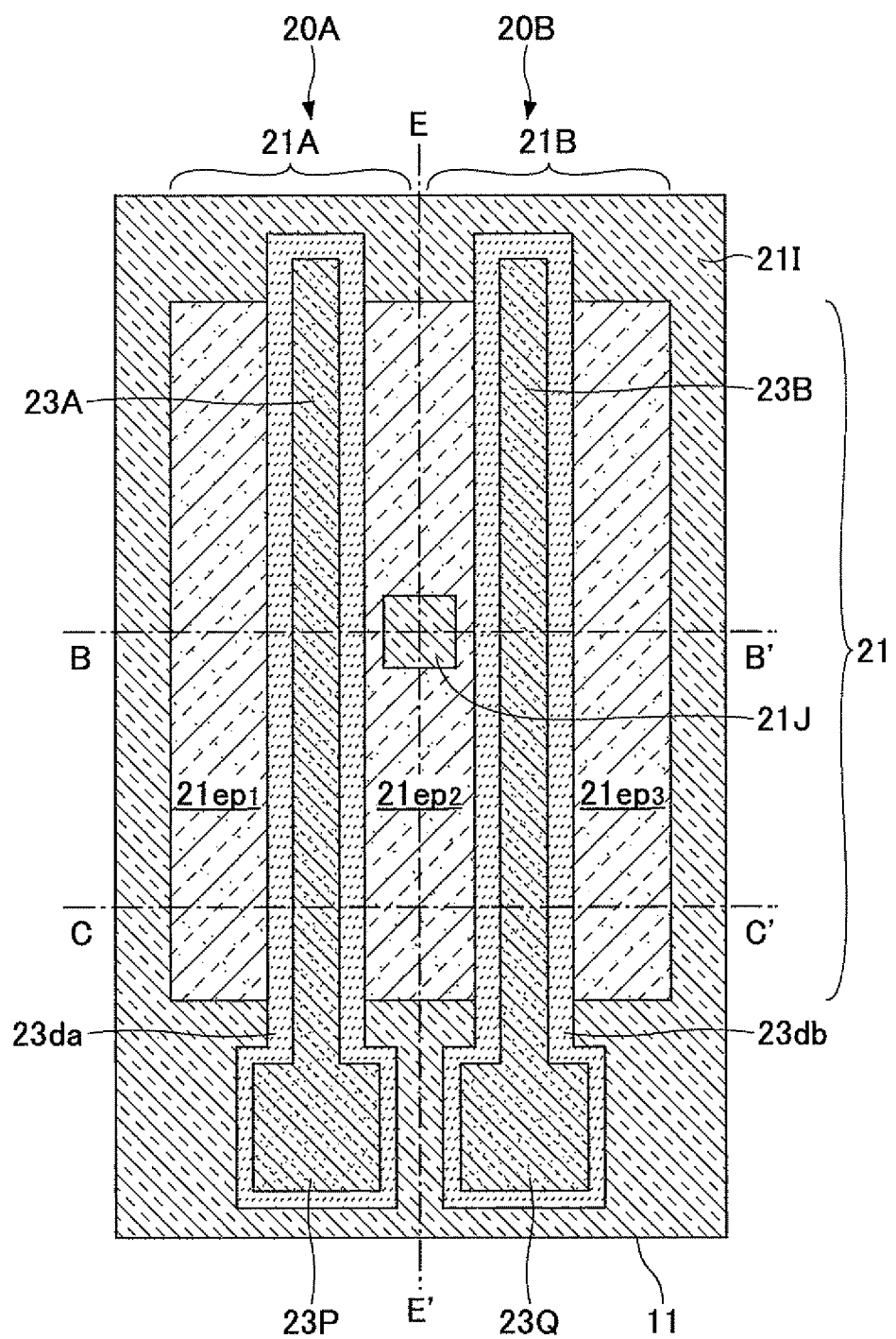
FIG. 12A is a top view illustrating a step of the manufacturing process of the semiconductor device according to the first embodiment.
Figure 12B:
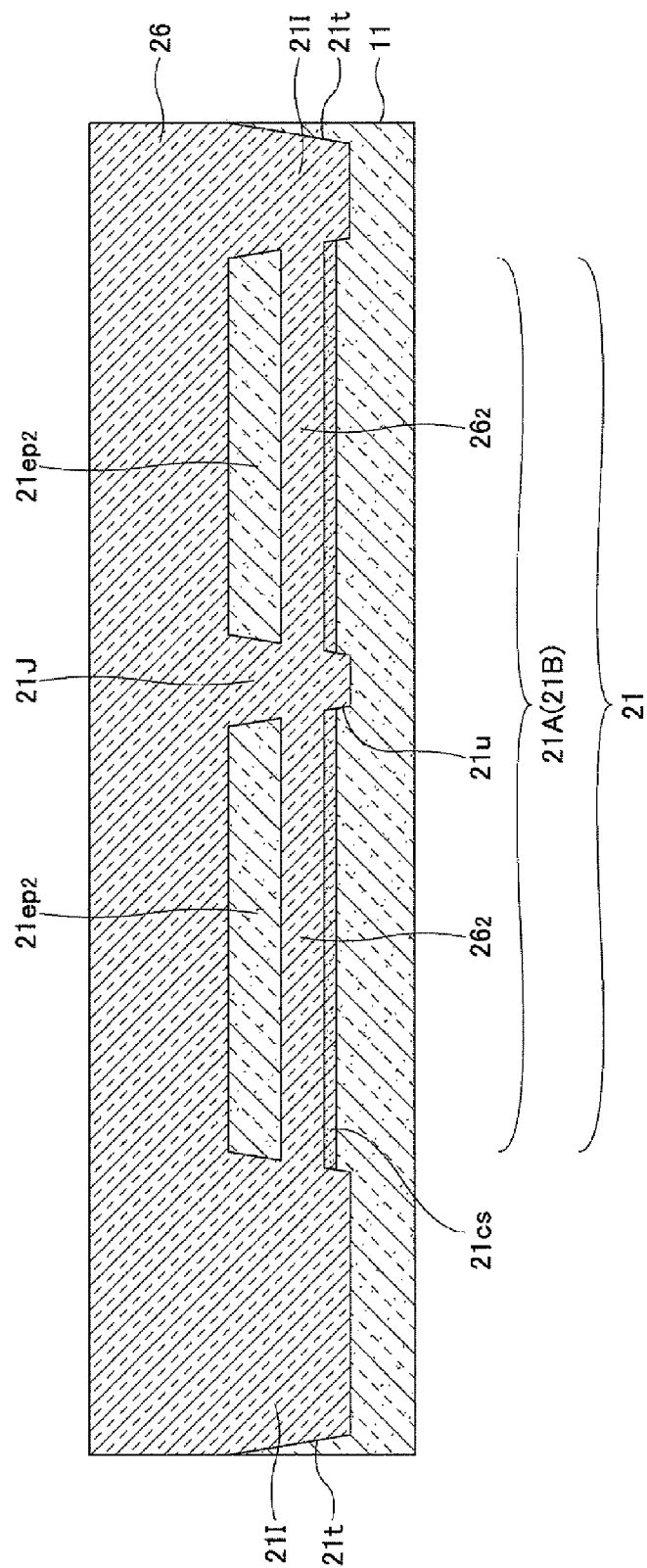
FIG. 12B is a cross-sectional view cut along the line E-E' in FIG. 12A.
Figure 12C:
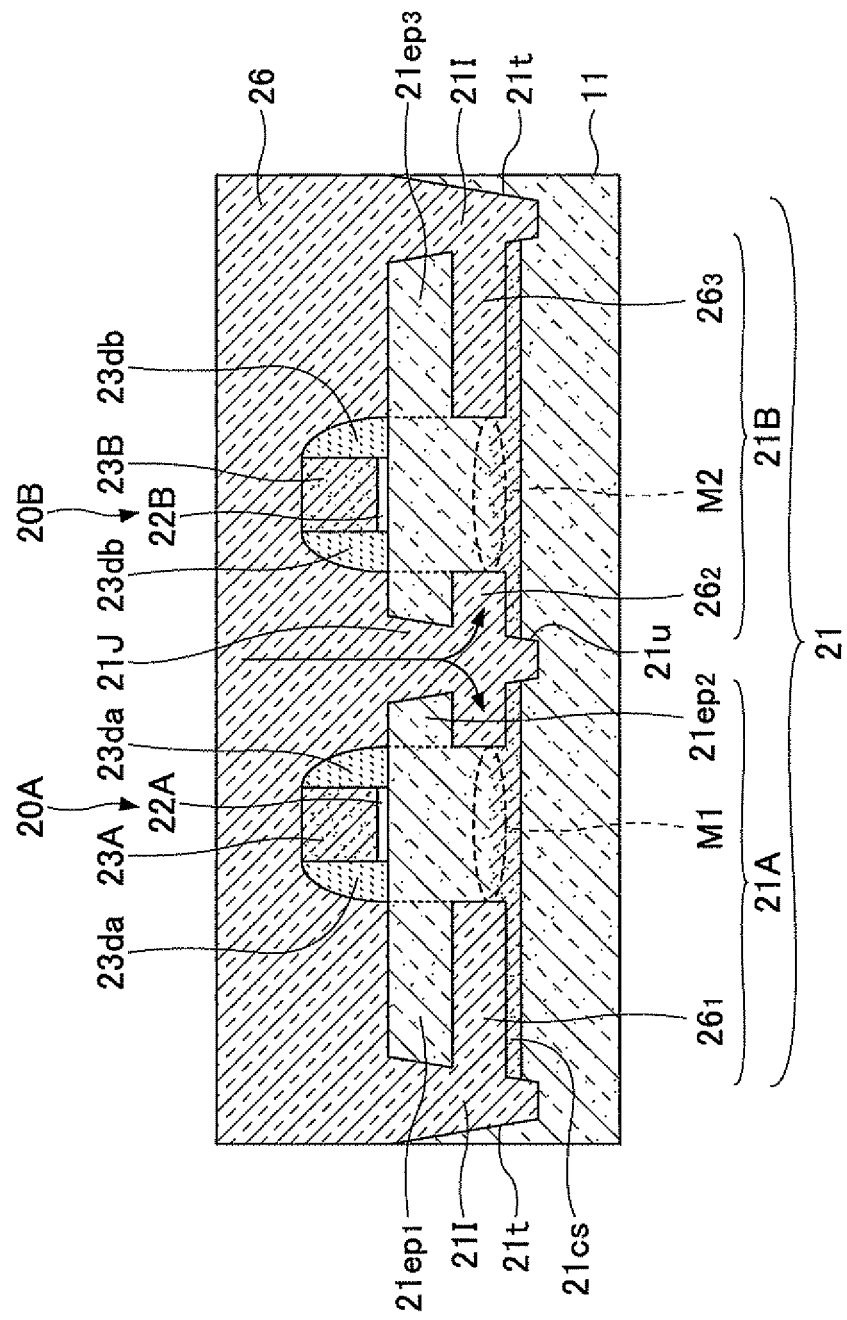
FIG. 12C is a cross-sectional view cut along the line B-B' in FIG. 12A.
Figure 12D:
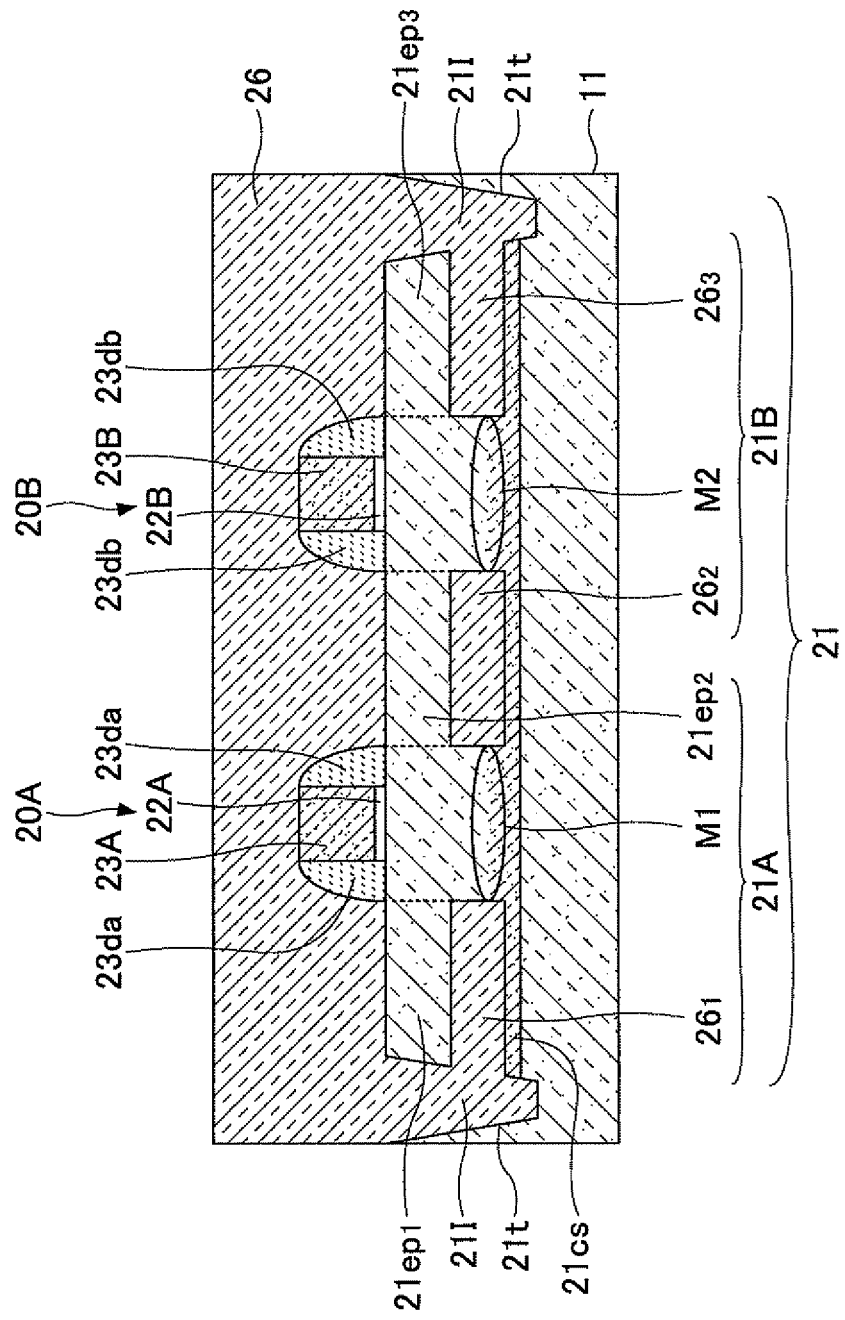
FIG. 12D is a cross-sectional view cut along the line C-C' in FIG. 12A.

FIGS. 12A through 12D illustrate a step of the manufacturing process of the semiconductor device 20 according to the first embodiment following the step of FIGS. 11A through 11D. Specifically, FIG. 12A is a top view corresponding to FIG. 11A. FIG. 12B is a cross-sectional view cut along the line E-E' in FIG. 12A. FIG. 12C is a cross-sectional view cut along the line B-B' in FIG. 12A. FIG. 12D is a cross-sectional view cut along the line C-C' in FIG. 12A.

As illustrated in FIG. 12A through 12D, in this step, the embedded isolation film 26 is accumulated on the structure of FIGS. 11A through 11D, so that not only the device isolation groove (first trench) 21t and the second trench 21u but also the voids $21V_1$, $21V_2$, and $21V_3$ are filled with the embedded isolation film 26. To accumulate the embedded isolation film 26, it is preferable to use a film forming method having an excellent step coverage such as an ALD (Atomic Layered Deposition) method, the CVD method, an SOD (Spin-On-Dielectric) method, or the like.

For example, the embedded isolation film 26 may be formed by using tetradimethylaminosilane (TDMAS) and ozone ($O_3$) as material gas at a temperature in a range from 300° C. to 600° C. Alternatively, as the material gas, BTB-BAS (bis(tertiary-butylamino)silane) and oxygen. Further, in the step of FIG. 12A through 12D, it may not be necessary to completely fill the voids $21V_1$, $21V_2$, and $21V_3$ with the embedded isolation film 26. Namely, for example, a void may remain partially.

In FIG. 12A, no embedded isolation film 26 accumulated on the surface of the silicon substrate 11 is illustrated.

Figure 13A:
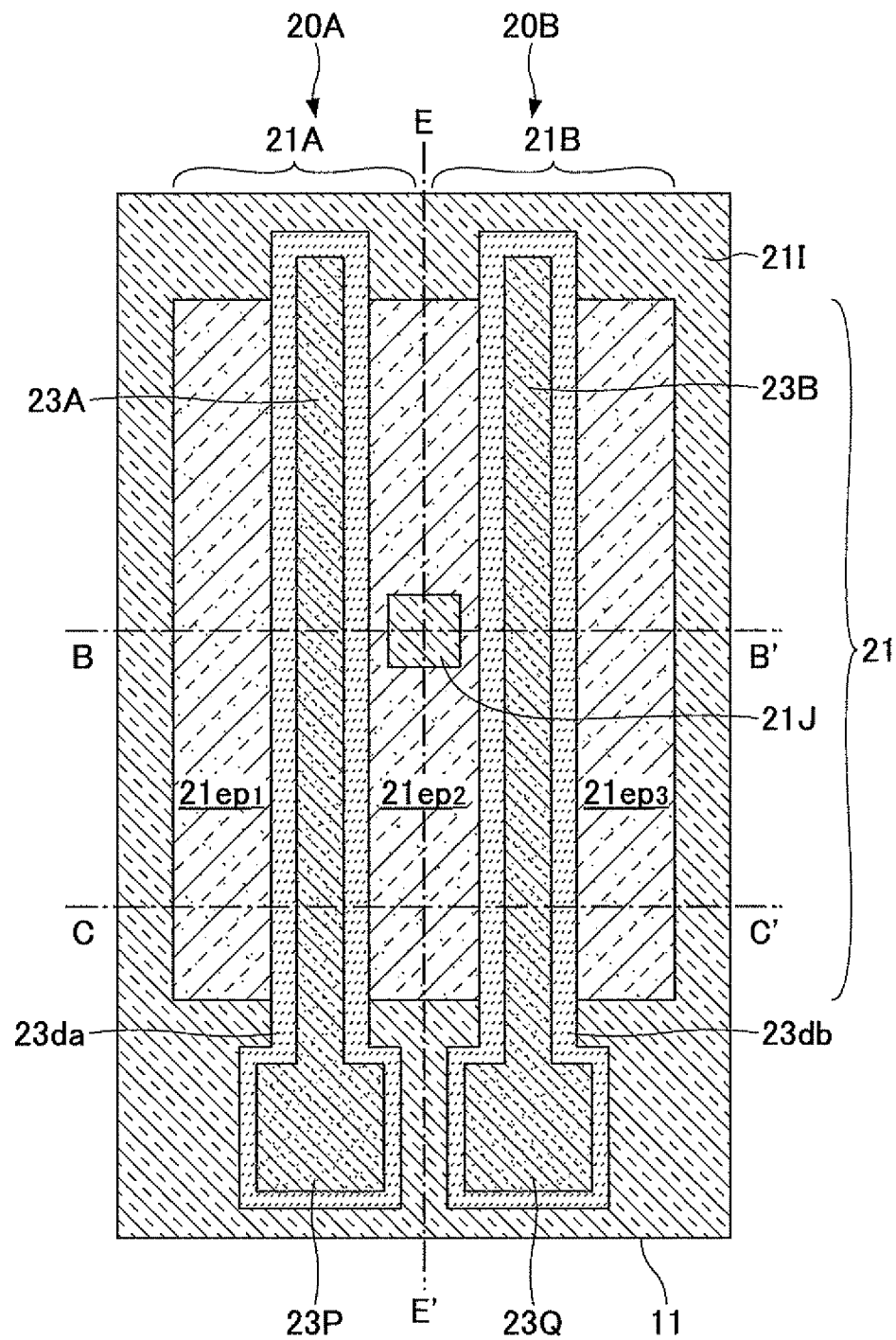
FIG. 13A is a top view illustrating a step of the manufacturing process of the semiconductor device according to the first embodiment.
Figure 13B:
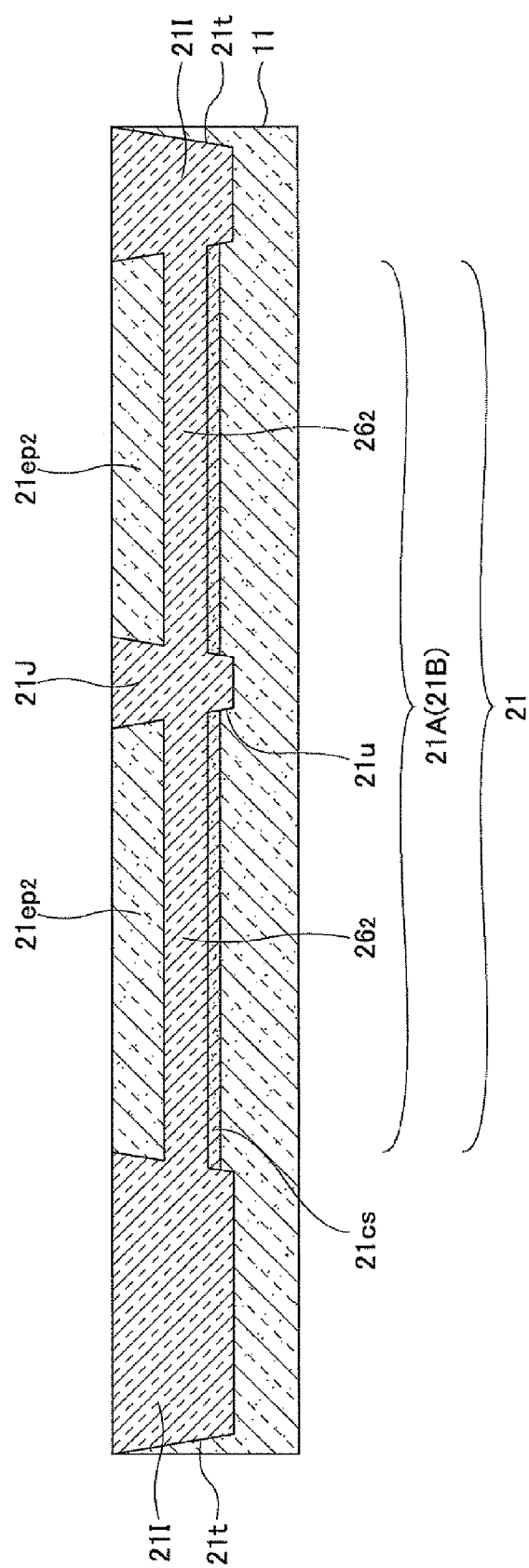
FIG. 13B is a cross-sectional view cut along the line E-E' in FIG. 13A.
Figure 13C:
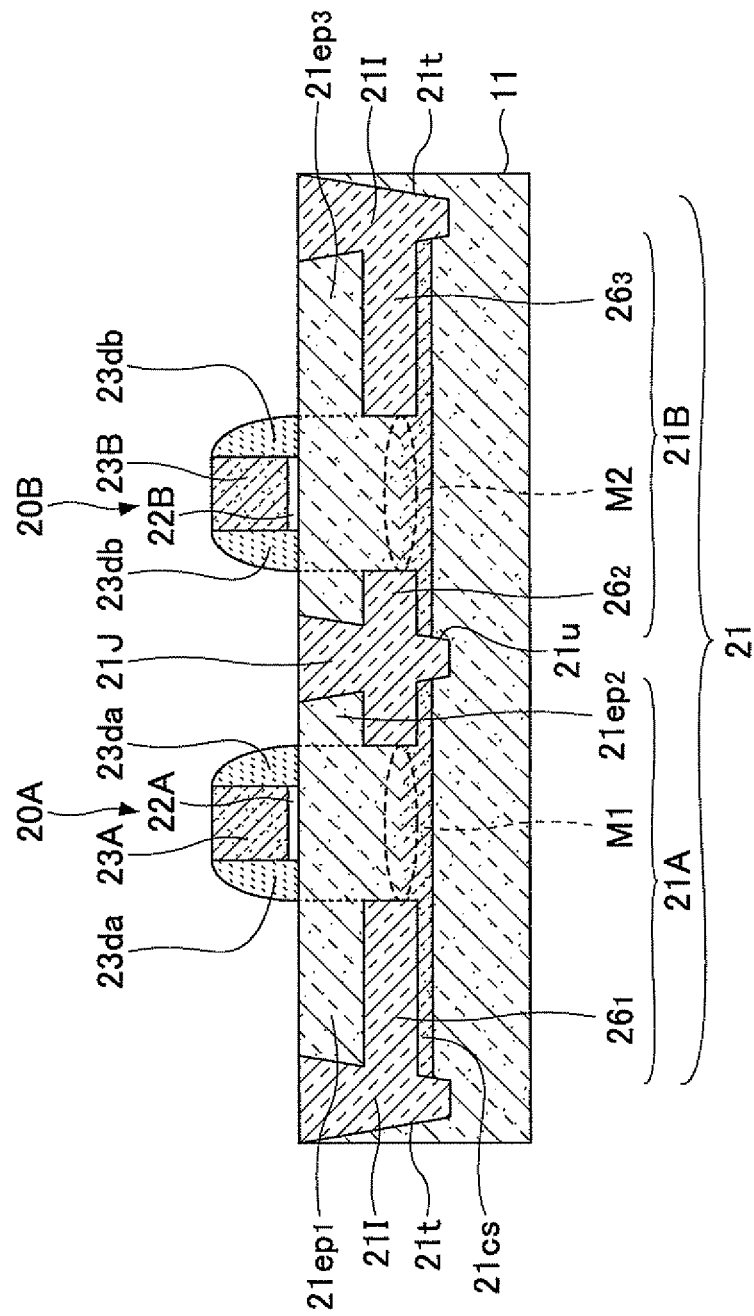
FIG. 13C is a cross-sectional view cut along the line B-B' in FIG. 13A.
Figure 13D:
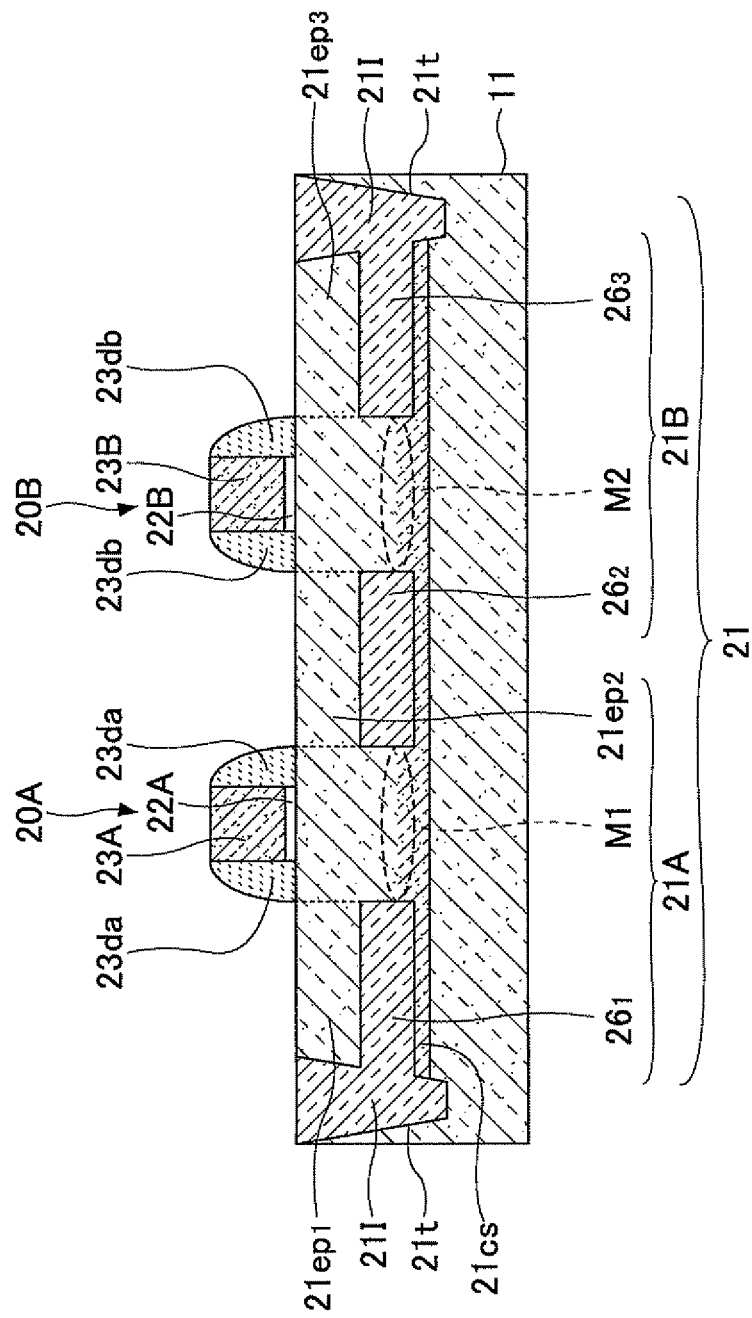
FIG. 13D is a cross-sectional view cut along the line C-C' in FIG. 13A.

FIGS. 13A through 13D illustrate a step of the manufacturing process of the semiconductor device 20 according to the first embodiment following the step of FIGS. 12A through 12D. Specifically, FIG. 13A is a top view corresponding to FIG. 12A. FIG. 13B is a cross-sectional view cut along the line E-E' in FIG. 13A. FIG. 13C is a cross-sectional view cut along the line B-B' in FIG. 13A. FIG. 13D is a cross-sectional view cut along the line C-C' in FIG. 13A.

As illustrated in FIG. 13A through 13D, in this step, an excessive embedded isolation film 26 on the silicon substrate 11 is etched back (removed) by dry etching, so that the surfaces of the silicon epitaxial layers $21ep_1$, $21ep_2$, and $21ep_3$ are exposed. As a result of the etch back, in the device isolation region 21I and the isolation film region 21J and under the silicon epitaxial layers $21ep_1$, $21ep_2$, and $21ep_3$, not only the device isolation groove (first trench) $21t$ and the second trench $21u$ but also the voids $21V_1$, $21V_2$, and $21V_3$ are filled with the embedded isolation film 26, so that the embedded isolation films $26_1$, $26_2$, and $26_3$ are formed under the silicon epitaxial layers $21ep_1$, $21ep_2$, and $21ep_3$, respectively. The embedded isolation films $26_1$, $26_2$, and $26_3$ correspond to the embedded isolation films $26_1$, $26_2$, and $26_3$ in FIGS. 1A through 1D.

Further, the device isolation groove (first trench) $21t$ and the second trench $21u$ are also filled with the embedded isolation film 26. As a result, in the device isolation region 21I and the isolation film region 21J, the lower parts of the device isolation groove (first trench) $21t$ and the second trench $21u$ are filled with the isolation film filled in step of FIGS. 3A through 3D, and the upper parts of the device isolation groove (first trench) $21t$ and the second trench $21u$ are filled with the embedded isolation film 26.

Figure 14A:
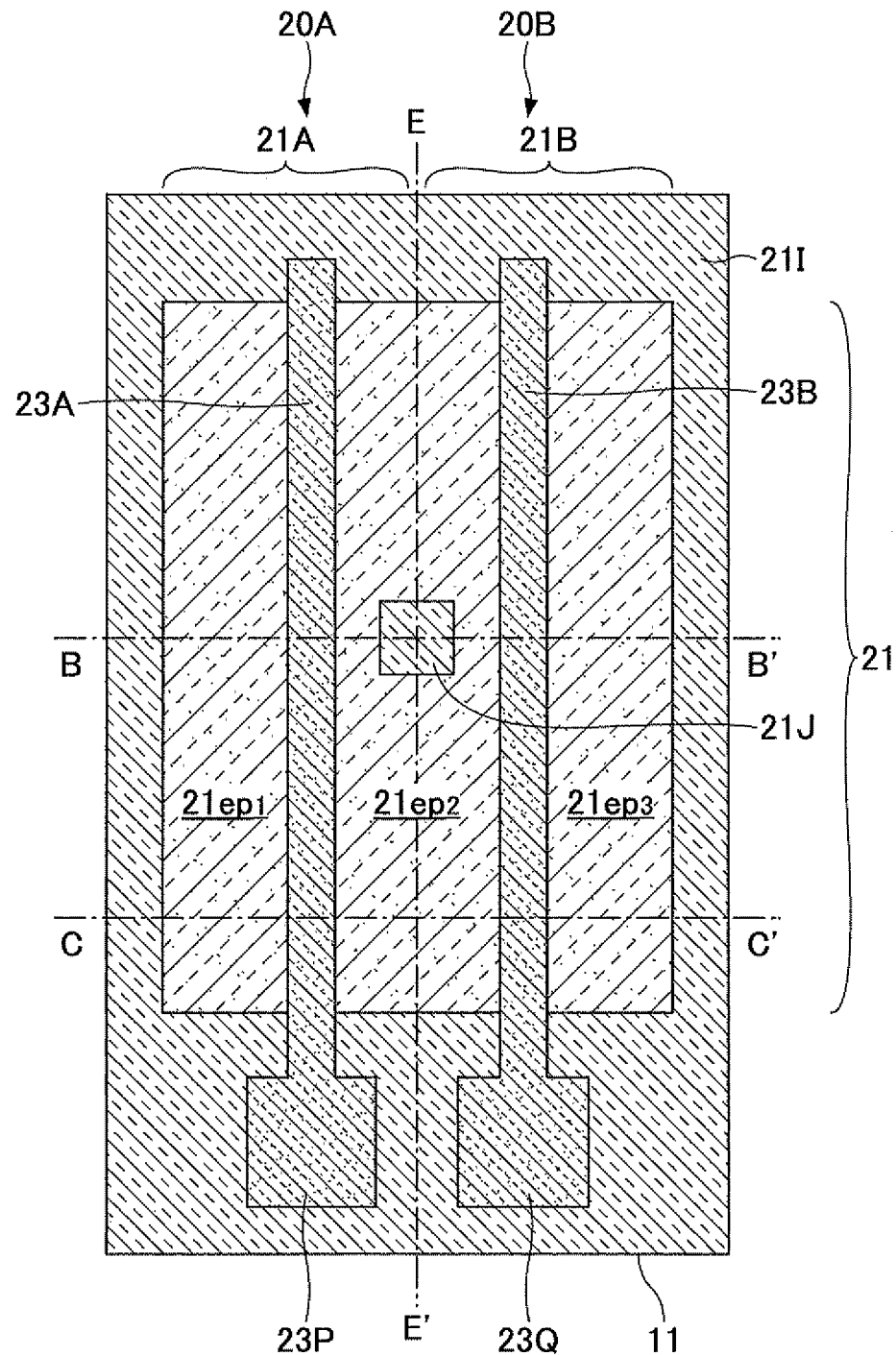
FIG. 14A is a top view illustrating a step of the manufacturing process of the semiconductor device according to the first embodiment.
Figure 14B:
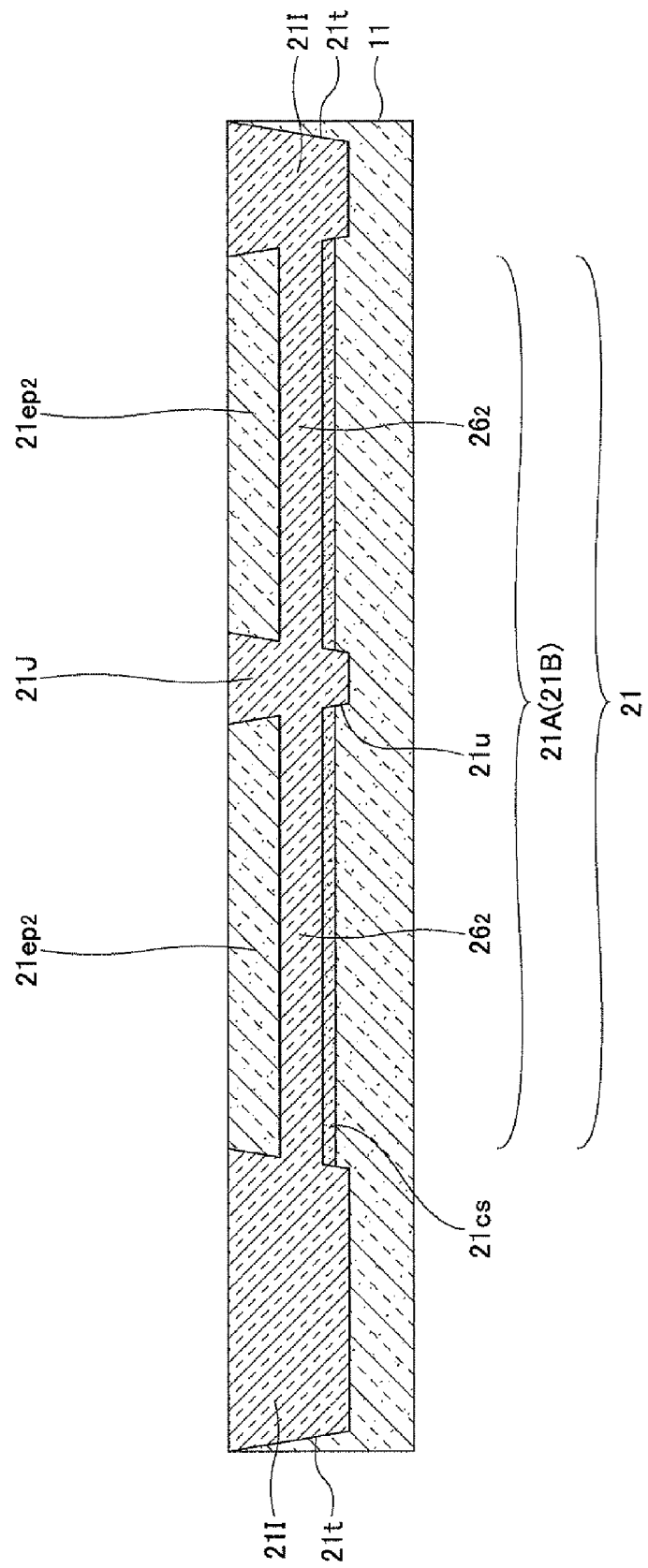
FIG. 14B is a cross-sectional view cut along the line E-E' in FIG. 14A.
Figure 14C:
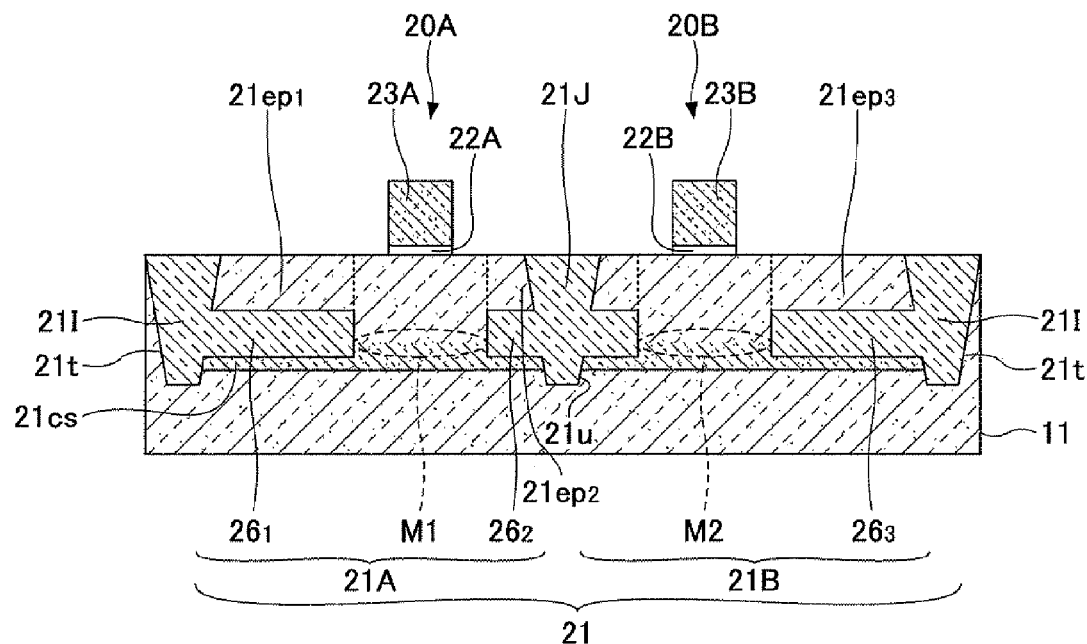
FIG. 14C is a cross-sectional view cut along the line B-B' in FIG. 14A.
Figure 14D:
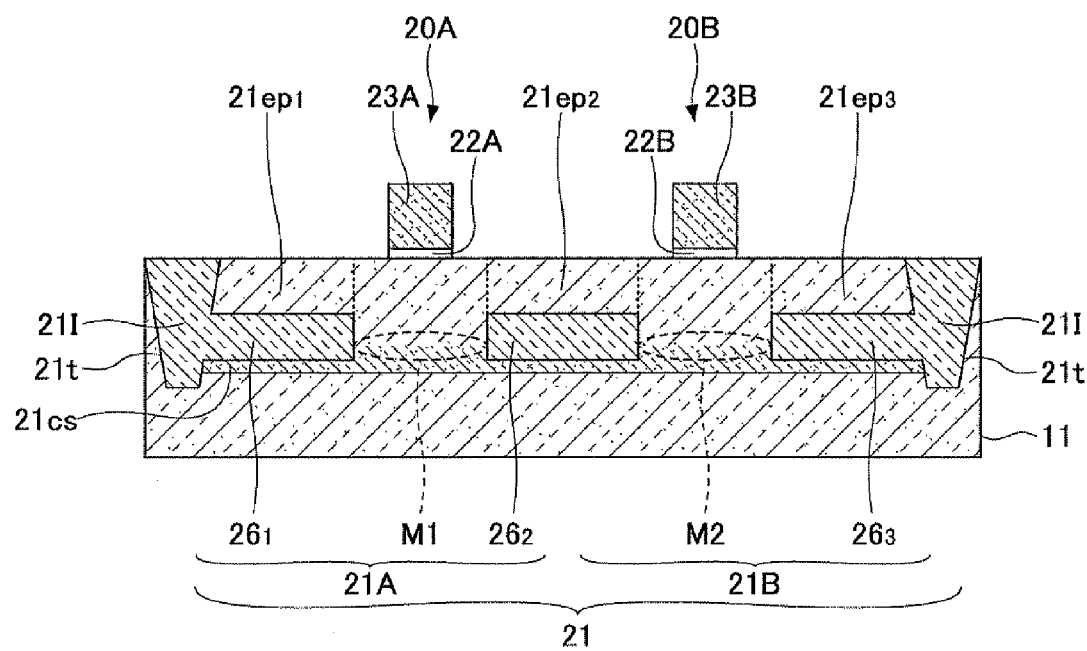
FIG. 14D is a cross-sectional view cut along the line C-C' in FIG. 14A.

FIGS. 14A through 14D illustrate a step of the manufacturing process of the semiconductor device 20 according to the first embodiment following the step of FIGS. 13A through 13D. Specifically, FIG. 14A is a top view corresponding to FIG. 13A. FIG. 14B is a cross-sectional view cut along the line E-E' in FIG. 14A. FIG. 14C is a cross-sectional view cut along the line B-B' in FIG. 14A. FIG. 14D is a cross-sectional view cut along the line C-C' in FIG. 14A.

As illustrated in FIG. 14A through 14D, in this step, the (first) dummy side wall isolation films 23da formed on the side wall surfaces of the first gate electrode 23A and the (second) dummy side wall isolation films 23db formed on the side wall surfaces of the second gate electrode 23A are removed.

As a result, on both left-hand and right-hand sides of the of the first gate electrode 23A, a surface of the mesa structure $M_1$ constituting a part of the p-type silicon substrate 11 and the surfaces of the silicon epitaxial layers $21ep_1$ and $21ep_2$ are continuously exposed. Similarly, on both left-hand and right-hand sides of the of the second gate electrode 23B, a surface of the mesa structure $M_2$ constituting a part of the p-type silicon substrate 11 and the surfaces of the silicon epitaxial layers $21ep_2$ and $21ep_3$ are continuously exposed.

Figure 15A:
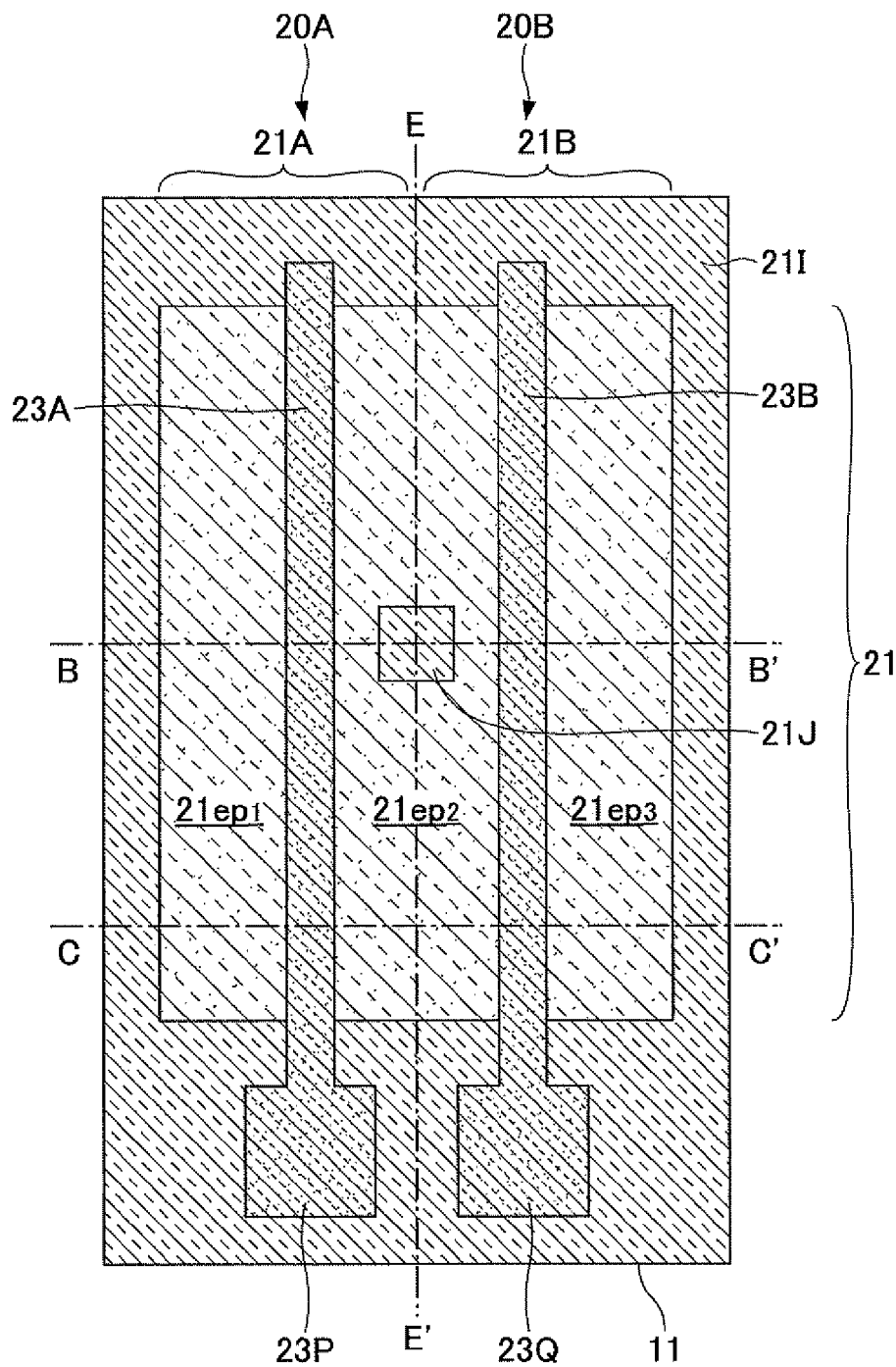
FIG. 15A is a top view illustrating a step of the manufacturing process of the semiconductor device according to the first embodiment.
Figure 15B:
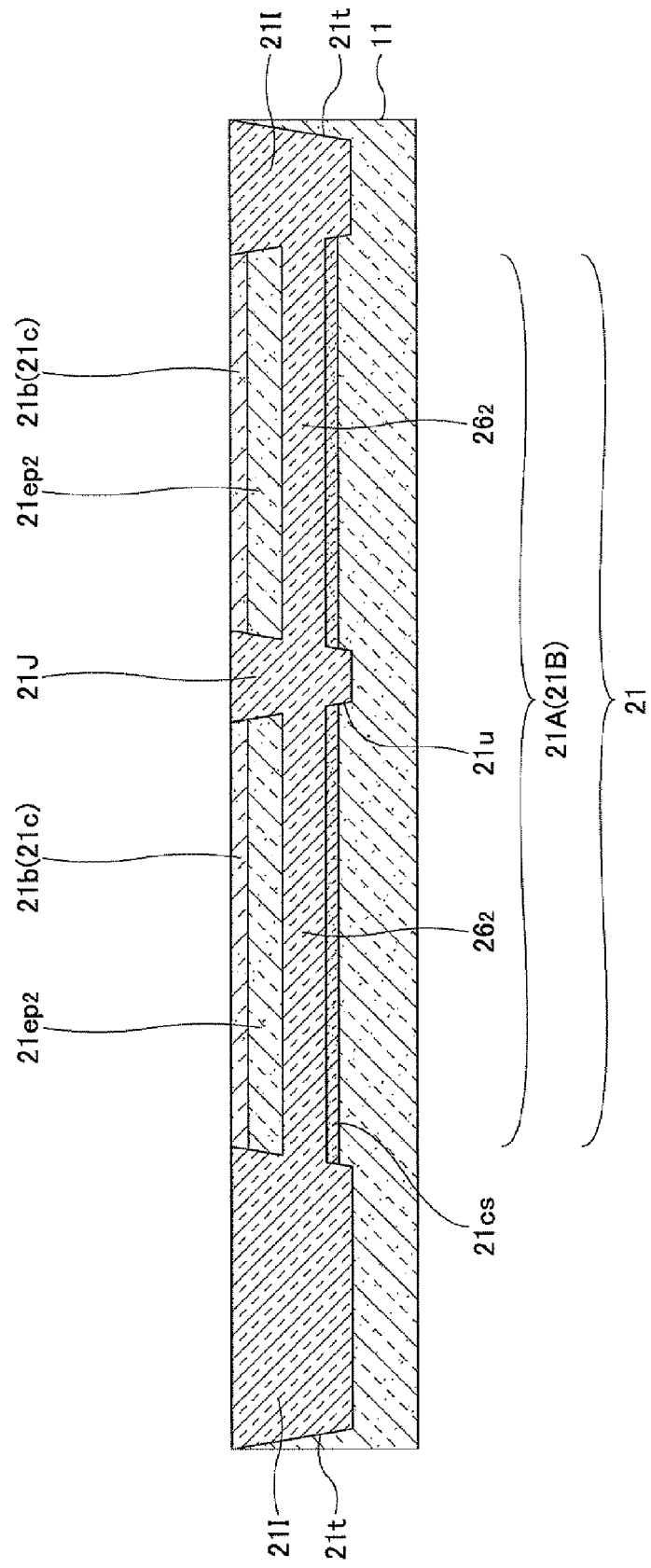
FIG. 15B is a cross-sectional view cut along the line E-E' in FIG. 15A.
Figure 15C:
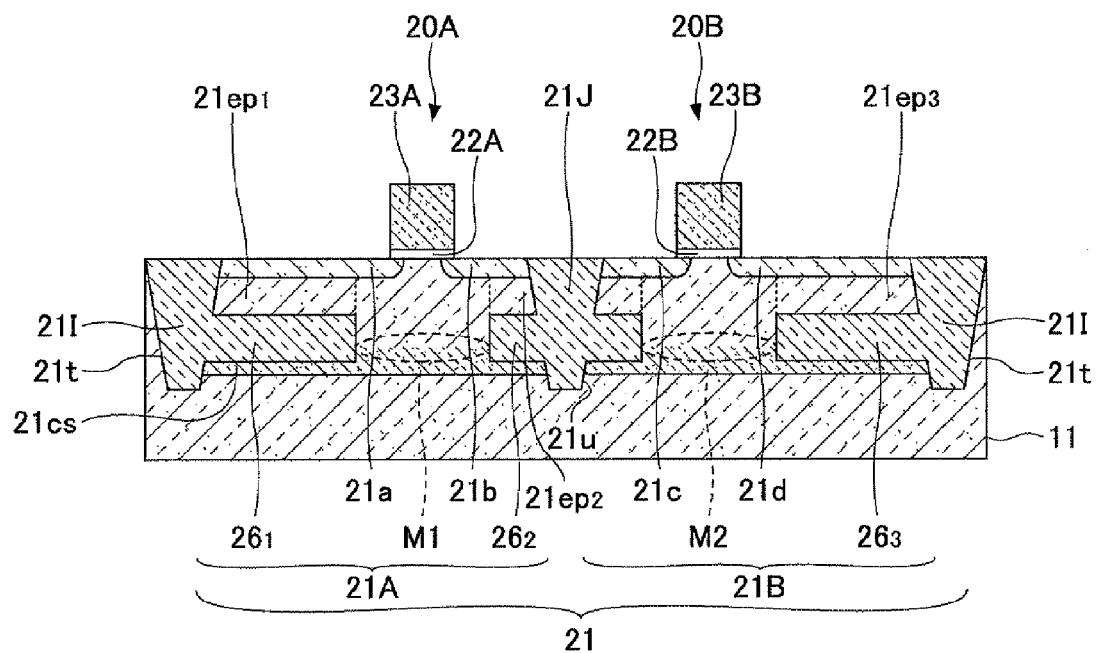
FIG. 15C is a cross-sectional view cut along the line B-B' in FIG. 15A.
Figure 15D:
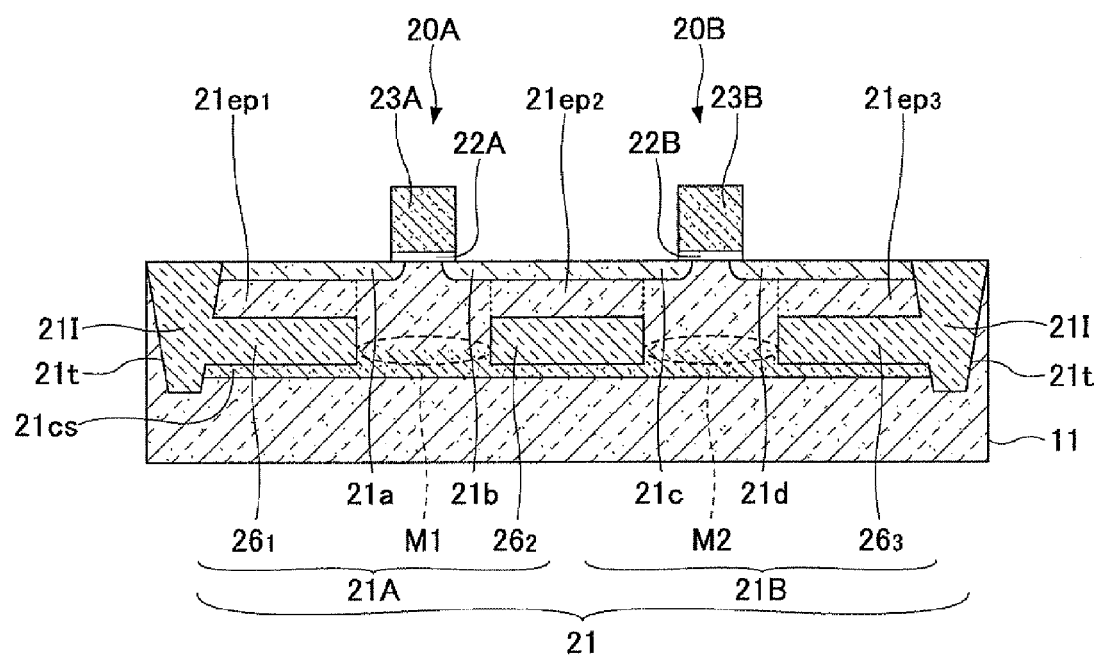
FIG. 15D is a cross-sectional view cut along the line C-C' in FIG. 15A.

FIGS. 15A through 15D illustrate a step of the manufacturing process of the semiconductor device 20 according to the first embodiment following the step of FIGS. 14A through 14D. Specifically, FIG. 15A is a top view corresponding to FIG. 14A. FIG. 15B is a cross-sectional view cut along the line E-E' in FIG. 15A. FIG. 15C is a cross-sectional view cut along the line B-B' in FIG. 15A. FIG. 15D is a cross-sectional view cut along the line C-C' in FIG. 15A.

As illustrated in FIG. 15A through 15D, in this step, by using the first gate electrode 23A and the second gate electrode 23B as a mask, n-type impurity elements such as arsenic (As) and phosphorus (P) are introduced into the surfaces of the mesa structures by the ion implantation method. By doing this, in the surface part of the first mesa structure $M_1$, an n-type source extension region $21a$ of the first MOS transistor 20A is formed on the left-hand side (i.e., the first side) of the first gate electrode 23A. Also, an n-type drain extension region $21b$ is formed on the right-hand side (i.e., the second side) of the first gate electrode 23A.

At the same time, in the surface part of the second mesa structure $M_2$, an n-type source extension region $21c$ of the second MOS transistor 20B is formed on the left-hand side (i.e., the first side) of the second gate electrode 23B. Also, an n-type drain extension region $21d\ a$ is formed on the right-hand side (i.e., the second side) of the second gate electrode 23B. Here, the n-type drain extension region $21b$ and the n-type source extension region $21c$ constitute (form) a single contiguous n-type diffusion region.

When the first MOS transistor 20A and the second MOS transistor 20B are n-channel MOS transistors, the source extension regions $21a$ and $21c$ and the source extension region $21b$ and $21d$ may be formed by the ion implantation method in which, for example, arsenic (As) is introduced at acceleration energy of 5 keV or less and with a doze amount in a range from $2 \times 10^{13}$ cm$^{-2}$ to $2 \times 10^{15}$ cm$^{-2}$.

Further, when the first MOS transistor 20A and the second MOS transistor 20B are p-channel MOS transistors, the p-type source extension regions $21a$ and $21c$ and the p-type drain extension region $21b$ and $21d$ may be formed by the ion implantation method in which, for example, Boron (B) is introduced at acceleration energy of 2 keV or less and with a doze amount in a range from $2 \times 10^{13}$ cm$^{-2}$ to $2 \times 10^{15}$ cm$^{-2}$.

Further, in step of FIGS. 15A through 15D, though it is not illustrated, when the ion implantation method is performed by obliquely introducing p-type impurity element such as boron (B) to the first device region part 21A and the second device region part 21B by using the first gate electrode 23A and the second gate electrode 23B as a mask, pocket regions may be formed.

When the first MOS transistor 20A and the second MOS transistor 20B are p-channel MOS transistors, such ion implantation may be performed by, for example, Boron (B) is introduced at acceleration energy of 20 keV or less and with a doze amount of $5 \times 10^{13}$ cm$^{-2}$ or less.

Further, when the first MOS transistor 20A and the second MOS transistor 20B are n-channel MOS transistors, such ion implantation may be performed by, for example, arsenic (As) is introduced at acceleration energy of 100 keV or less and with a doze amount of $5 \times 10^{13}$ cm$^{-2}$ or less.

Figure 16A:
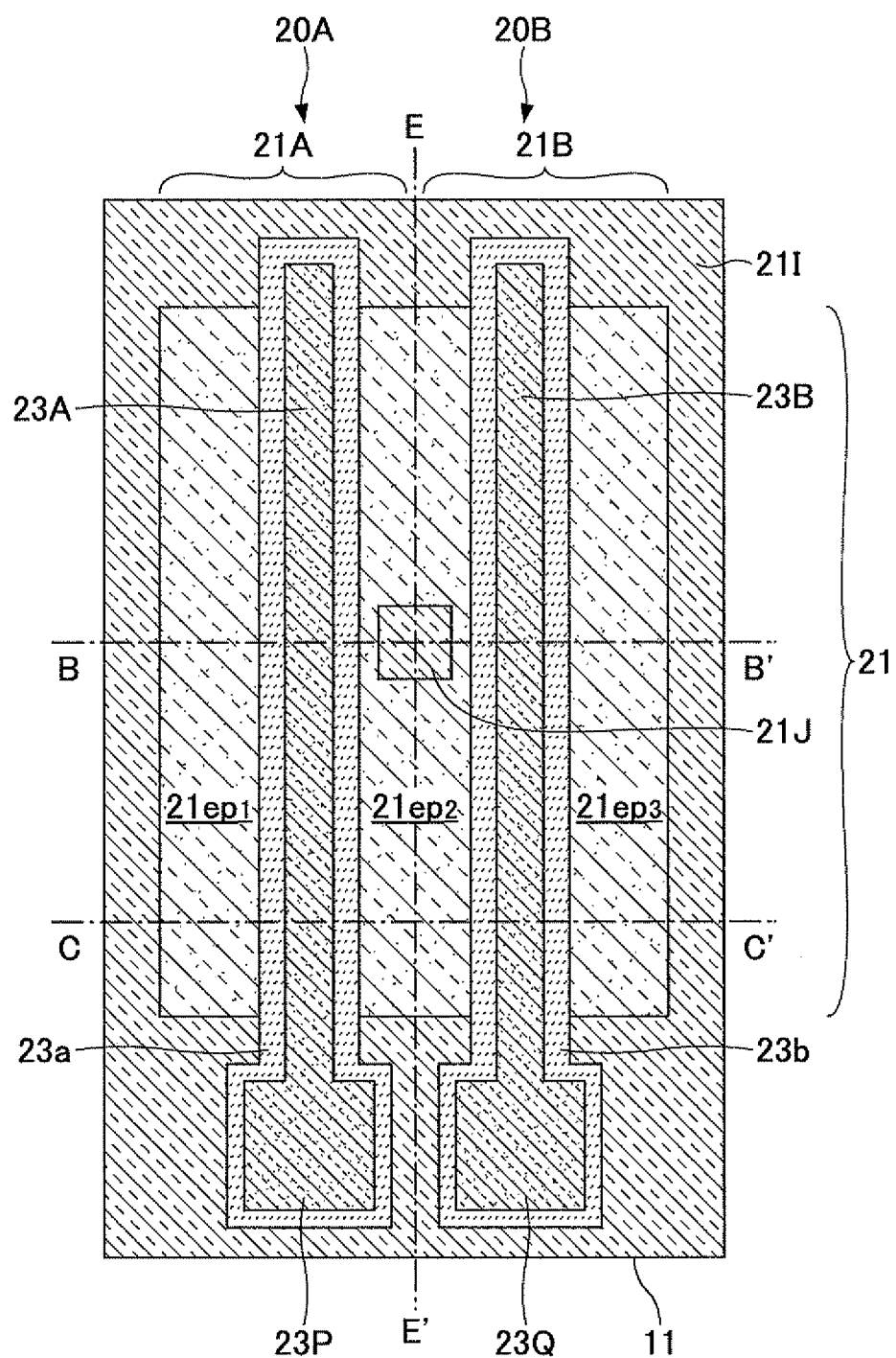
FIG. 16A is a top view illustrating a step of the manufacturing process of the semiconductor device according to the first embodiment.
Figure 16B:
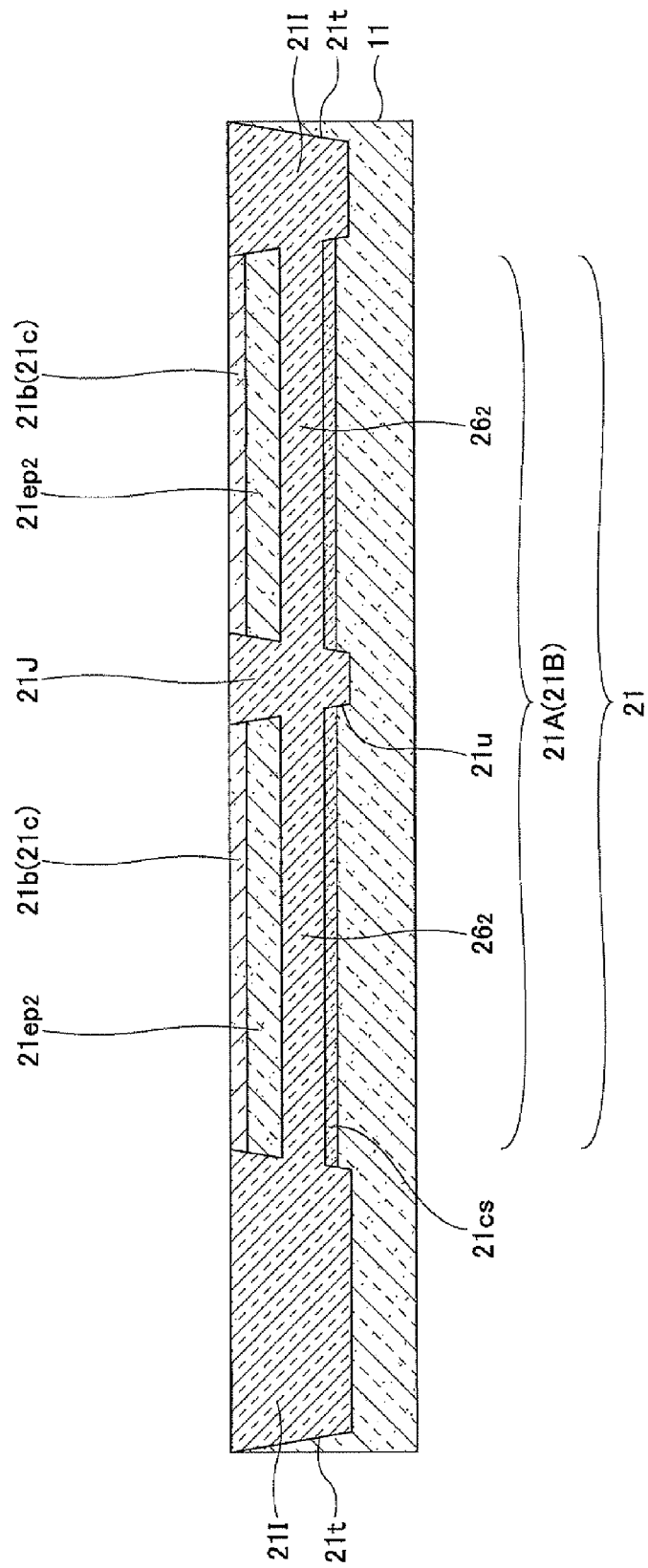
FIG. 16B is a cross-sectional view cut along the line E-E' in FIG. 16A.
Figure 16C:
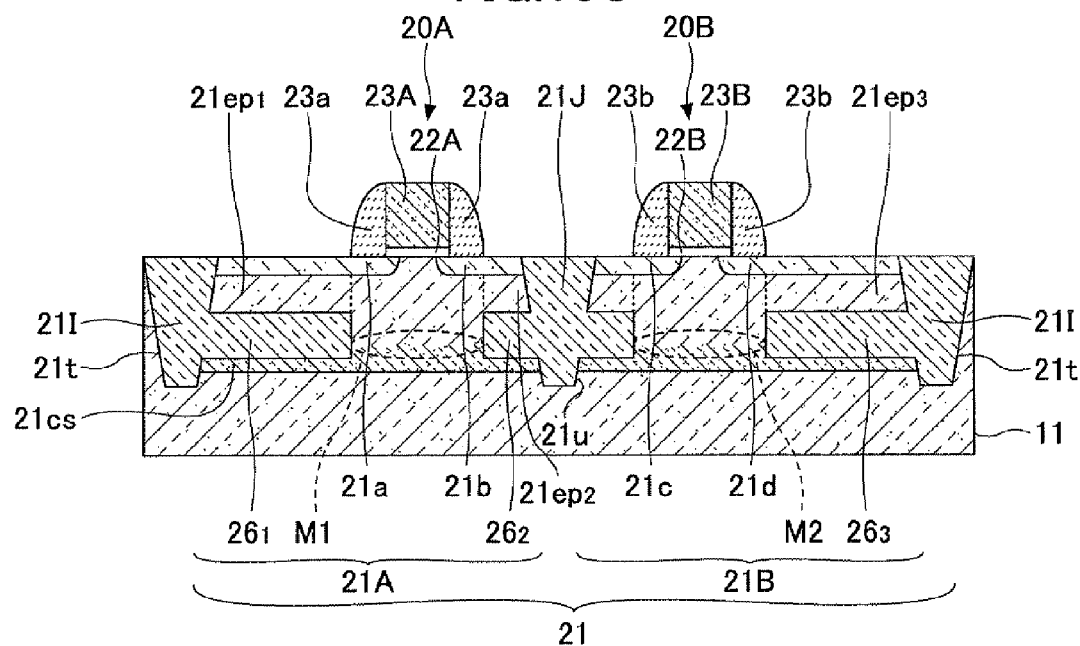
FIG. 16C is a cross-sectional view cut along the line B-B' in FIG. 16A.
Figure 16D:
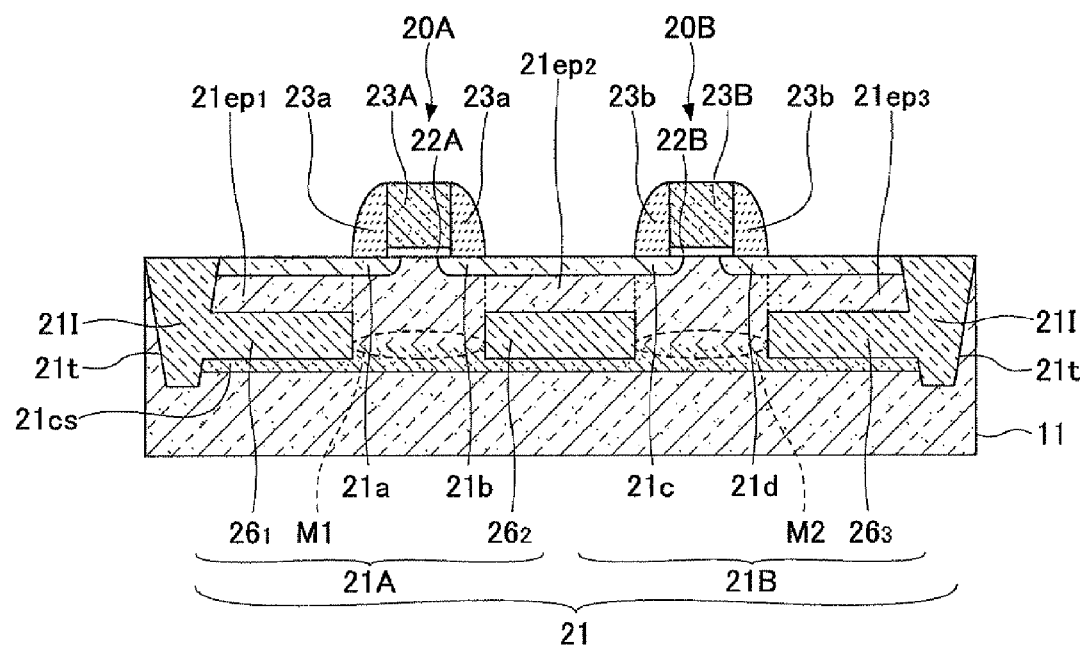
FIG. 16D is a cross-sectional view cut along the line C-C' in FIG. 16A.

FIGS. 16A through 16D illustrate a step of the manufacturing process of the semiconductor device 20 according to the first embodiment following the step of FIGS. 15A through 15D. Specifically, FIG. 16A is a top view corresponding to FIG. 15A. FIG. 16B is a cross-sectional view cut along the line E-E' in FIG. 16A. FIG. 16C is a cross-sectional view cut along the line B-B' in FIG. 16A. FIG. 16D is a cross-sectional view cut along the line C-C' in FIG. 16A.

As illustrated in FIG. 16A through 16D, in this step, similar to the side wall isolation films 23da and the side wall isolation films 23db, a pair of side wall isolation films 23a and a pair of side wall isolation films 23b formed of, for example, a silicone nitride film (SiN), a silicon oxynitride film (SiON), or a silicon oxide film (SiO$_2$) are formed on both the first side and the second side walls of the first gate electrode 23A and the second gate electrode 23B, respectively, the first side being the sides opposite to the second side.

As described above, similar to the side wall isolation films 23da and 23db, by forming the side wall isolation films 23a and the side wall isolation films 23b again, it may become possible to update (replace) the dummy side wall isolation films 23da and 23db which may have been exhausted because of being used as a mask in the etching of the trenches 21TA through 21TC and further being used as a mask to protect side wall surfaces of the first gate electrode 23A and the second gate electrode 23B in step of FIGS. 13A through 13D.

Figure 17A:
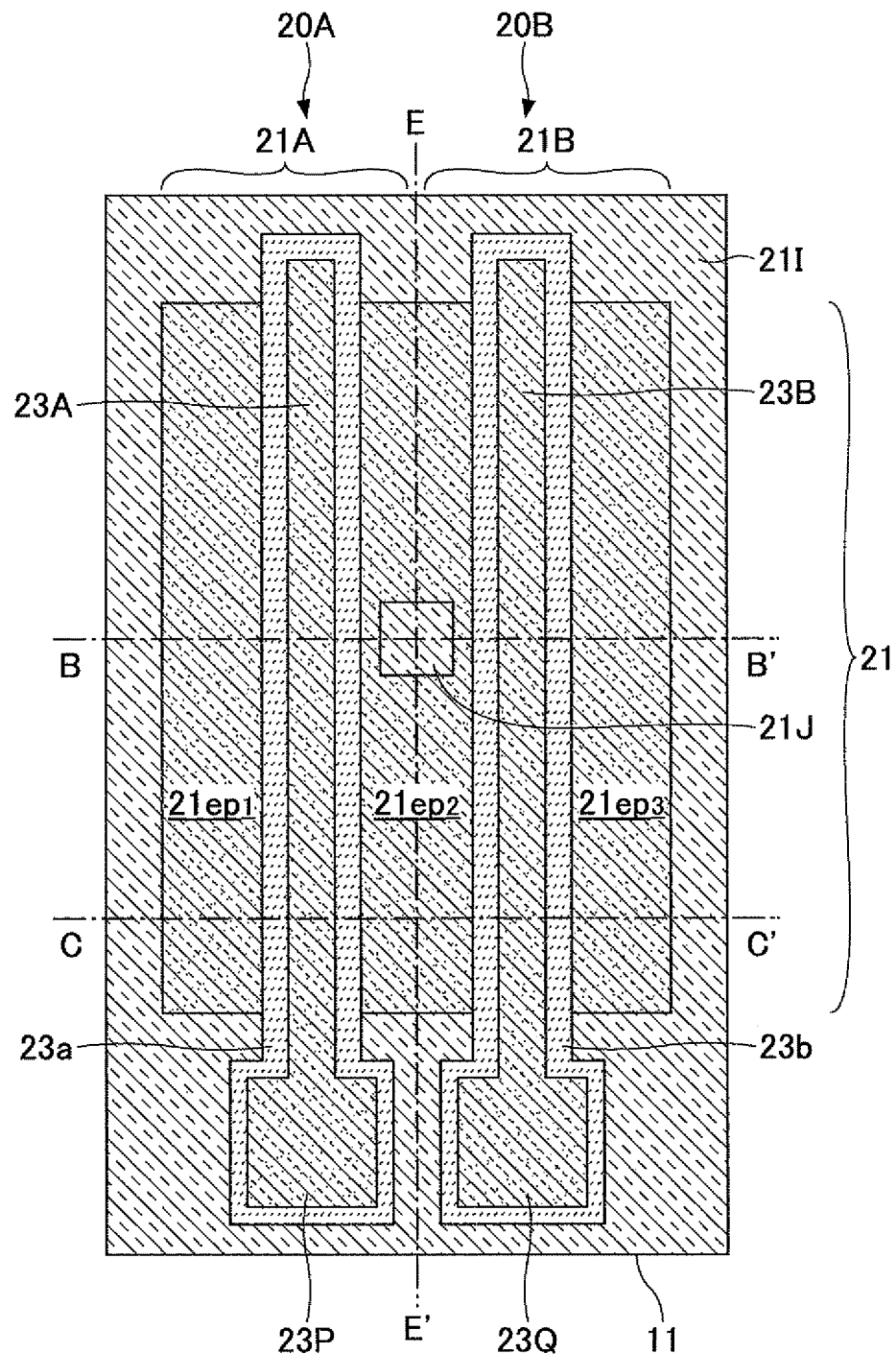
FIG. 17A is a top view illustrating a step of the manufacturing process of the semiconductor device according to the first embodiment.
Figure 17C:
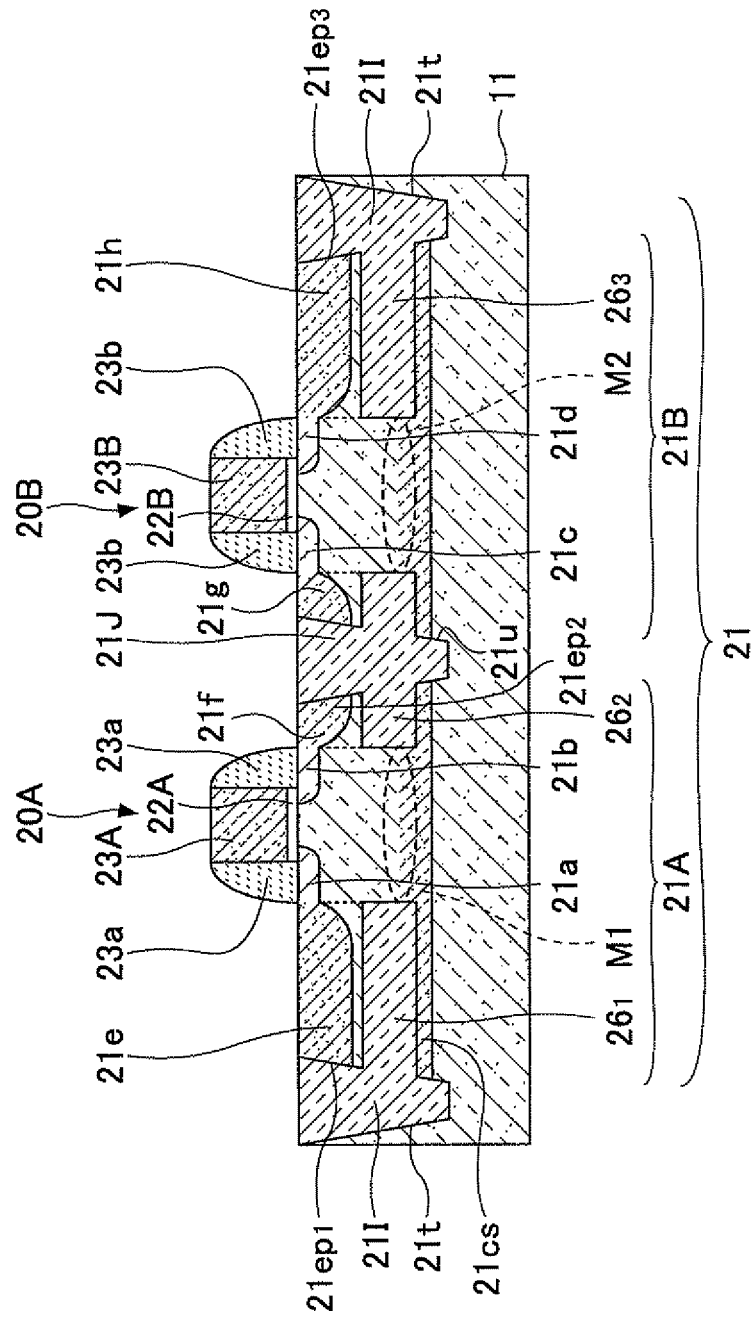
FIG. 17C is a cross-sectional view cut along the line B-B' in FIG. 17A.
Figure 17D:
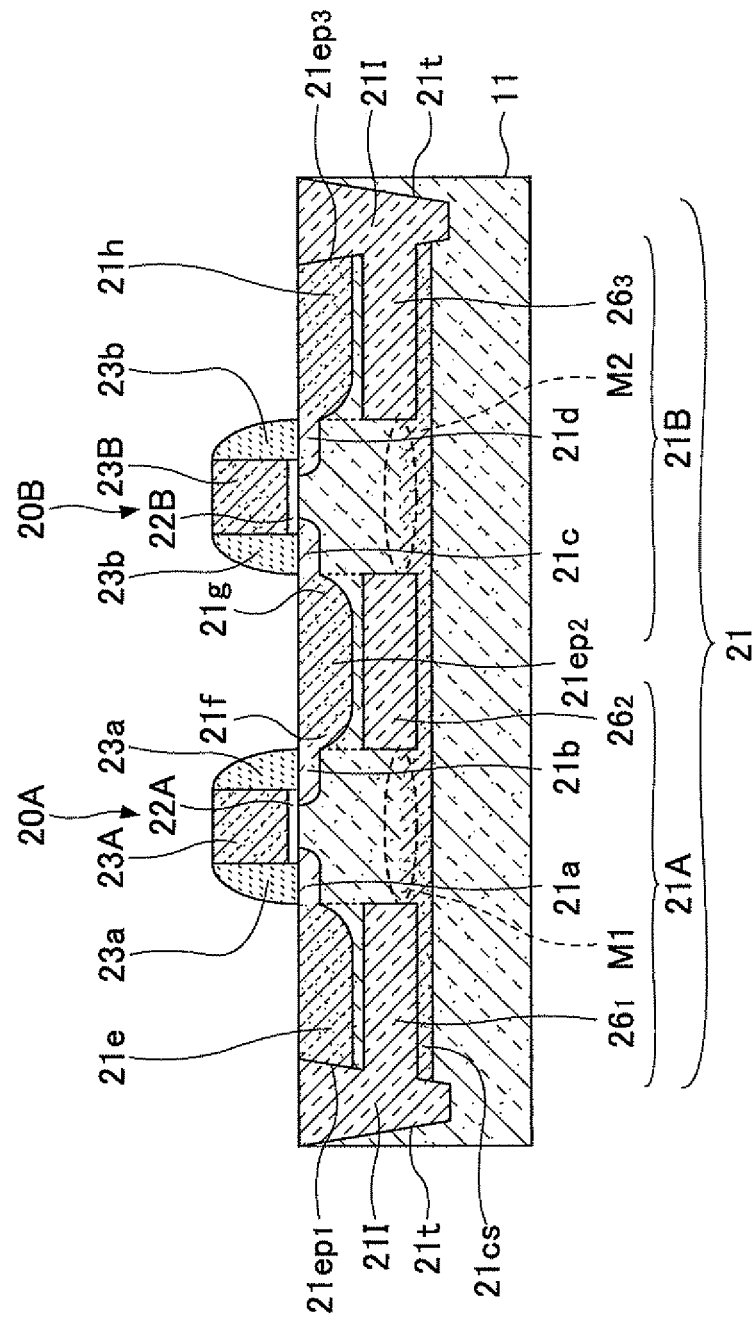
FIG. 17D is a cross-sectional view cut along the line C-C' in FIG. 17A.

FIGS. 17A through 17D illustrate a step of the manufacturing process of the semiconductor device 20 according to the first embodiment following the step of FIGS. 16A through 16D. Specifically, FIG. 17A is a top view corresponding to FIG. 16A. FIG. 17B is a cross-sectional view cut along the line E-E' in FIG. 17A. FIG. 17C is a cross-sectional view cut along the line B-B' in FIG. 17A. FIG. 17D is a cross-sectional view cut along the line C-C' in FIG. 17A.

As illustrated in FIG. 17A through 17D, in this step, by using the first gate electrode 23A and the second gate electrode 23B and the side wall isolation films 23a and the side wall isolation films 23b as masks, an n-type impurity element is introduced again by the ion implantation, so that in the silicon epitaxial layers $21ep_1$ and $21ep_2$, on the outside of the side wall isolation films 23a when viewed from the first gate electrode 23A, an n+ type source regions 21e and an n+ type drain region 21f are formed so as to be deeper than the n-type source extension regions 21a and the n-type drain extension region 21b, respectively, and having higher impurity concentration (than the n-type source extension regions 21a and the n-type drain extension region 21b).

Further, at the same time, in the silicon epitaxial layers $21ep_2$ and $21ep_3$, on the outside of the side wall isolation films 23b when viewed from the second gate electrode 23B, an n+ type source regions 21g and an n+ type drain region 21h are formed so as to be deeper than the n-type source extension regions 21c and the n-type drain extension region 21d, respectively, and having higher impurity concentration (than the n-type source extension regions 21c and the n-type drain extension region 21d). Further, in this step, the first gate electrode 23A and the second gate electrode 23B formed of poly silicon are n+ type doped.

When the first MOS transistor 20A and the second MOS transistor 20B are n-channel MOS transistors, the n+ type source regions 21e and 21g and the n+ type drain regions 21f and 21h may be formed by the ion implantation method in which, for example, arsenic (As) is introduced at acceleration energy of 5 keV or less and with a doze amount in a range from $2\times10^{14}$ cm$^{-2}$ to $2\times10^{16}$ cm$^{-2}$.

Further, when the first MOS transistor 20A and the second MOS transistor 20B are p-channel MOS transistors, the p+ type source regions 21e and 21g and the p+ type drain regions 21f and 21h may be formed by the ion implantation method in which, for example, Boron (B) is introduced at acceleration energy of 7 keV or less and with a doze amount in a range from $2\times10^{14}$ cm$^{-2}$ to $2\times10^{16}$ cm$^{-2}$.

As illustrated in FIG. 17D, the n+ type drain region 21f and the n+ type source region 21g constitute (form) a single contiguous (the same) diffusion region.

Figure 18A:
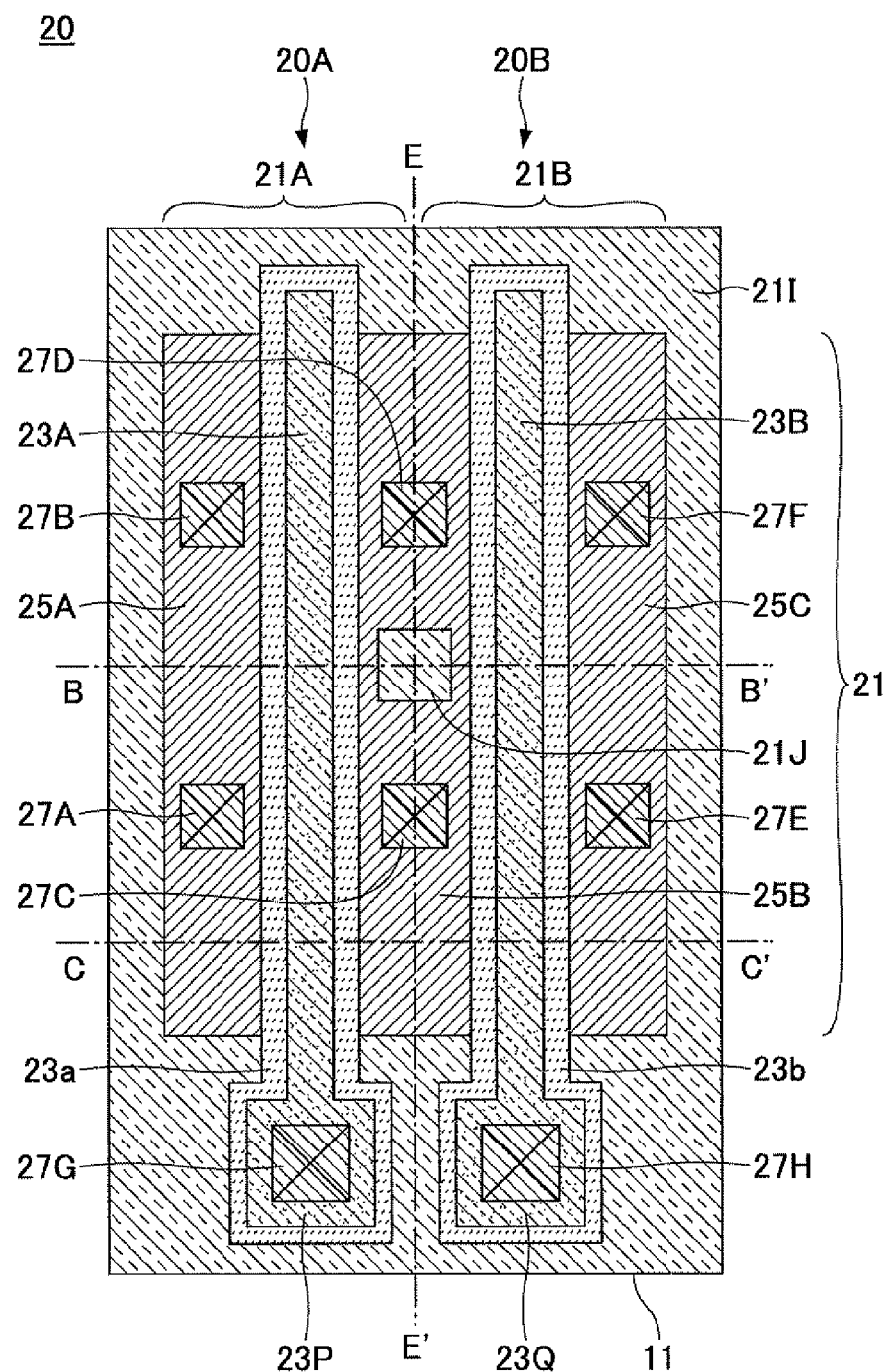
FIG. 18A is a top view illustrating a step of the manufacturing process of the semiconductor device according to the first embodiment.
Figure 18C:
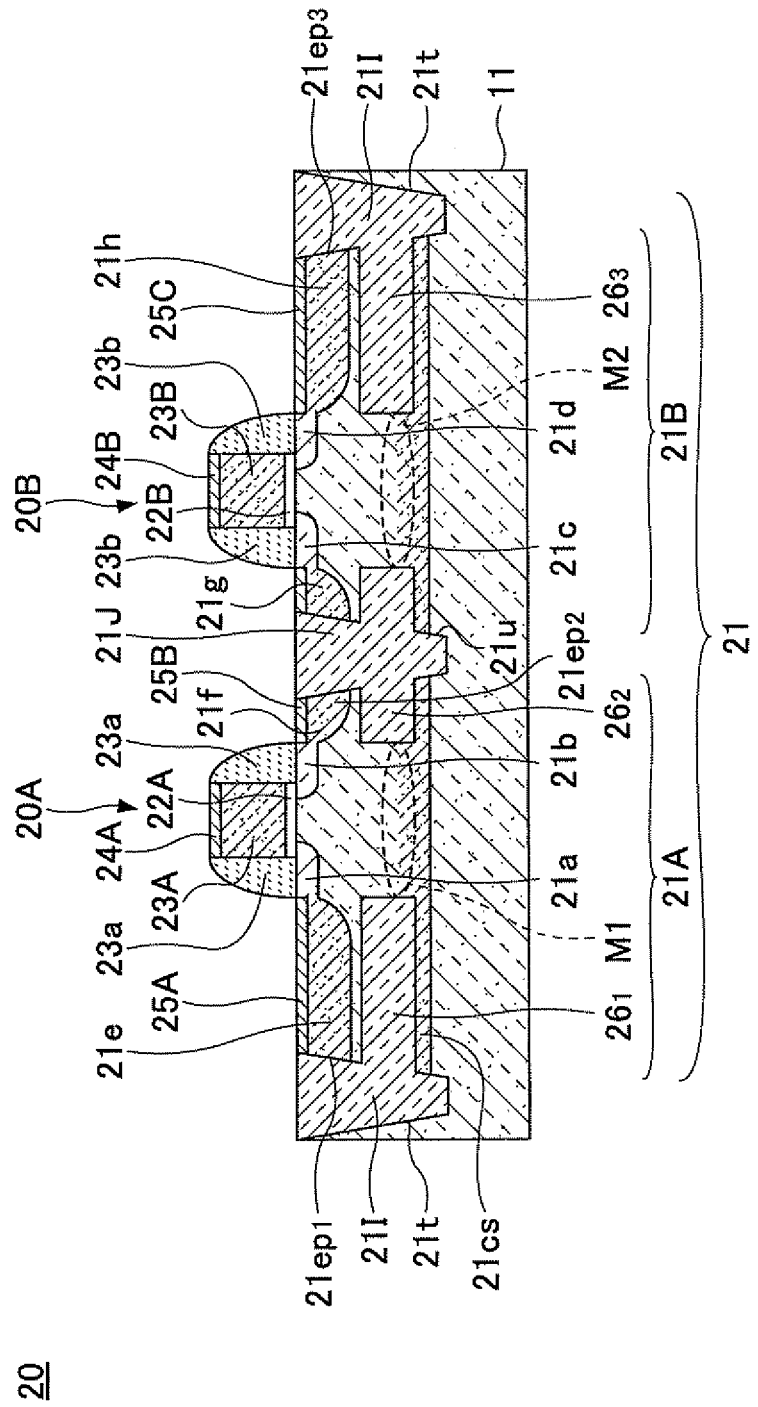
FIG. 18C is a cross-sectional view cut along the line B-B' in FIG. 18A.
Figure 18D:
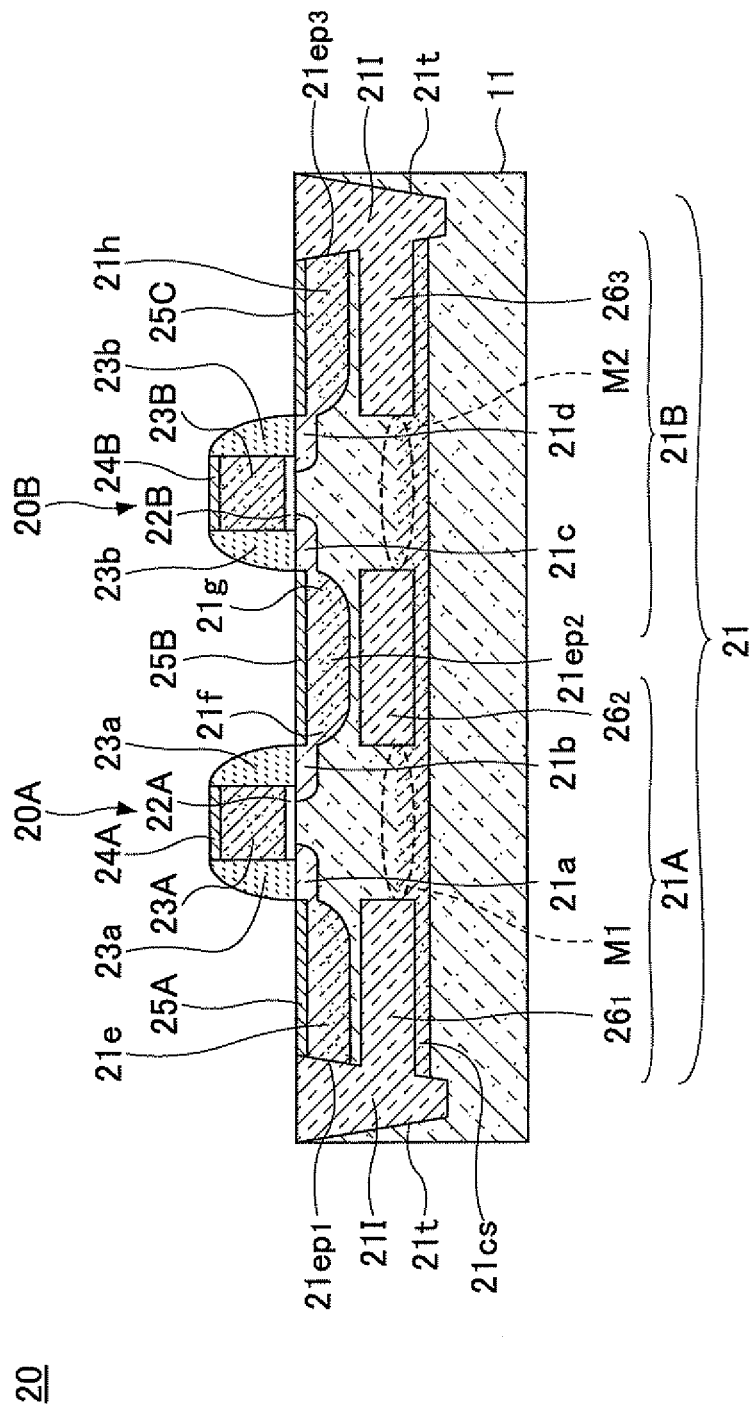
FIG. 18D is a cross-sectional view cut along the line C-C' in FIG. 18A.

FIGS. 18A through 18D illustrate a step of the manufacturing process of the semiconductor device 20 according to the first embodiment following the step of FIGS. 17A through 17D. Specifically, FIG. 18A is a top view corresponding to FIG. 17A. FIG. 18B is a cross-sectional view cut along the line E-E' in FIG. 18A. FIG. 18C is a cross-sectional view cut along the line B-B' in FIG. 18A. FIG. 18D is a cross-sectional view cut along the line C-C' in FIG. 18A.

As illustrated in FIG. 18A through 18D, in this step, a silicide layer is formed on the exposed silicon surface of the structure of FIGS. 17A through 17D using a salicide (silicide) method. As a result, silicide layers 25A, 25B, and 15C are formed on the surfaces of the silicon epitaxial layers $21ep_1$, $21ep_2$, and $21ep_3$, respectively. Also, silicide layers 24A and 24B are formed on the surfaces of the first polysilicon gate electrode 23A and the second polysilicon gate electrode 23B, respectively.

After the step of FIGS. 18A through 18D, the isolation film 27 is formed on the silicon substrate 11, and the via plugs 27A through 27H are formed in the isolation film 27, so as to form the semiconductor device 20 described with reference to FIGS. 1A through 1D.

As described above, according to this embodiment, in a case where the Si—Ge mixed layer regions $SG_1$ through $SG_3$ are selectively etched, by forming the isolation film region 21J (in advance), it may become possible to etch the Si—Ge mixed layer regions $SG_2$ by using the second trench 21u. As a result, it may become possible to effectively etch the Si—Ge mixed layer regions $SG_1$ through $SG_3$. Further, in step of FIGS. 12A through 12D, it may become possible to improve the efficiency in filling the voids $21V_1$ through $21V_3$ with the embedded isolation films $26_1$, $26_2$, and $26_3$.

In the semiconductor device 20 having been formed as described above, in each of the first MOS transistor 20A and the second MOS transistor 20B, the first channel region 21Cha and the second channel region 21Chb are formed in the mesa structures $M_1$ and $M_2$, respectively, which are originally a part of the silicon substrate 11 having higher quality, and which are not formed based on any of the silicon epitaxial layers $21ep_1$, $21ep_2$, and $21ep_3$ which are grown later. Therefore, it may become possible to form the semiconductor (channel) regions having higher crystal quality and prevent carriers from being scattered or extinguished due to a defect or an impurity element.

Second Embodiment

Figure 21A:
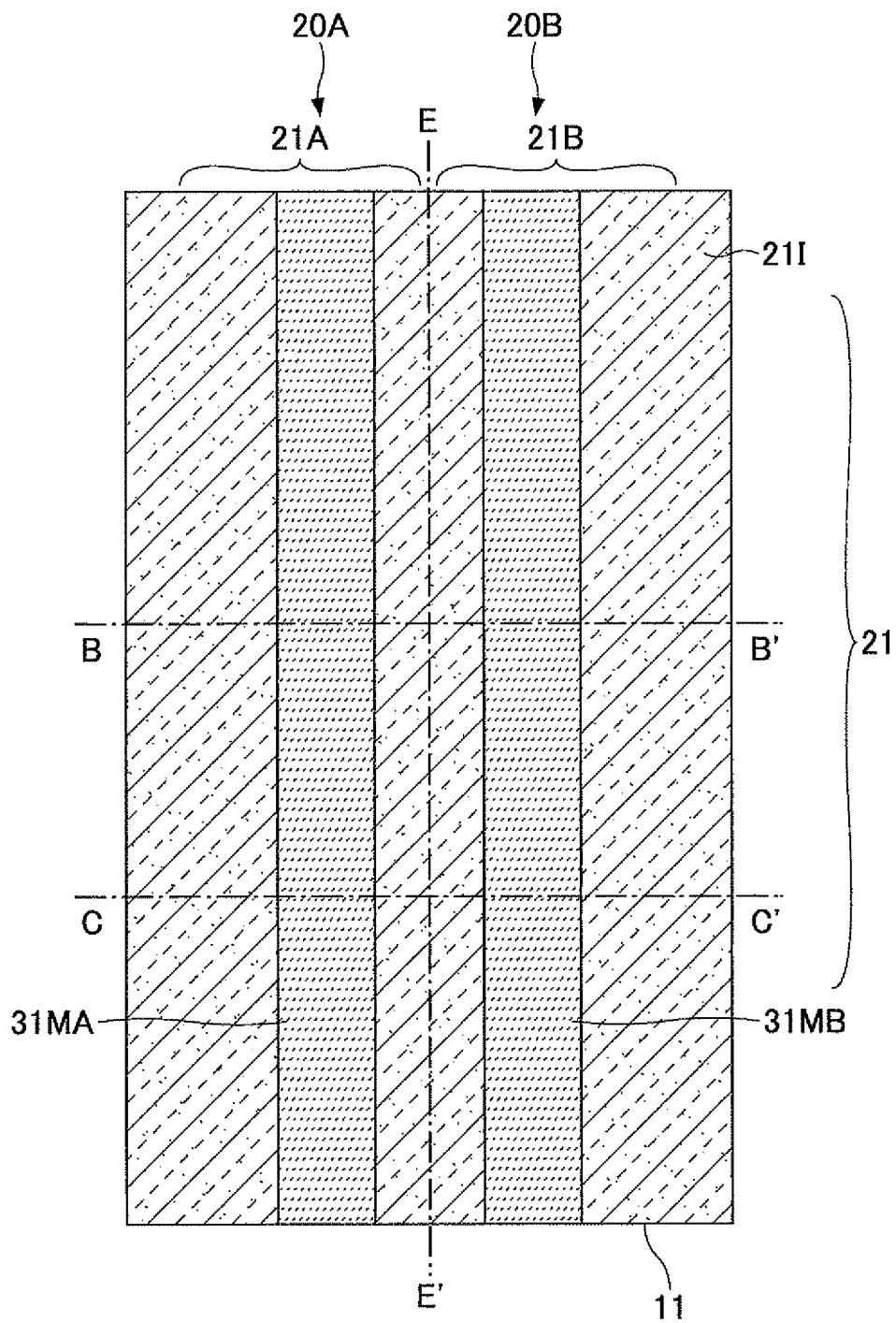
FIG. 21A is a top view illustrating a step of a manufacturing process of the semiconductor device according to a second embodiment.
Figure 21C:
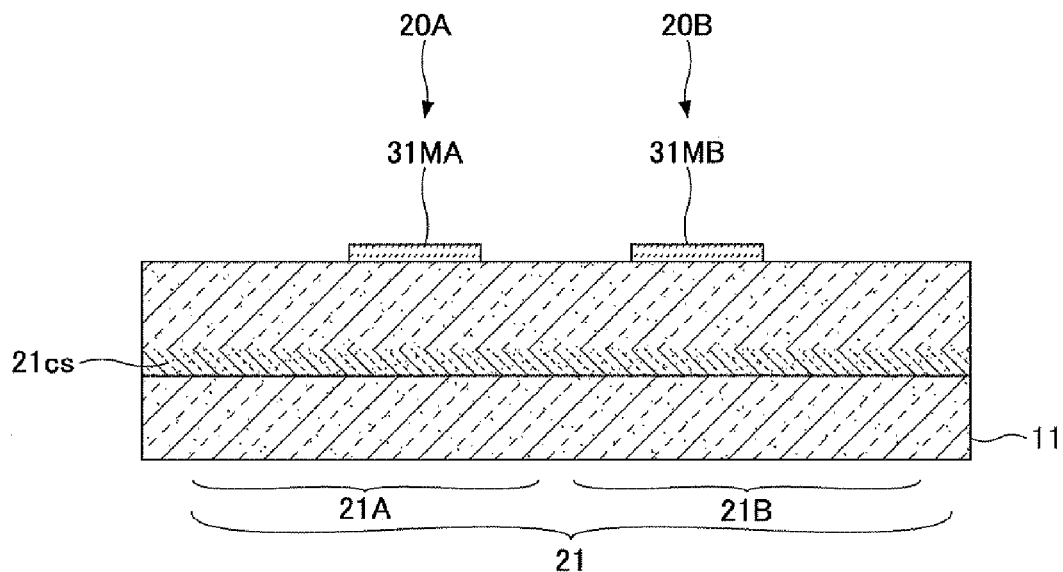
FIG. 21C is a cross-sectional view cut along the line B-B' in FIG. 21A.
Figure 21D:
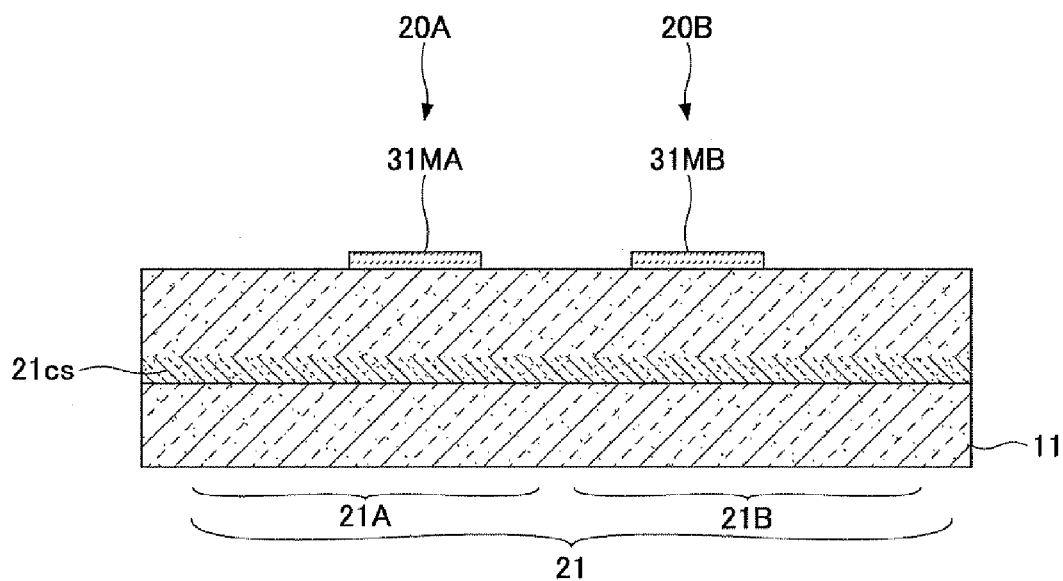
FIG. 21D is a cross-sectional view cut along the line C-C' in FIG. 21A.

Next, an example method of forming (manufacturing) a semiconductor device according to a second embodiment of the present invention is described with reference to FIGS. 21A through 27D. FIG. 21A is a top view. FIG. 21B is a cross-sectional view cut along the line E-E' in FIG. 21A. FIG. 21C is a cross-sectional view cut along the line B-B' in FIG. 21A. FIG. 21D is a cross-sectional view cut along the line C-C' in FIG. 21A.

As illustrated in FIGS. 21A through 21D, none of the device isolation region 21I, the device region 21, the first device region part 21A, the second device region part 21B and the like are formed on the silicon substrate 11. However, after the ion implantation is performed to form the channel stopper region 21cs, stripe-shaped mask patterns 31MA and 31MB which are parallel to the boundary between the first device region part 21A and the second device region part 21B are formed in a region to be the first device region part 21A and the second device region part 21B of the silicon substrate 11 afterwards by using a silicon oxide film (SiO2), a silicone nitride film (SiN) or the like.

Figure 22A:
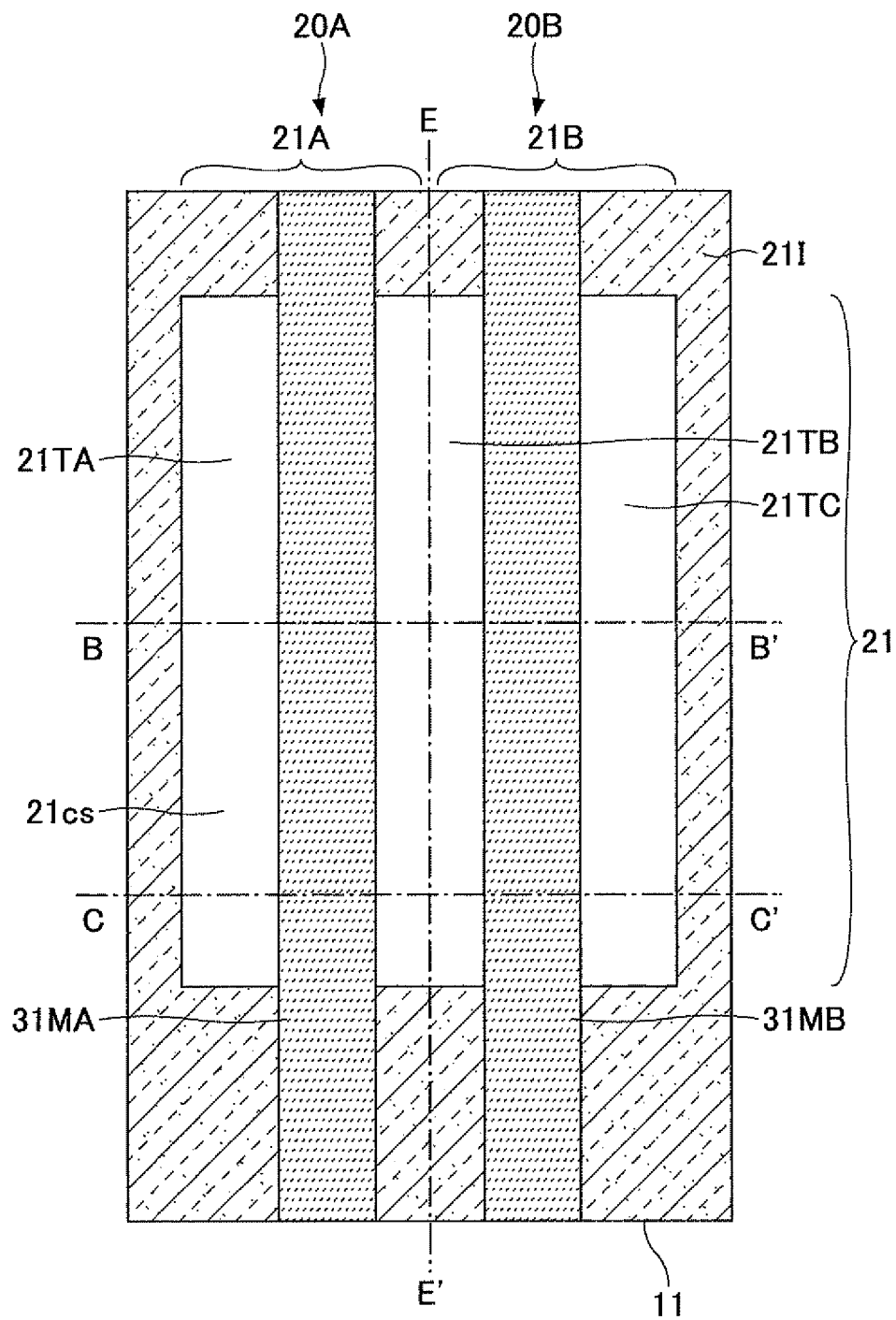
FIG. 22A is a top view illustrating a step of the manufacturing process of the semiconductor device according to the second embodiment.
Figure 22B:
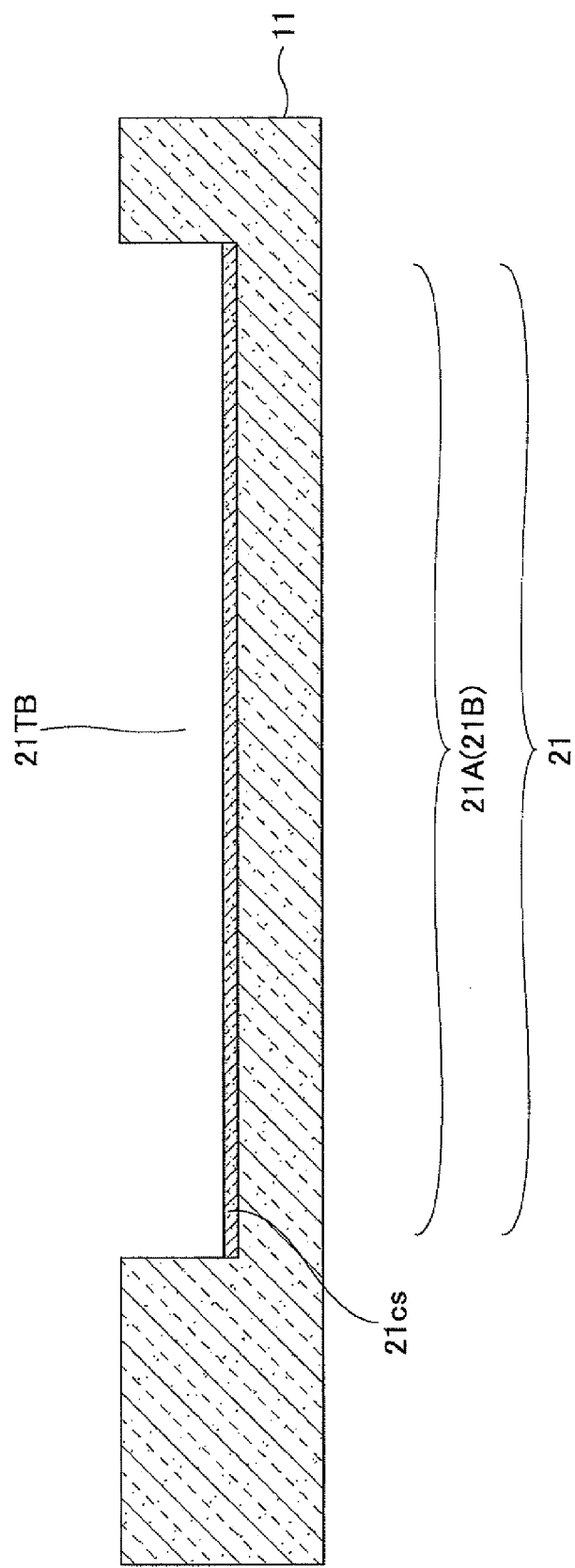
FIG. 22B is a cross-sectional view cut along the line E-E' in FIG. 22A.
Figure 22C:
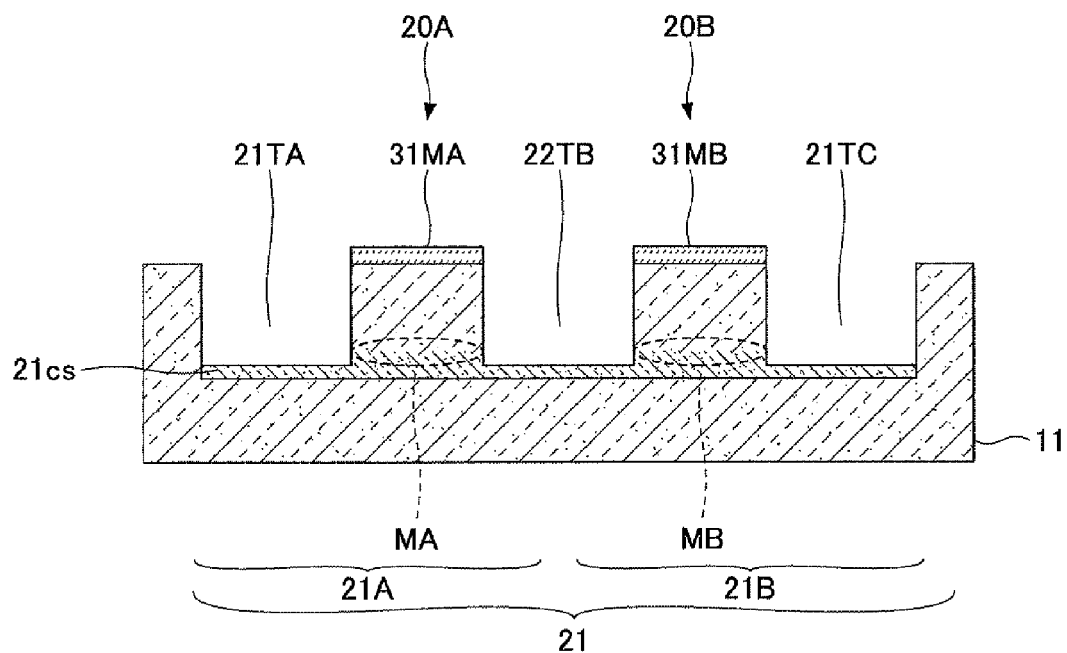
FIG. 22C is a cross-sectional view cut along the line B-B' in FIG. 22A.
Figure 22D:
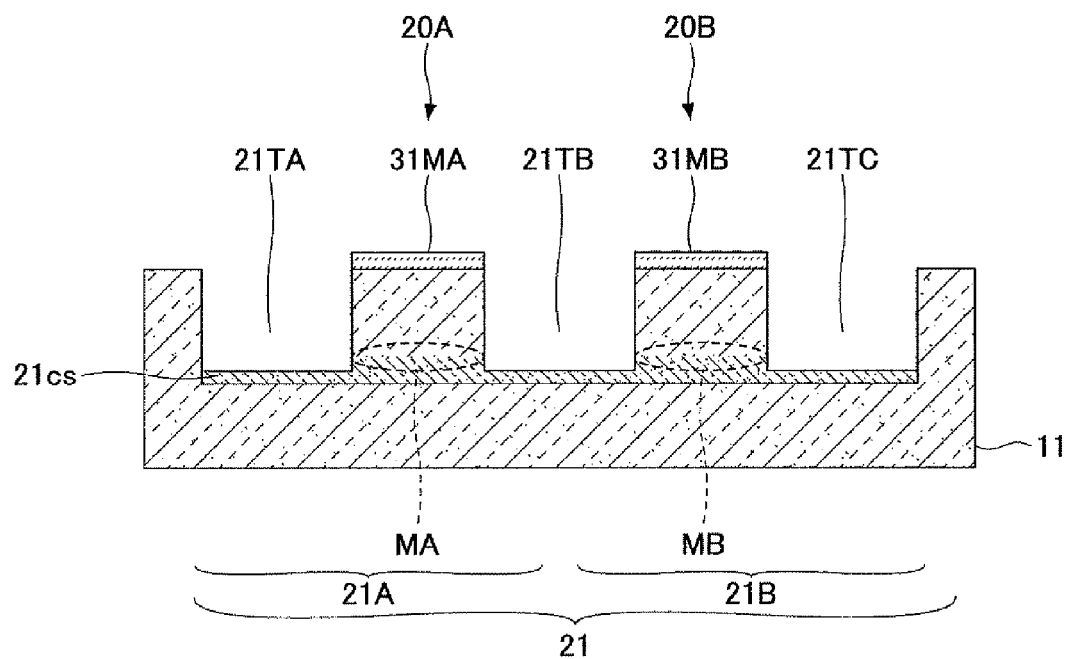
FIG. 22D is a cross-sectional view cut along the line C-C' in FIG. 22A.

FIGS. 22A through 22D illustrate a step of a manufacturing process of the semiconductor device 20 according to the second embodiment following the step of FIGS. 21A through 21D. Specifically, FIG. 22A is a top view corresponding to FIG. 21A. FIG. 22B is a cross-sectional view cut along the line E-E' in FIG. 22A. FIG. 22C is a cross-sectional view cut along the line B-B' in FIG. 22A. FIG. 22D is a cross-sectional view cut along the line C-C' in FIG. 22A.

As illustrated in FIG. 22A through 22D, in this step, the silicon substrate 11 is etched by dry etching using the mask patterns 31MA and 31MB as masks and using chlorine gas ($Cl_2$) or hydrochloric gas (HCl) as etching gas. As a result of the etching, a first trench 21TA is formed on the first side (i.e., on the left-hand side) of the mask pattern 31MA. A second trench 21TB is formed on the second side (i.e., on the right-hand side) of the mask pattern 31MA and on the first side (i.e., on the left-hand side) of the mask pattern 31MB. Further, a third trench 21TC are formed on the second side (i.e., on the right-hand side) of the mask pattern 31MB.

Preferably, those trenches 21TA, 21TB, and 21TC are formed so as to extend to (reach) the channel stopper region 21cs. In the example of FIGS. 22A through 22D, it may appear that the trenches 21TA, 21TB, and 21TC do not extend to (reach) the channel stopper region 21cs. However, it is not always necessary that the trenches 21TA, 21TB, and 21TC do not exceed the channel stopper region 21cs. Namely, for example, the trenches 21TA, 21TB, and 21TC may be formed so as to extend deeper than (i.e., exceed) the channel stopper region 21cs.

After a result of forming the trenches 21TA, 21TB, and 21TC, on the silicon substrate 11, a mesa structure MA corresponding to the first device region part 21A is formed between the trench 21TA and the trench 21TB, and a mesa structure MB corresponding to the second device region part 21B is formed between the trench 21TB and the trench 21TC.

Figure 23A:
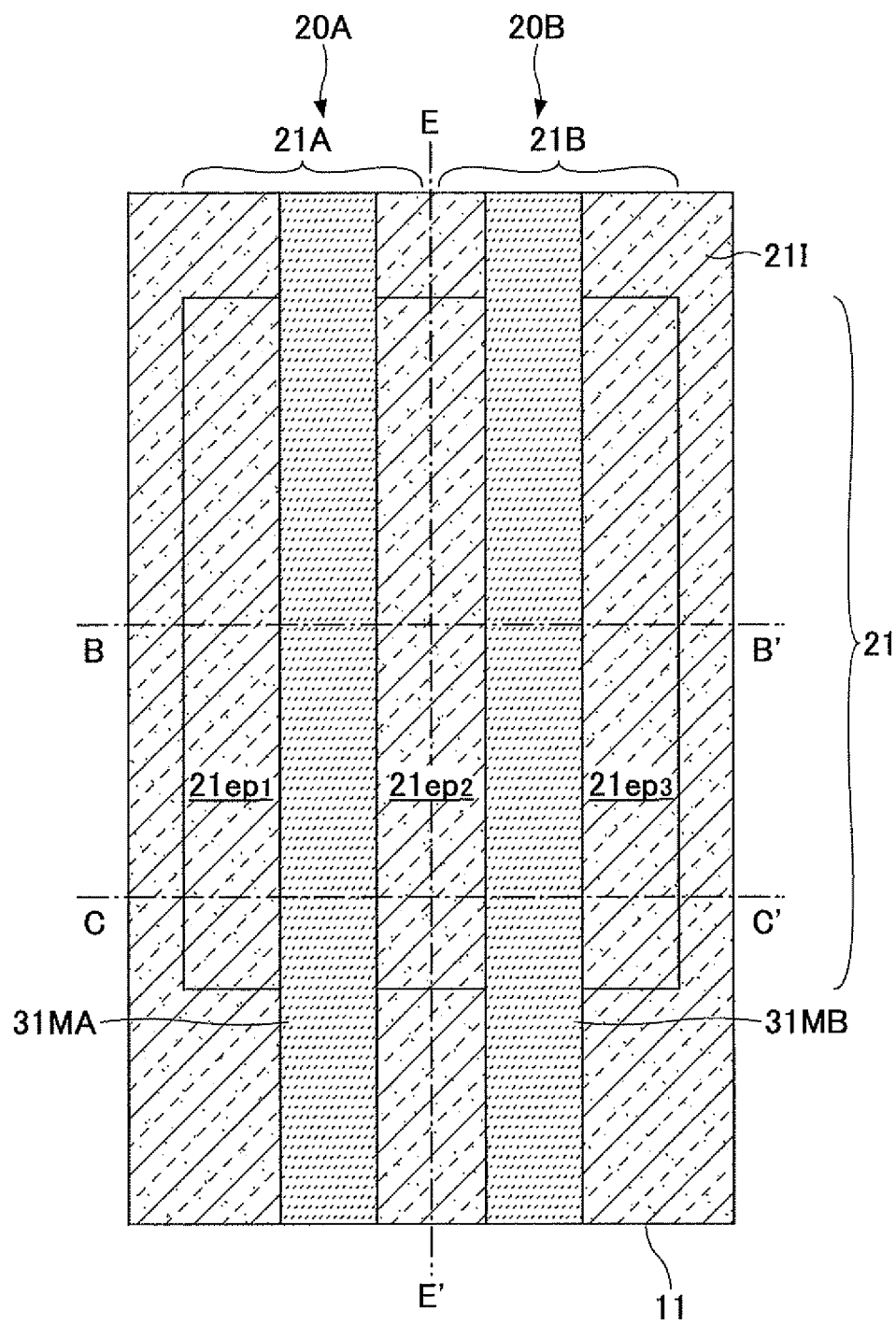
FIG. 23A is a top view illustrating a step of the manufacturing process of the semiconductor device according to the second embodiment.
Figure 23C:
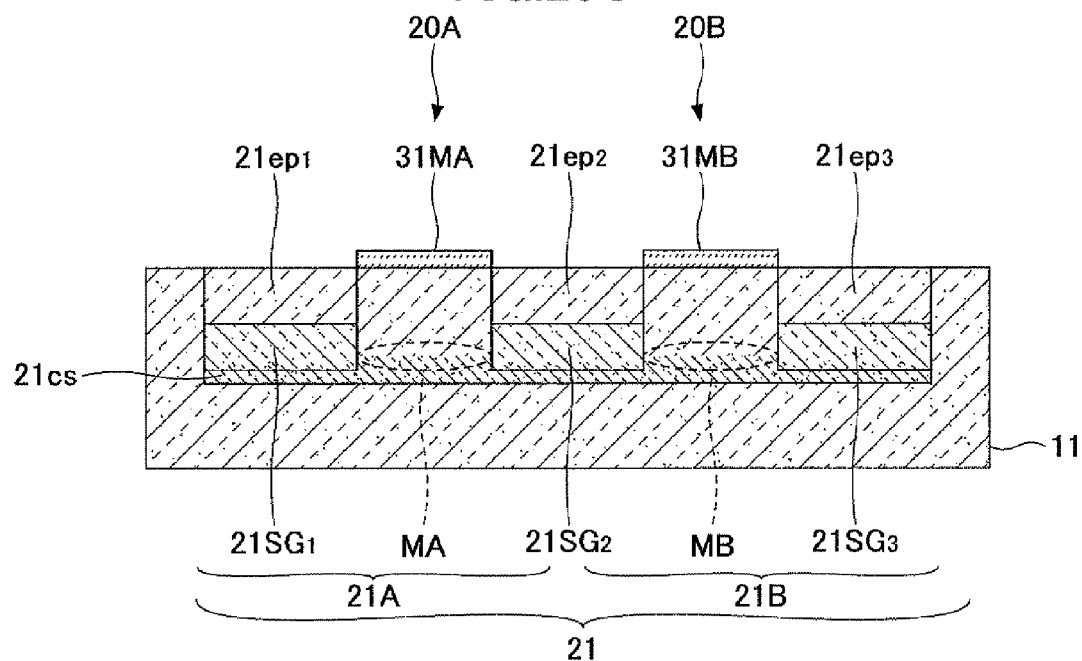
FIG. 23C is a cross-sectional view cut along the line B-B' in FIG. 23A.
Figure 23D:
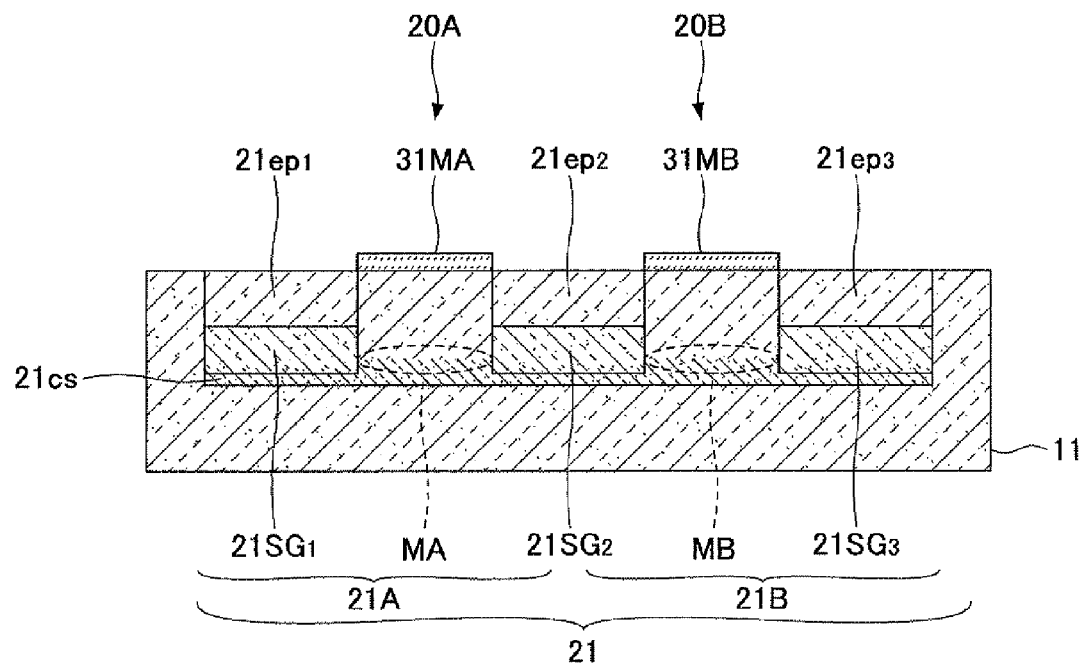
FIG. 23D is a cross-sectional view cut along the line C-C' in FIG. 23A.

FIGS. 23A through 23D illustrate a step of the manufacturing process of the semiconductor device 20 according to the second embodiment following the step of FIGS. 22A through 22D. Specifically, FIG. 23A is a top view corresponding to FIG. 22A. FIG. 23B is a cross-sectional view cut along the line E-E' in FIG. 23A. FIG. 23C is a cross-sectional view cut along the line B-B' in FIG. 23A. FIG. 23D is a cross-sectional view cut along the line C-C' in FIG. 23A.

As illustrated in FIG. 23A through 23D, in this step, the CVD process is performed by using the mask patterns 31MA and 31MB as masks, so that, similar to the step of FIGS. 9A through 9D, the trenches 21TA, 21TB, and 21TC are filled with the epitaxially grown Si—Ge mixed layers and silicon layers in the lower in the lower part and the upper part, respectively, of the trenches 21TA, 21TB, and 21TC.

As a result, the trench 21TA is filled with the Si—Ge mixed layer $SG_1$ and the silicon epitaxial layers $21ep_1$ in the lower part and the upper part, respectively. Similarly, the trench 21TB is filled with the Si—Ge mixed layer $SG_2$ and the silicon epitaxial layers $21ep_2$ in the lower part and the upper part, respectively, and the trench 21TC is filled with the Si—Ge mixed layer $SG_3$ and the silicon epitaxial layers $21ep_3$ in the lower part and the upper part, respectively.

Figure 24A:
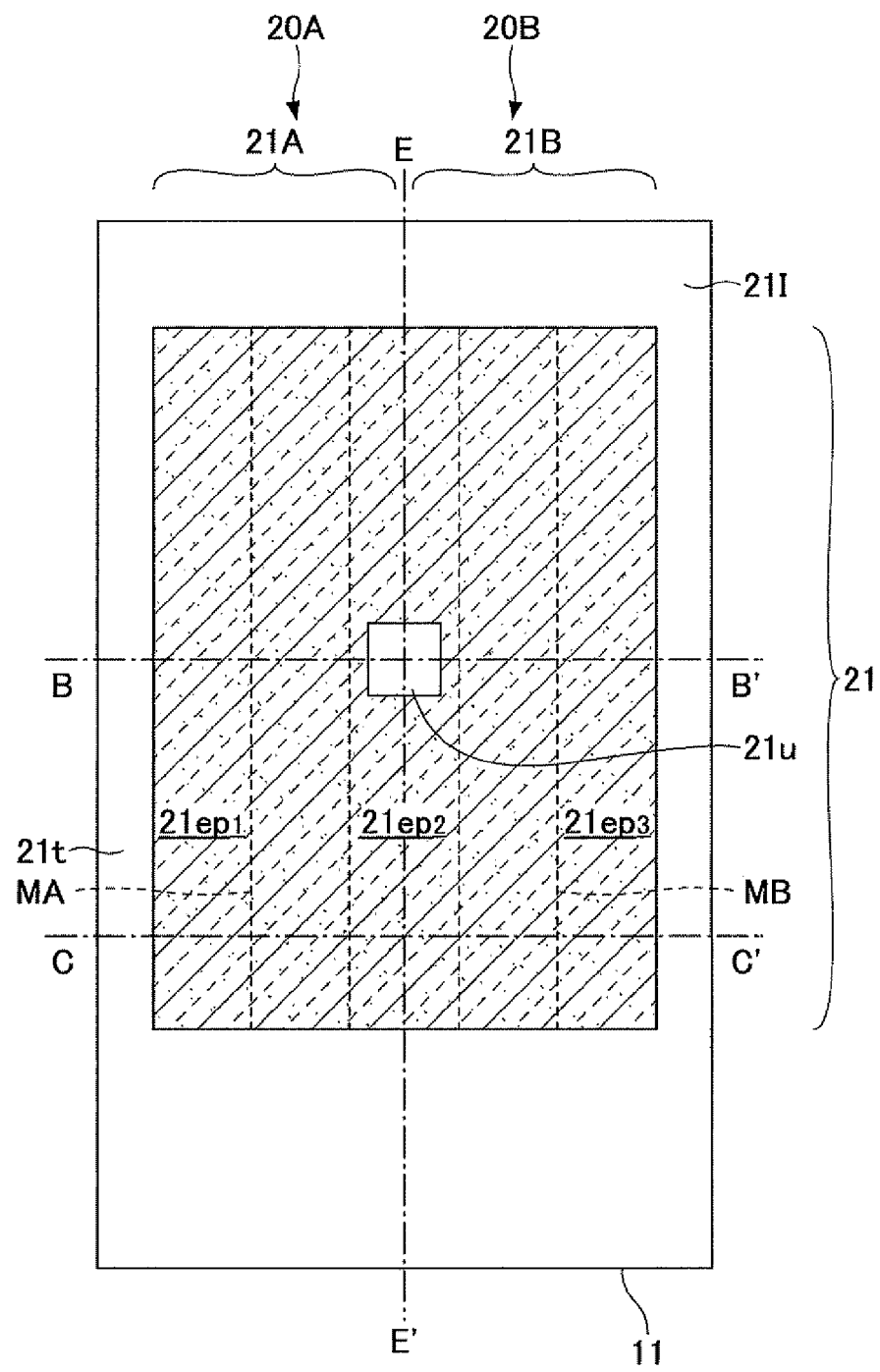
FIG. 24A is a top view illustrating a step of the manufacturing process of the semiconductor device according to the second embodiment.
Figure 24B:
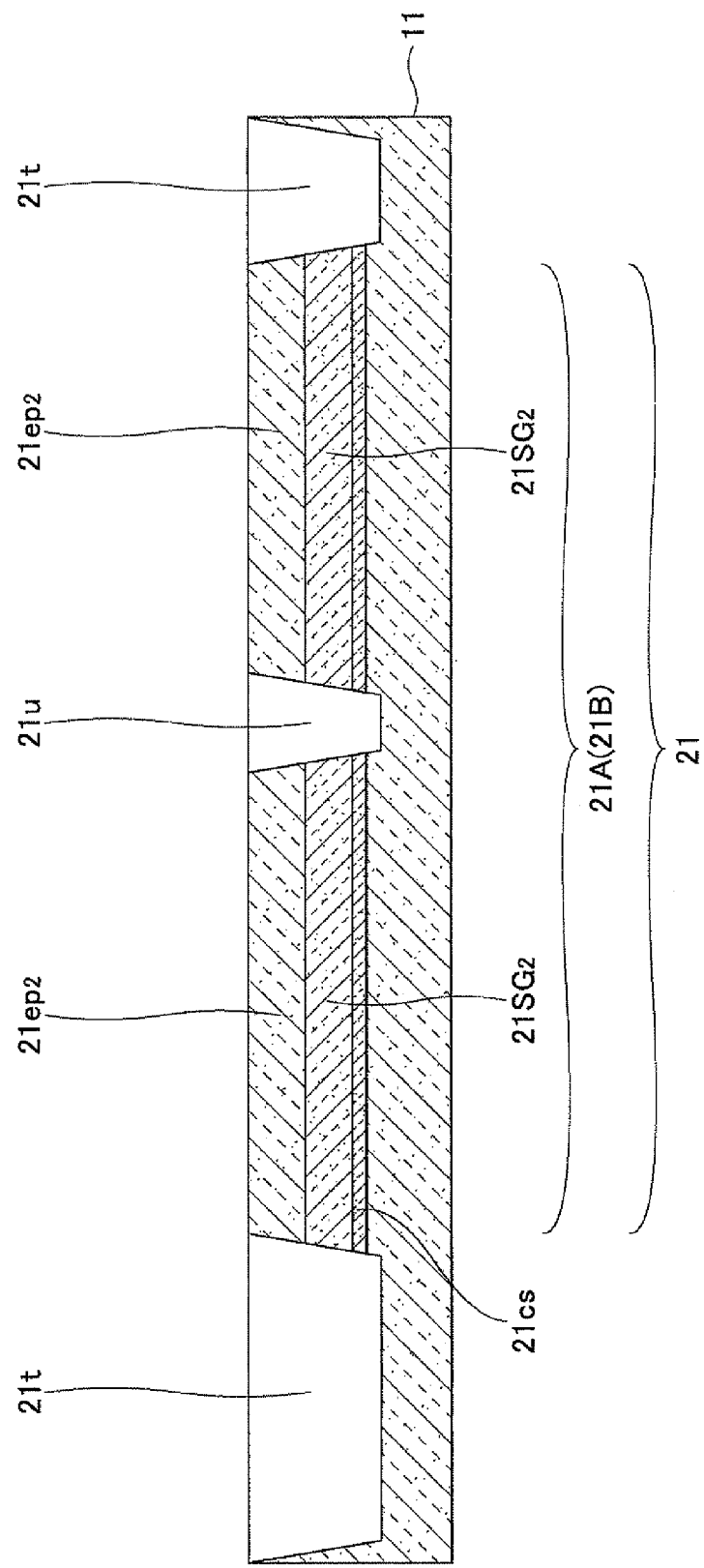
FIG. 24B is a cross-sectional view cut along the line E-E' in FIG. 24A.
Figure 24C:
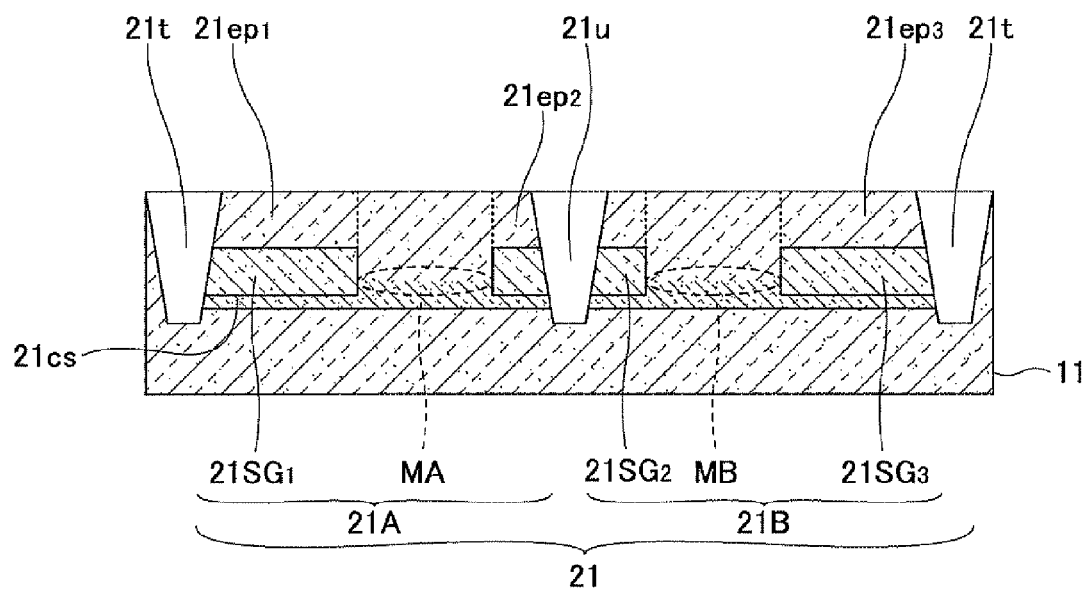
FIG. 24C is a cross-sectional view cut along the line B-B' in FIG. 24A.
Figure 24D:
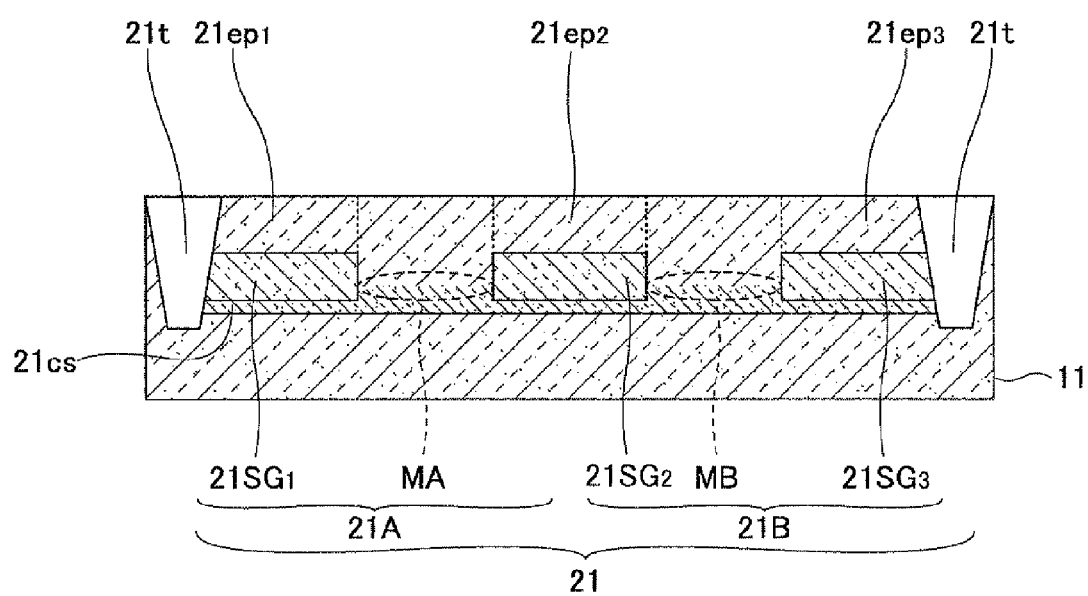
FIG. 24D is a cross-sectional view cut along the line C-C' in FIG. 24A.

FIGS. 24A through 24D illustrate a step of the manufacturing process of the semiconductor device 20 according to the second embodiment following the step of FIGS. 23A through 23D. Specifically, FIG. 24A is a top view corresponding to FIG. 23A. FIG. 24B is a cross-sectional view cut along the line E-E' in FIG. 24A. FIG. 24C is a cross-sectional view cut along the line B-B' in FIG. 24A. FIG. 24D is a cross-sectional view cut along the line C-C' in FIG. 24A.

As illustrated in FIG. 24A through 24D, in this step, in the silicon substrate 11, the device isolation groove (first trench) 21t corresponding to the device isolation region 21I is formed so as to define the device region 21. Also, the second trench 21u is formed at the boundary part between the first device region part 21A and the second device region part 21B. Preferably, the device isolation groove (first trench) 21t and the second trench 21u are simultaneously formed and formed so as to be deeper than the lower ends of the Si—Ge mixed layer regions $SG_1$ through $SG_3$. In the example of FIGS. 24A through 24D, it may appear that the lower ends of the device isolation groove (first trench) 21t and the second trench 21u extended correspond to the lower end of the channel stopper region 21cs.

However, it is not always necessary that the lower ends of the device isolation groove (first trench) 21t and the second trench 21u extended correspond to the lower end of the channel stopper region 21cs. Namely, for example, the lower ends of the device isolation groove (first trench) 21t and the second trench 21u may be deeper (lower) or may be shallower (higher) than the lower end of the channel stopper region 21cs.

Figure 25A:
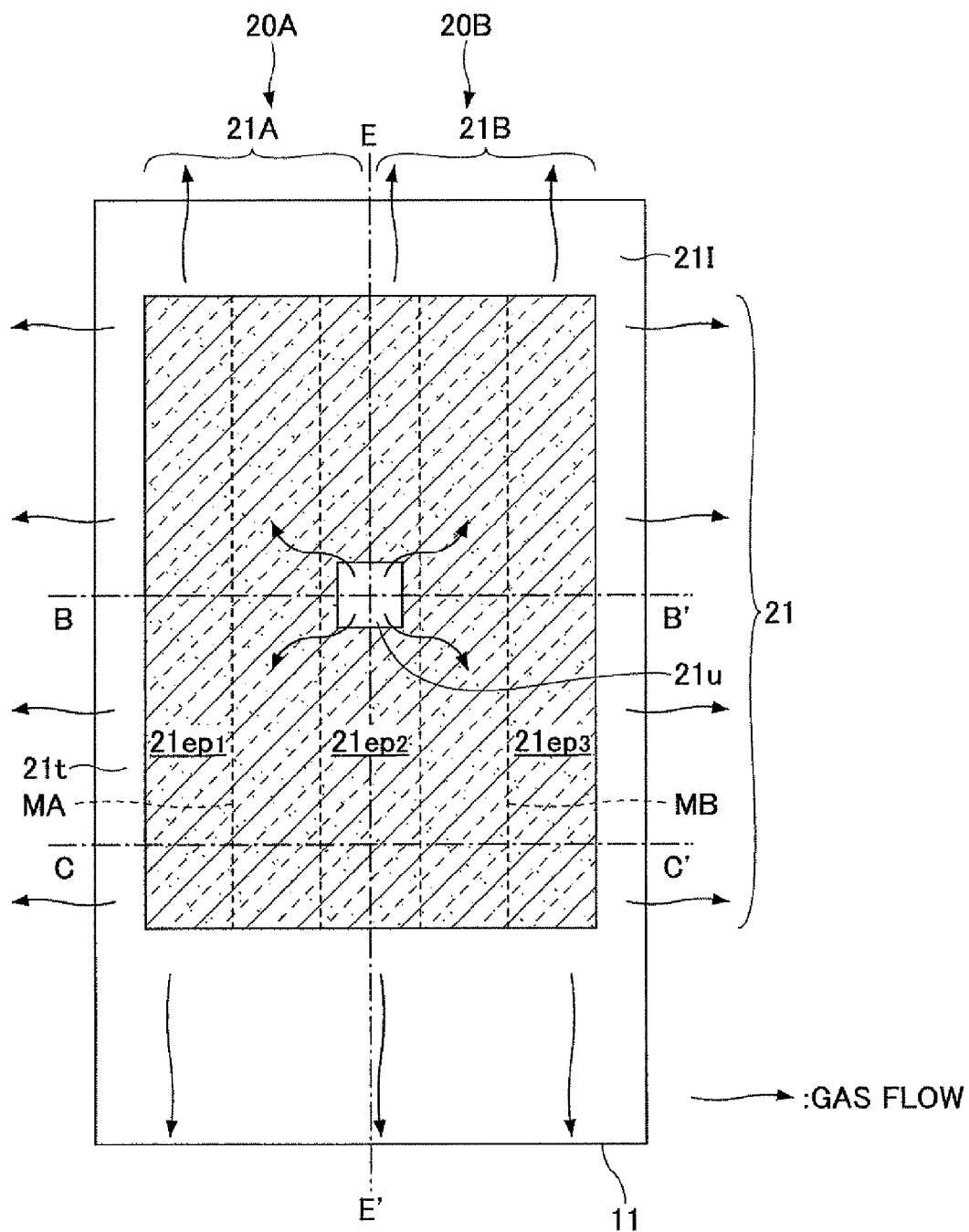
FIG. 25A is a top view illustrating a step of the manufacturing process of the semiconductor device according to the second embodiment.
Figure 25C:
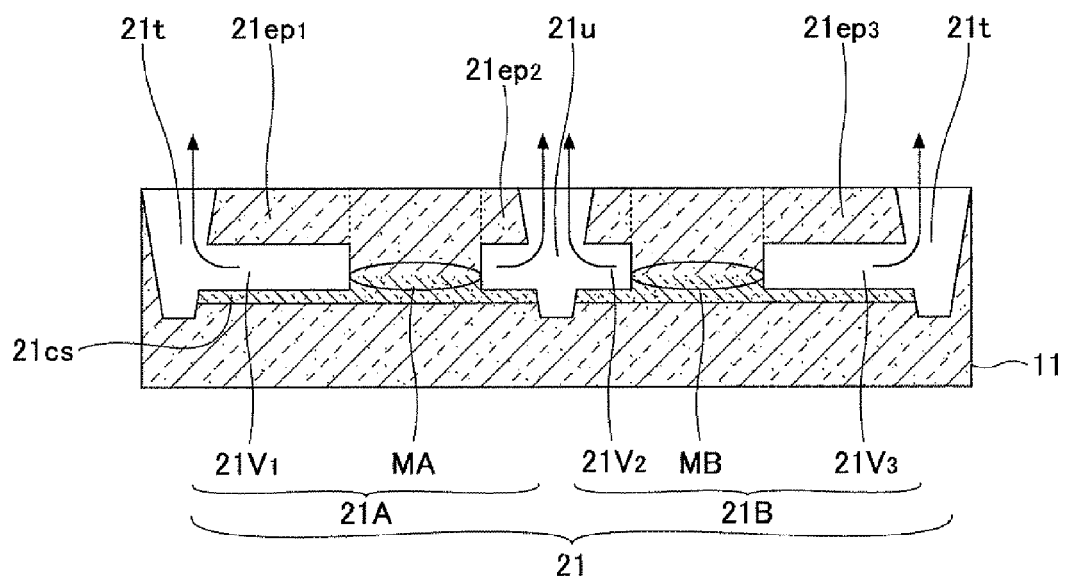
FIG. 25C is a cross-sectional view cut along the line B-B' in FIG. 25A.
Figure 25D:
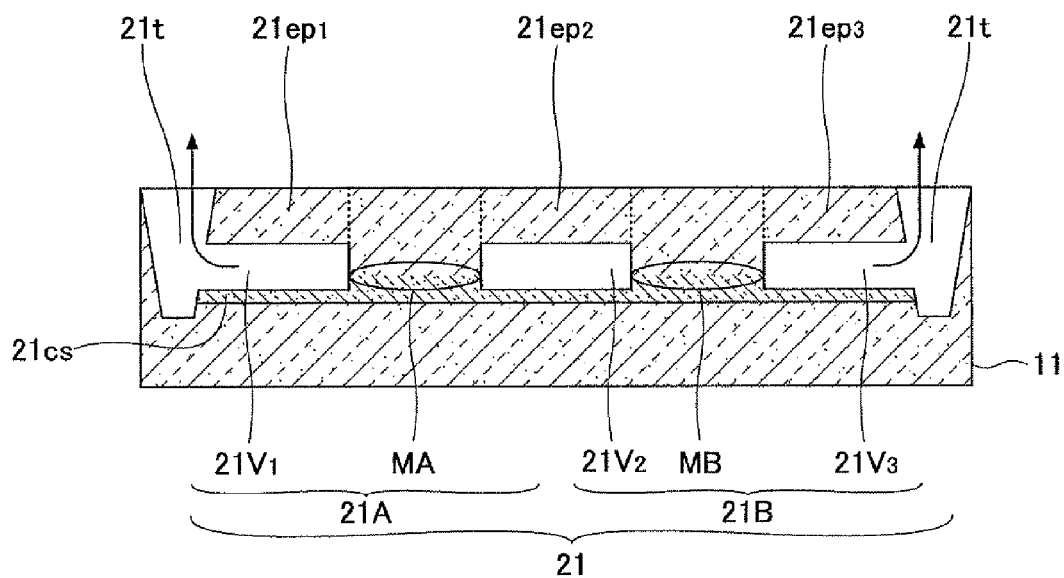
FIG. 25D is a cross-sectional view cut along the line C-C' in FIG. 25A.

FIGS. 25A through 25D illustrate a step of the manufacturing process of the semiconductor device 20 according to the second embodiment following the step of FIGS. 24A through 24D. Specifically, FIG. 25A is a top view corresponding to FIG. 24A. FIG. 25B is a cross-sectional view cut along the line E-E' in FIG. 25A. FIG. 25C is a cross-sectional view cut along the line B-B' in FIG. 25A. FIG. 25D is a cross-sectional view cut along the line C-C' in FIG. 25A.

As illustrated in FIG. 25A through 25D, in this step, similar to the step of FIGS. 11A through 11D, the Si—Ge mixed layer regions $SG_1$ through $SG_3$ are selectively etched and removed, so that voids $21V_1$ through $21V_3$ corresponding to the Si—Ge mixed layer regions $SG_1$ through $SG_3$ are formed.

In this embodiment, similar to the first embodiment, by not only forming the device isolation groove (first trench) 21t but also forming the second trench 21u in the epitaxial layers $21ep_2$, it may become possible to promote gas flow of etching gas along the arrow directions illustrated in FIGS. 25A through 25D.

As a result, the gas flow to etch the Si—Ge mixed layer $SG_2$ under the epitaxial layers $21ep_2$ may be promoted. The etching of the Si—Ge mixed layer $SG_2$ under the epitaxial layers $21ep_2$ may be much difficult without the formed second trench 21u. Namely, it may become possible to more effectively (promote to) etch not only the Si—Ge mixed layers $SG_1$ and $SG_2$ but also the Si—Ge mixed layers $SG_3$.

Figure 26A:
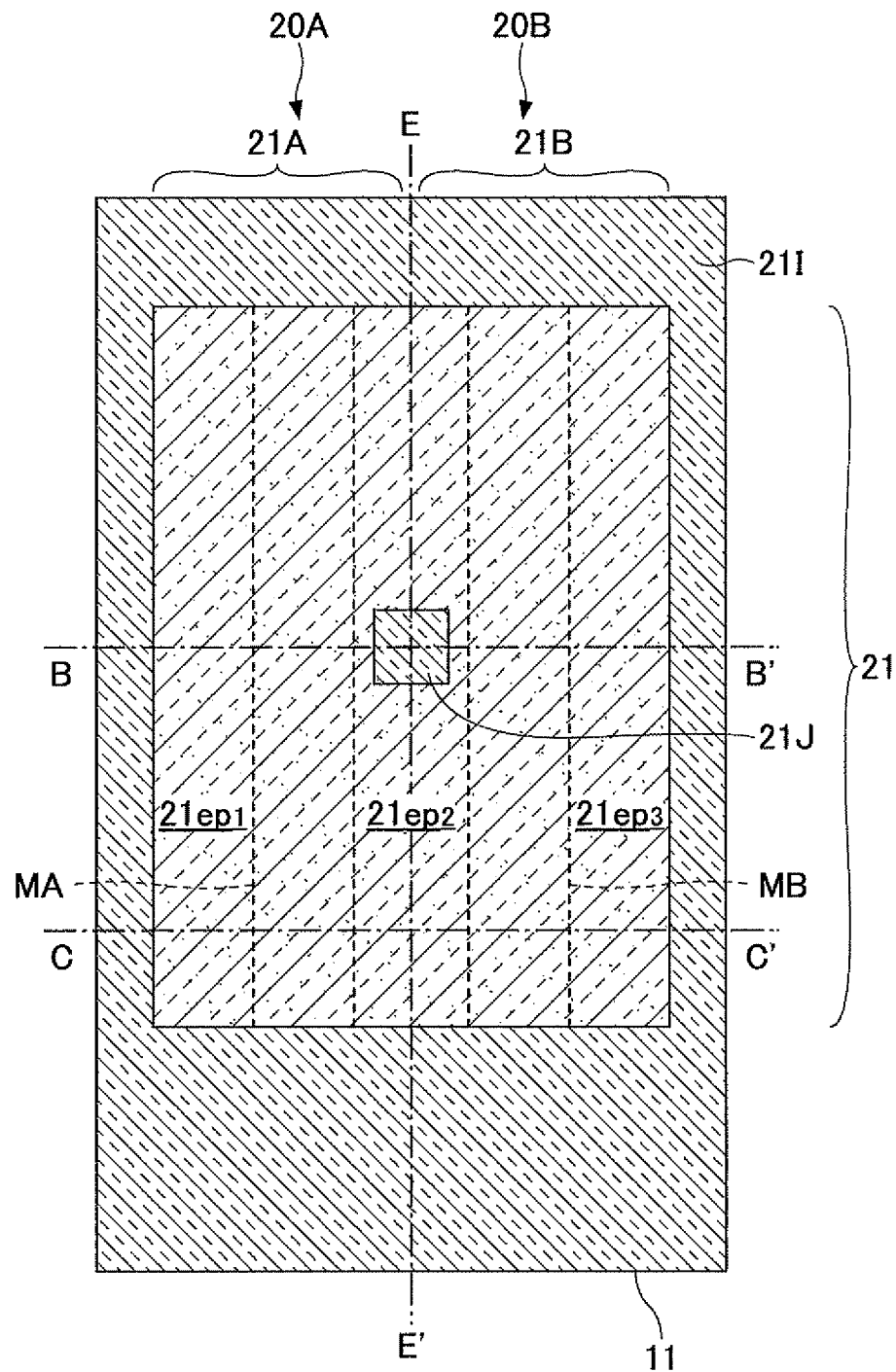
FIG. 26A is a top view illustrating a step of the manufacturing process of the semiconductor device according to the second embodiment.
Figure 26C:
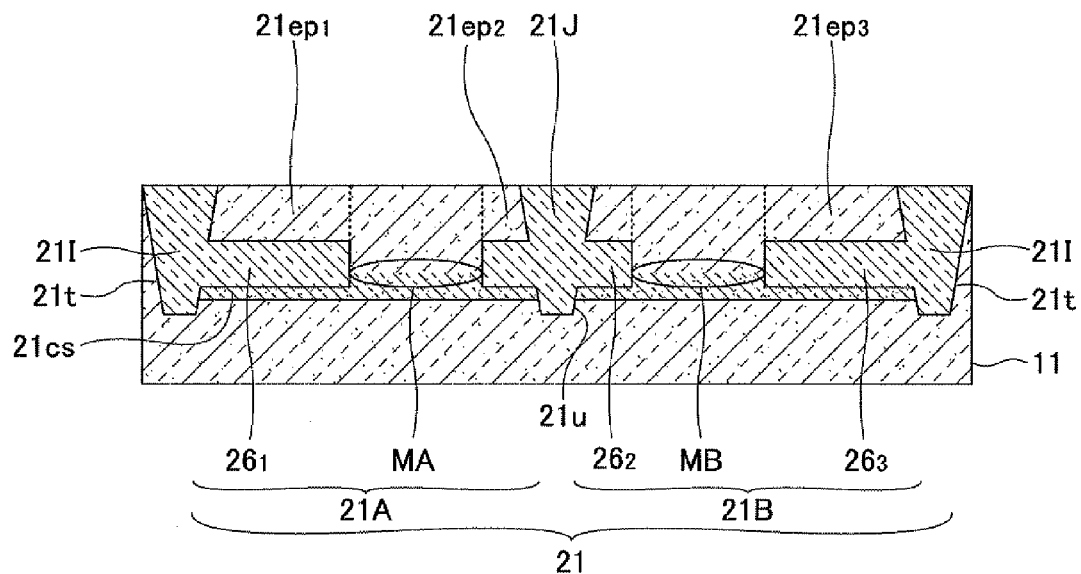
FIG. 26C is a cross-sectional view cut along the line B-B' in FIG. 26A.
Figure 26D:
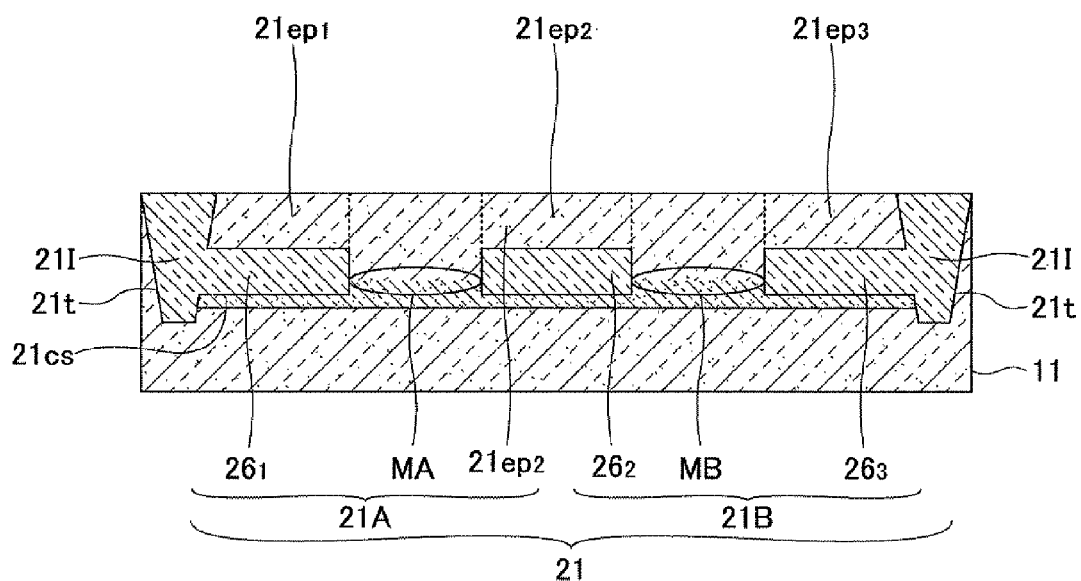
FIG. 26D is a cross-sectional view cut along the line C-C' in FIG. 26A.

FIGS. 26A through 26D illustrate a step of the manufacturing process of the semiconductor device 20 according to the second embodiment following the step of FIGS. 25A through 25D. Specifically, FIG. 26A is a top view corresponding to FIG. 25A. FIG. 26B is a cross-sectional view cut along the line E-E' in FIG. 26A. FIG. 26C is a cross-sectional view cut along the line B-B' in FIG. 26A. FIG. 26D is a cross-sectional view cut along the line C-C' in FIG. 26A.

As illustrated in FIG. 26A through 26D, this step corresponds to the steps of FIG. 12A through FIG. 12D and FIG. 13A through FIG. 13D. Namely, the voids $21V_1$, $21V_2$, and $21V_3$ are filled with the embedded isolation films $26_1$, $26_2$, and $26_3$, respectively.

Figure 27A:
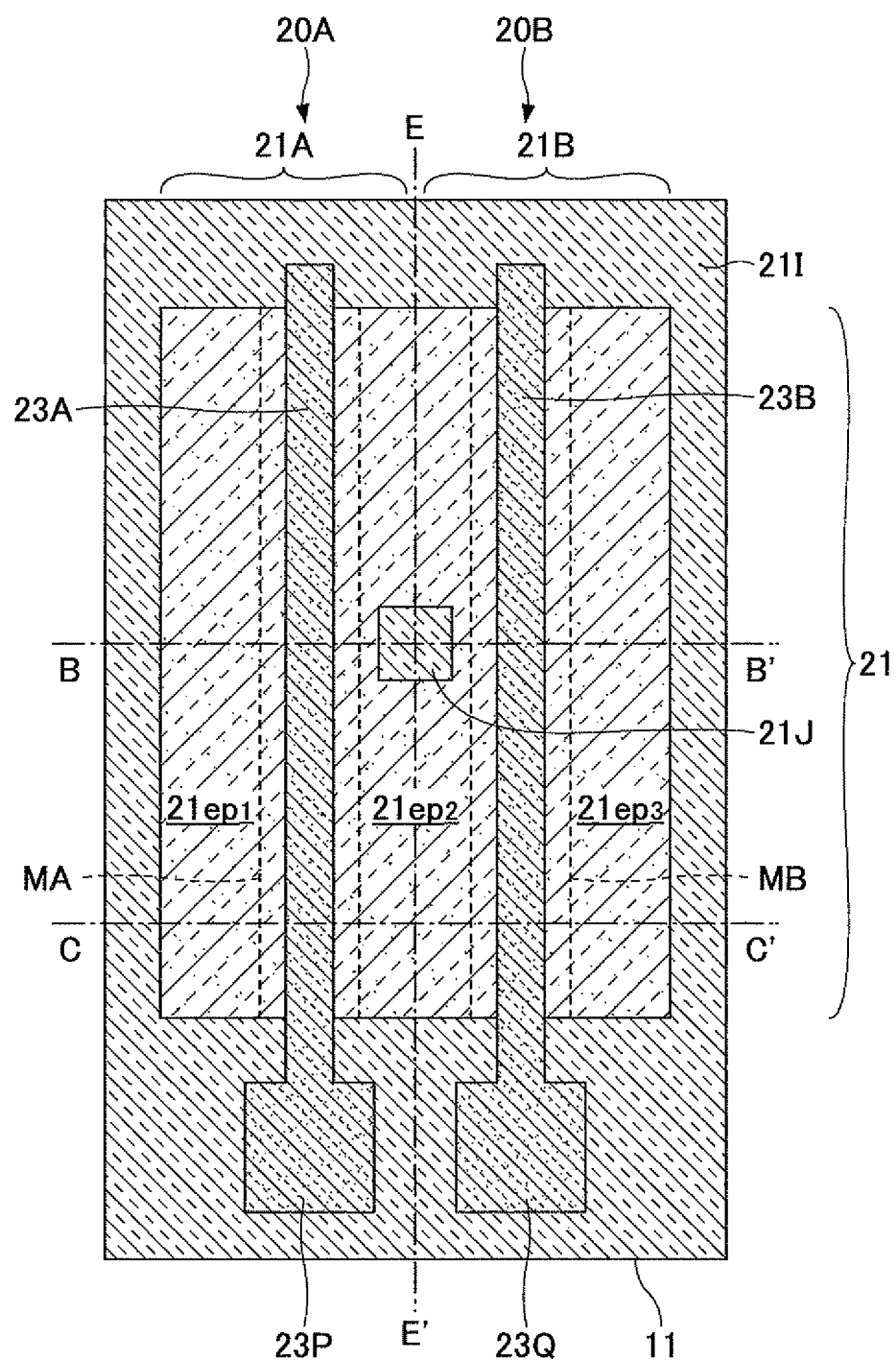
FIG. 27A is a top view illustrating a step of the manufacturing process of the semiconductor device according to the second embodiment.
Figure 27B:
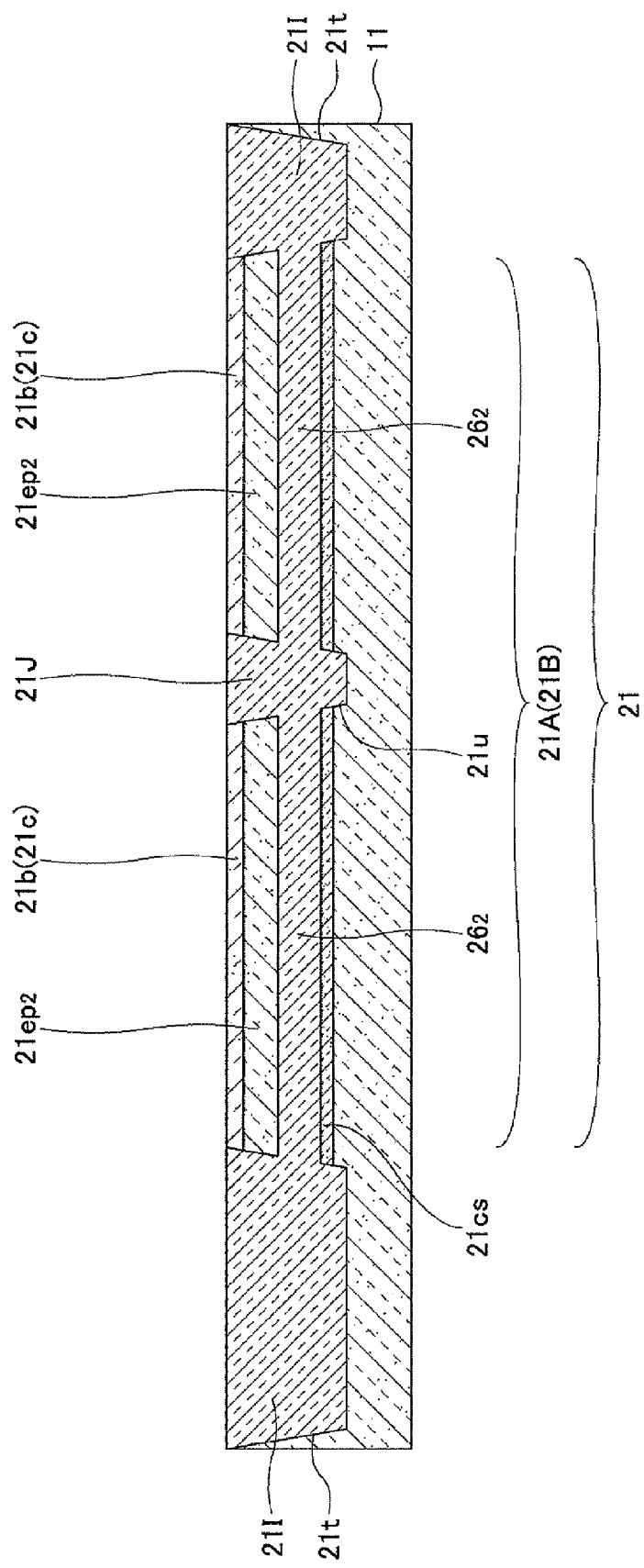
FIG. 27B is a cross-sectional view cut along the line E-E' in FIG. 27A.
Figure 27C:
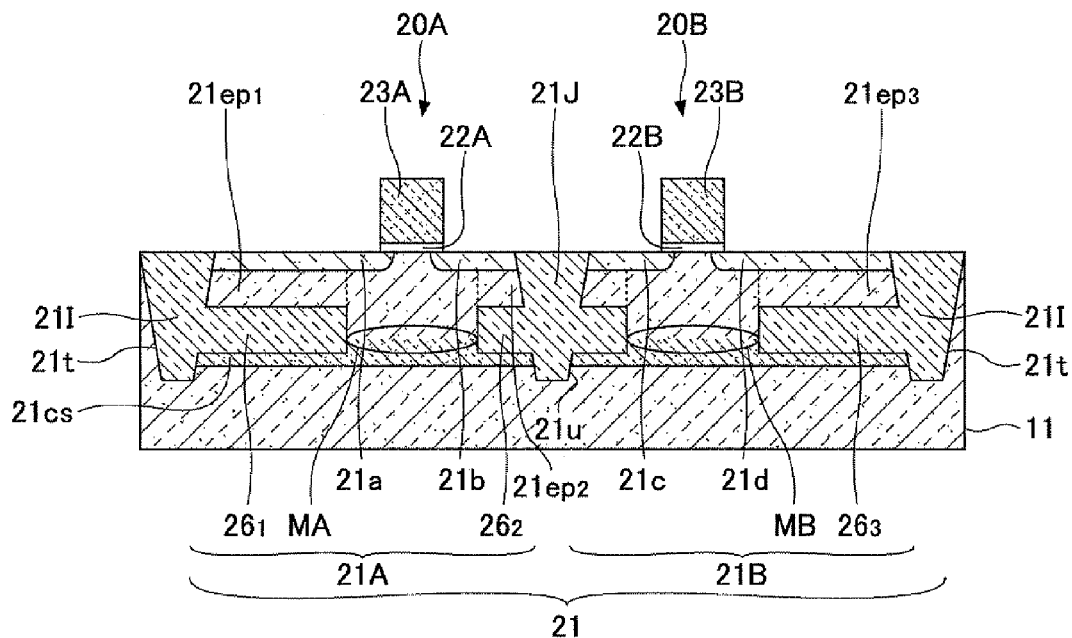
FIG. 27C is a cross-sectional view cut along the line B-B' in FIG. 27A.
Figure 27D:
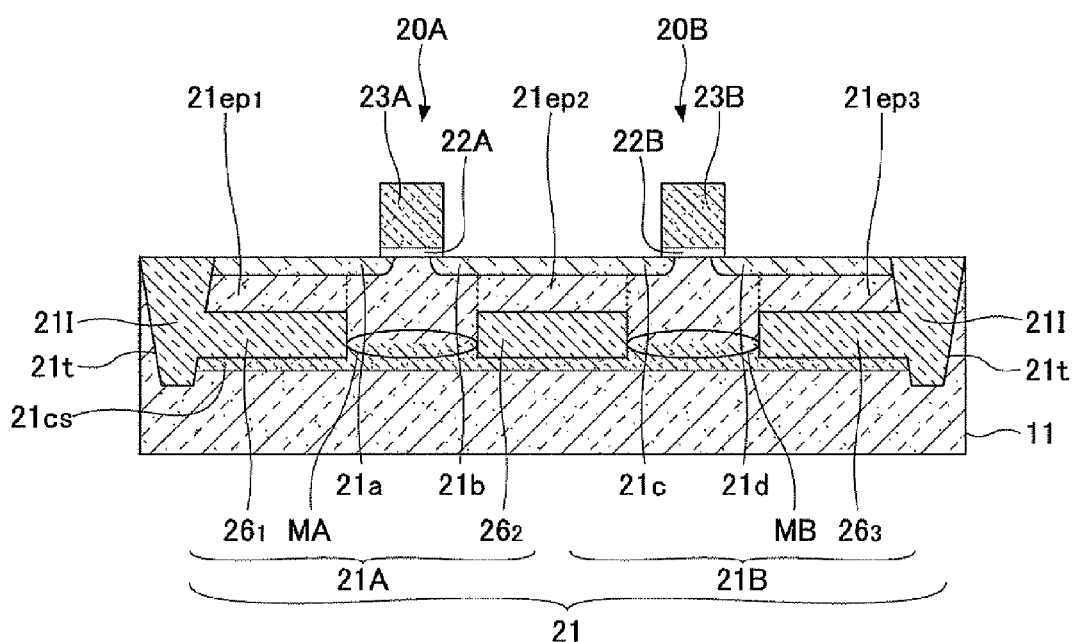
FIG. 27D is a cross-sectional view cut along the line C-C' in FIG. 27A.

FIGS. 27A through 27D illustrate a step of the manufacturing process of the semiconductor device 20 according to the second embodiment following the step of FIGS. 26A through 26D. Specifically, FIG. 27A is a top view corresponding to FIG. 26A. FIG. 27B is a cross-sectional view cut along the line E-E' in FIG. 27A. FIG. 27C is a cross-sectional view cut along the line B-B' in FIG. 27A. FIG. 27D is a cross-sectional view cut along the line C-C' in FIG. 27A.

As illustrated in FIG. 27A through 27D, in this step of this embodiment, polysilocon gate electrodes 23A and 23B similar to those of FIGS. 6A through 6D are formed on the mesa structures MA and MB of the silicon substrate 11 via the gate isolation films 22A and 22B, respectively.

Further, similar to the step of FIGS. 15A through 15D, the ion implantation is performed by using the polysilocon gate electrodes 23A and 23B as masks to form the source extension regions 21a and the drain extension region 21b of the first MOS transistor 20A and the source extension regions 21c and the drain extension region 21d of the second MOS transistor 20B. In this embodiment, the drain extension region 21b and the source extension regions $21c$ constitute (form) a single contiguous (the same) diffusion region.

After that, by executing the steps of FIGS. 16A through 16D, FIGS. 17A through 17D, and FIGS. 18A through 18D, the semiconductor device having the structure of FIGS. 1A and 1D may be acquired (formed).

In this embodiment as well, by forming the hole (opening) (i.e., the second trench) $21u$ in the epitaxial layers $21ep_2$, it may become possible to effectively remove Si—Ge mixed layer regions $SG_1$ through $SG_3$ from under the silicon epitaxial layers $21ep_1$ through $21ep_3$, respectively, in the step of FIGS. 25A through 25D.

Namely, the semiconductor device may be more effectively formed (manufactured). Further, in the step of FIGS. 26A through 26D, it may become possible to improve the efficiency of filling the voids $21V_1$, $21V_2$, and $21V_3$ with the embedded isolation films $26_1$, $26_2$, and $26_3$, respectively.

Further, in the semiconductor device 20 as formed as described above, in each of the first MOS transistor 20A and the second MOS transistor 20B, the first channel region 21Cha and the second channel region 21Chb are formed in the mesa structures MA and MB, respectively, which are originally a part of the silicon substrate 11 having higher quality, and which are not formed based on any of the silicon epitaxial layers $21ep_1$, $21ep_2$, and $21ep_3$ which are grown later. Therefore, it may become possible to form the semiconductor (channel) regions having higher crystal quality and prevent carriers from being scattered or extinguished due to a defect or an impurity element.

In the above embodiments, it is basically assumed that the silicon substrate 11 is p-type substrate. However, obviously, the above embodiments may also be applied to a case where the silicon substrate 11 is n-type simply by reversing the conductivity type in each of the layers.

According to an embodiment, a semiconductor device include a semiconductor substrate; a device region formed on the semiconductor substrate, defined by a device isolation region, and including a first device region part and a second device region part; a first gate electrode formed in the first device region part; a first source region formed on a first side of the first gate electrode in the first device region part; a first drain region formed on a second side of the first gate electrode in the first device region part; a second gate electrode formed in the second device region part; a second source region formed on a first side of the second gate electrode in the second device region part; a second drain region formed on a second side of the second gate electrode in the second device region part; a first embedded isolation film region formed under the first source region; a second embedded isolation film region formed under the first drain region; a third embedded isolation film region formed under the second source region; and a fourth embedded isolation film region formed under the second drain region. Further, the first drain region and the second source region constitute (form) a single (the same) diffusion region between the first gate electrode and the second gate electrode. Further, the second embedded isolation film region and the third embedded isolation film region constitute (form) a single (the same) embedded isolation film region between the first gate electrode and the second gate electrode. Further, between the first gate electrode and the second gate electrode, an opening is formed in a part of the diffusion region including (forming) the first drain region and the second source region, so that the opening extends to (reaches) the second embedded isolation film region and the third embedded isolation film region. Further, the opening is filled with an isolation film.

According to an embodiment, a depth of the opening may be substantially the same as a depth of the device isolation region.

According to an embodiment, the opening may extend to (reach) the semiconductor substrate under the embedded isolation film region.

According to an embodiment, between the first gate electrode and the second gate electrode, the opening may be formed in a manner that the opening is arranged in a line with via plugs formed to be in contact with the first drain region and the second drain region.

According to an embodiment, the size of the opening on the surface of the semiconductor substrate is substantially the same as that of the via plugs on the surface of the semiconductor substrate.

According to an embodiment, the first embedded isolation film region may be contiguous to the device isolation region in a part of the outer circumference of the first device region part, and the second embedded isolation film region may be contiguous to the device isolation region in a part of the outer circumference of the second device region part According to an embodiment, a method of manufacturing a semiconductor device include forming a device isolation groove on a semiconductor substrate to define a device region including a first device region part and a second device region part which are adjacent to each other by the device isolation groove; forming a hole at a contacting part between the first device region part and a second device region part of the device region; filling the device isolation groove and the hole with a first isolation film, to form a first isolation film region in the device isolation groove and a second isolation film region in the hole; forming a first gate electrode and a second gate electrode in a manner that the first gate electrode is formed in the first device region part and the second gate electrode is formed in the second device region part and the first gate electrode is formed on a first side of the second gate electrode and the second gate electrode is formed on a second side of the first gate electrode; forming a first side wall isolation film and a second side wall isolation film in a manner that the first side wall isolation film is formed on each of first and second sides of the first gate electrode, the second side being opposite to the first side, and a second side wall isolation film is formed on each of the first side and the second side of the second gate electrode; etching the semiconductor substrate by using the first gate electrode and the first side wall isolation film in the first device region part and the second gate electrode and the second side wall isolation film in the second device region part as masks, to form first, second, third, and fourth trenches in a manner that in the first device region part, the first trench is formed on the first side of the first gate electrode so that the first trench is contiguous to a part of the device isolation groove in the first side of the first gate electrode and a part of the first isolation film region is exposed, the second trench is formed on the second side of the first gate electrode so that the second trench is contiguous to a part of the hole in the second side of the first gate electrode and a part of the second isolation film region is exposed, and in the second device region part, the third trench is formed on the first side of the second gate electrode so that the third trench is disposed on the first side of the second gate electrode and is contiguous to a part of the hole so that a part of the second isolation film region is exposed, the fourth trench is formed on the second side of the second gate electrode so that the fourth trench is contiguous to a part of the device isolation groove in the second side of the second gate electrode and a part of the first isolation film region is exposed, and the second trench is contiguous to the third trench in a connecting part between the first device region part and the second device region part; filling lower parts of the first, the second, the third, and the fourth trenches with a first semiconductor layer having etching selectivity relative to the semiconductor substrate; forming a second semiconductor layer on the first semiconductor layer in the first, the second, the third, and the fourth trenches, the second semiconductor layer having etching selectivity relative to the first semiconductor layer, to fill the first, the second, the third, and the fourth trenches up to at least a surface of the semiconductor substrate; removing the first isolation film region through the device isolation groove and the second isolation film region through the hole, to expose the first semiconductor layer and the second semiconductor layer in the device isolation groove and the hole; selectively etching and removing the first semiconductor layer relative to the semiconductor substrate and the second semiconductor layer through the device isolation groove and the hole to form a void in a part where the first semiconductor layer had been formed in the first, the second, the third, and the fourth trenches; filling with the void with a third semiconductor layer in the first, the second, the third, and the fourth trenches, so that first, second, third, and fourth embedded isolation film regions are formed under the second semiconductor layers in the first, the second, the third, and the fourth trenches, respectively, a device isolation region is formed in the device isolation groove, and an isolation film region is formed in the hole; removing the first side wall isolation film and the second side wall isolation film; performing ion implantation by introducing an impurity element by using the first gate electrode in the first device region part an the second gate electrode in the second device region part as masks after the first side wall isolation film and the second side wall isolation film are removed, to form a source extension region and a drain extension region of a first transistor to be formed in the first device region part, the source extension region and the drain extension region being formed on the first side and the second side, respectively, of the first gate electrode, and a source extension region and a drain extension region of a second transistor to be formed in the second device region part, the source extension region and the drain extension region being formed on the first side and the second side, respectively, of the second gate electrode; forming a third side wall isolation film on each of the first and the second sides of the first gate electrode and a fourth side wall isolation film on each of the first and the second sides of the second gate electrode; and introducing an impurity element by using the first electrode, the second electrode, the third side wall isolation film, and the fourth side wall isolation film as masks to form a source region of the first transistor in the second semiconductor layer formed in the first trench, a drain region of the first transistor in the second semiconductor layer formed in the second trench, a source region of the second transistor in the second semiconductor layer formed in the third trench, and a drain region of the second transistor in the second semiconductor layer formed in the fourth trench.

According to an embodiment, a method of manufacturing a semiconductor device includes forming a region to be a first active region of a first transistor and a region to be a second active region of a second transistor in a manner that the first active region is formed by using a first mask pattern, the first active region being included in a first device region part where the first transistor including a first gate electrode is to be formed, the first device region being included in a semiconductor substrate surface, and the second active region is formed by using a second mask pattern, the second active region being included in a second device region part where the second transistor including a second gate electrode is to be formed, the second device region being included in a semiconductor substrate surface, the first mask pattern being disposed on a first side of the second mask pattern, the second mask pattern being disposed on a second side of the first mask pattern; etching the semiconductor substrate using the first mask pattern and the second mask pattern as masks to form first, second, third, and fourth trenches in a manner that the first trench is formed on the first side of the first mask pattern, the second trench is formed on the second side of the first mask pattern, the second side being opposite to the first side of the first mask pattern, the third trench is formed on the first side of the second mask pattern, the fourth trench is formed on the second side of the second mask pattern, and the second trench is contiguous to the third trench; filling lower parts of the first, the second, the third, and the fourth trenches with a first semiconductor layer having etching selectivity relative to the semiconductor substrate; forming a second semiconductor layer on the first semiconductor layer in the first, the second, the third, and the fourth trenches, the second semiconductor layer having etching selectivity relative to the first semiconductor layer, to fill the first, the second, the third, and the fourth trenches at least up to a surface of the semiconductor substrate; forming a device isolation groove and a hole in the semiconductor substrate in a manner that the device isolation groove defines a device region including the first, the second, the third, and the fourth trenches, the hole is formed at a boundary between the first device region part where the first transistor is to be formed in the device region and the second device region part where the second transistor is to be formed in the device region, the second semiconductor layer formed in the first trench is exposed through the device isolation groove, the second semiconductor layer formed in the fourth trench is exposed through the device isolation groove, and the second semiconductor layer formed on the second trench and the second semiconductor layer formed in the third trench are disposed through the hole; selectively etching and removing the first semiconductor layer from the first and the fourth trenches through the device isolation groove and the first semiconductor layer from the second and the third trenches through the hole relative to the semiconductor substrate and the second semiconductor layer, to form a void in parts where the first semiconductor layer had been formed in the first, the second, the third, and the fourth trenches; filling the void in the first, the second the third, and the fourth trenches with a third isolation film through the device isolation groove and the hole, to form first, second, third, and fourth embedded isolation film region in a manner that the first, the second, the third, and the fourth embedded isolation film regions are formed under the second semiconductor layer in the first, the second, the third, and the fourth trenches, respectively; forming first and second gate electrodes in the first and the second active regions, respectively, via respective gate isolation films in a manner that the first gate electrode is formed on the first side of the second gate electrode and the second gate electrode is formed on the second side of the first gate electrode; performing ion implantation by introducing an impurity element by using the first gate electrode in the first active region and the second gate electrode in the second active region as masks, to form a source extension region and a drain extension region of the first transistor on the first side and the second side, respectively, of the first gate electrode in the first active region, and a source extension region and a drain extension region of the second transistor on the first side and the second side, respectively, of the second gate electrode in the second active region, forming first and second side wall isolation films in a manner that the first side wall isolation film is formed on each of the first and the second sides of the first gate electrode and the second side wall isolation film is formed on each of the first and the second sides of the second gate electrode; and introducing impurity element by using the first and the second gate electrodes and the first and the second side wall isolation films as masks, to form a source region of the first transistor in the second semiconductor layer in the first trench, a drain region of the first transistor in the second transistor layer in the second trench, a source region of the second transistor in the second semiconductor layer in the third trench, and a drain region of the second transistor in the second semiconductor layer in the fourth trench.

According to an embodiment, the hole may be simultaneously formed with the device isolation groove.

According to an embodiment, the hole may be separately formed from the device isolation groove.

According to an embodiment, the size and the figure of the hole may be substantially the same as those of a via plug to be formed between the first and the second gate electrodes.

According to an embodiment, as the first through the fourth side wall isolation films, a silicon oxide film may be used.

According to an embodiment, the first through the fourth side wall isolation films may be formed by a vapor-phase deposition method.

According to an embodiment, the semiconductor substrates may be a silicon substrate, the first semiconductor layer may be a Si—Ge mixed layer, the second semiconductor layer may be a silicon layer, and the first and the second semiconductor layers may be epitaxially grown on the silicon substrate.

According to an embodiment, in a semiconductor device in which the source region of the first transistor and the drain region of the second transistor constitute (form) a single (the same) diffusion region, it may become possible to easily and selectively remove the first semiconductor layer under the second semiconductor layer through the second trench, the first semiconductor layer having etching selectivity relative to the second semiconductor layer, the source and the detain regions of the first and the second transistors being formed in the second semiconductor layer. Further, it may become possible to easily form a void under each of the source and the detain regions of the first and the second transistors. Further, the void may be easily filled with an embedded isolation film through the second trench.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of superiority or inferiority of the invention. Although the embodiments of the present inventions has been described in detail, it is to be understood that various changes, substitutions, and alterations could be made hereto without departing from the sprit and scope of the invention.

What is claimed is:

1. A semiconductor device comprising:
a semiconductor substrate;
a device region formed on the semiconductor substrate, defined by a device isolation region, and including a first part and a second part;
a first gate electrode formed in the first part;
a first source region formed on a first side of the first gate electrode in the first part;
a first drain region formed on a second side of the first gate electrode in the first part;
a second gate electrode formed in the second part;
a second source region formed on a first side of the second gate electrode in the second part;
a second drain region formed on a second side of the second gate electrode in the second part;
a first embedded isolation film region formed under the first source region;
a second embedded isolation film region formed under the first drain region;
a third embedded isolation film region formed under the second source region; and
a fourth embedded isolation film region formed under the second drain region,
wherein the first drain region and the second source region constitute a single diffusion region between the first gate electrode and the second gate electrode,
wherein the second embedded isolation film region and the third embedded isolation film region constitute a single embedded isolation film region between the first gate electrode and the second gate electrode,
wherein, between the first gate electrode and the second gate electrode, an opening is formed in a part of the single diffusion region forming the first drain region and the second source region, so that the opening extends to the second embedded isolation film region and the third embedded isolation film region, and
wherein the opening is filled with an isolation film.

2. The semiconductor device according to claim 1, wherein a depth of the opening is substantially the same as a depth of the device isolation region.

3. The semiconductor device according to claim 1, wherein the opening extends to the semiconductor substrate under the embedded isolation film region.

4. The semiconductor device according to claim 1, wherein, between the first gate electrode and the second gate electrode, the opening is formed in a manner that the opening is arranged in a line with via plugs formed to be in contact with the first drain region and the second drain region.

5. The semiconductor device according to claim 4, wherein, a size of the opening on a surface of the semiconductor substrate is substantially the same as a size of the via plugs on the surface of the semiconductor substrate.

6. The semiconductor device according to claim 1, wherein, the first embedded isolation film region is contiguous to the device isolation region in a part of an outer circumference of the first part, and the second embedded isolation film region is contiguous to the device isolation region in a part of an outer circumference of the second part.

7. A method of manufacturing a semiconductor device, comprising:
forming a device isolation groove on a semiconductor substrate to define a device region including a first part and a second part which are adjacent to each other by the device isolation groove;
forming a hole at a contacting part between the first part and a second part of the device region;
filling the device isolation groove and the hole with a first isolation film, to form a first isolation film region in the device isolation groove and a second isolation film region in the hole;
forming a first gate electrode and a second gate electrode in a manner that the first gate electrode is formed in the first part and the second gate electrode is formed in the second part and the first gate electrode is formed on a first side of the second gate electrode and the second gate electrode is formed on a second side of the first gate electrode;

forming a first side wall isolation film and a second side wall isolation film in a manner that the first side wall isolation film is formed on each of first and second sides of the first gate electrode, the second side being opposite to the first side, and a second side wall isolation film is formed on each of the first side and the second side of the second gate electrode;

etching the semiconductor substrate by using the first gate electrode and the first side wall isolation film in the first part and the second gate electrode and the second side wall isolation film in the second part as masks, to form first, second, third, and fourth trenches in a manner that in the first part, the first trench is formed on the first side of the first gate electrode so that the first trench is contiguous to a part of the device isolation groove in the first side of the first gate electrode and a part of the first isolation film region is exposed, the second trench is formed on the second side of the first gate electrode so that the second trench is contiguous to a part of the hole in the second side of the first gate electrode and a part of the second isolation film region is exposed, and in the second part, the third trench is formed on the first side of the second gate electrode so that the third trench is disposed on the first side of the second gate electrode and is contiguous to a part of the hole so that a part of the second isolation film region is exposed, the fourth trench is formed on the second side of the second gate electrode so that the fourth trench is contiguous to a part of the device isolation groove in the second side of the second gate electrode and a part of the first isolation film region is exposed, and the second trench is contiguous to the third trench in a connecting part between the first part and the second part;

filling lower parts of the first, the second, the third, and the fourth trenches with a first semiconductor layer having etching selectivity relative to the semiconductor substrate;

forming a second semiconductor layer on the first semiconductor layer in the first, the second, the third, and the fourth trenches, the second semiconductor layer having etching selectivity relative to the first semiconductor layer, to fill the first, the second, the third, and the fourth trenches up to at least a surface of the semiconductor substrate;

removing the first isolation film region through the device isolation groove and the second isolation film region through the hole, to expose the first semiconductor layer and the second semiconductor layer in the device isolation groove and the hole;

selectively etching and removing the first semiconductor layer relative to the semiconductor substrate and the second semiconductor layer through the device isolation groove and the hole to form a void in a part where the first semiconductor layer had been formed in the first, the second, the third, and the fourth trenches;

filling with the void with a third semiconductor layer in the first, the second, the third, and the fourth trenches, so that first, second, third, and fourth embedded isolation film regions are formed under the second semiconductor layers in the first, the second, the third, and the fourth trenches, respectively, a device isolation region is formed in the device isolation groove, and an isolation film region is formed in the hole;

removing the first side wall isolation film and the second side wall isolation film;

performing ion implantation by introducing an impurity element by using the first gate electrode in the first part an the second gate electrode in the second part as masks after the first side wall isolation film and the second side wall isolation film are removed, to form a source extension region and a drain extension region of a first transistor to be formed in the first part, the source extension region and the drain extension region being formed on the first side and the second side, respectively, of the first gate electrode, and a source extension region and a drain extension region of a second transistor to be formed in the second part, the source extension region and the drain extension region being formed on the first side and the second side, respectively, of the second gate electrode;

forming a third side wall isolation film on each of the first and the second sides of the first gate electrode and a fourth side wall isolation film on each of the first and the second sides of the second gate electrode; and introducing an impurity element by using the first electrode, the second electrode, the third side wall isolation film, and the fourth side wall isolation film as masks to form a source region of the first transistor in the second semiconductor layer formed in the first trench, a drain region of the first transistor in the second semiconductor layer formed in the second trench, a source region of the second transistor in the second semiconductor layer formed in the third trench, and a drain region of the second transistor in the second semiconductor layer formed in the fourth trench.

8. A method of manufacturing a semiconductor device, comprising:

forming a region to be a first active region of a first transistor and a region to be a second active region of a second transistor in a manner that the first active region is formed by using a first mask pattern, the first active region being included in a first part where the first transistor including a first gate electrode is to be formed, the first active region being included in a semiconductor substrate surface, and the second active region is formed by using a second mask pattern, the second active region being included in a second part where the second transistor including a second gate electrode is to be formed, the second active region being included in a semiconductor substrate surface, the first mask pattern being disposed on a first side of the second mask pattern, the second mask pattern being disposed on a second side of the first mask pattern;

etching the semiconductor substrate using the first mask pattern and the second mask pattern as masks to form first, second, third, and fourth trenches in a manner that the first trench is formed on the first side of the first mask pattern, the second trench is formed on the second side of the first mask pattern, the second side being opposite to the first side of the first mask pattern, the third trench is formed on the first side of the second mask pattern, the fourth trench is formed on the second side of the second mask pattern, and the second trench is contiguous to the third trench;

filling lower parts of the first, the second, the third, and the fourth trenches with a first semiconductor layer having etching selectivity relative to the semiconductor substrate;

forming a second semiconductor layer on the first semiconductor layer in the first, the second, the third, and the fourth trenches, the second semiconductor layer having etching selectivity relative to the first semiconductor layer, to fill the first, the second, the third, and the fourth trenches at least up to a surface of the semiconductor substrate;

forming a device isolation groove and a hole in the semiconductor substrate in a manner that the device isolation groove defines a device region including the first, the second, the third, and the fourth trenches, the hole is formed at a boundary between the first part where the first transistor is to be formed in the device region and the second part where the second transistor is to be formed in the device region, the second semiconductor layer formed in the first trench is exposed through the device isolation groove, the second semiconductor layer formed in the fourth trench is exposed through the device isolation groove, and the second semiconductor layer formed on the second trench and the second semiconductor layer formed in the third trench are disposed through the hole;

selectively etching and removing the first semiconductor layer from the first and the fourth trenches through the device isolation groove and the first semiconductor layer from the second and the third trenches through the hole relative to the semiconductor substrate and the second semiconductor layer, to form a void in parts where the first semiconductor layer had been formed in the first, the second, the third, and the fourth trenches;

filling the void in the first, the second the third, and the fourth trenches with a third isolation film through the device isolation groove and the hole, to form first, second, third, and fourth embedded isolation film region in a manner that the first, the second, the third, and the fourth embedded isolation film regions are formed under the second semiconductor layer in the first, the second, the third, and the fourth trenches, respectively;

forming first and second gate electrodes in the first and the second active regions, respectively, via respective gate isolation films in a manner that the first gate electrode is formed on the first side of the second gate electrode and the second gate electrode is formed on the second side of the first gate electrode;

performing ion implantation by introducing an impurity element by using the first gate electrode in the first active region and the second gate electrode in the second active region as masks, to form a source extension region and a drain extension region of the first transistor on the first side and the second side, respectively, of the first gate electrode in the first active region, and a source extension region and a drain extension region of the second transistor on the first side and the second side, respectively, of the second gate electrode in the second active region;

forming first and second side wall isolation films in a manner that the first side wall isolation film is formed on each of the first and the second sides of the first gate electrode and the second side wall isolation film is formed on each of the first and the second sides of the second gate electrode; and introducing impurity element by using the first and the second gate electrodes and the first and the second side wall isolation films as masks, to form a source region of the first transistor in the second semiconductor layer in the first trench, a drain region of the first transistor in the second transistor layer in the second trench, a source region of the second transistor in the second semiconductor layer in the third trench, and a drain region of the second transistor in the second semiconductor layer in the fourth trench.

9. The method of manufacturing a semiconductor device according to claim 7,
wherein the hole is simultaneously formed with the device isolation groove.

10. The method of manufacturing a semiconductor device according to claim 7,
wherein the hole is separately formed from the device isolation groove.

11. The method of manufacturing a semiconductor device according to claim 7,
wherein a size and a figure of the hole are substantially the same as those of a via plug to be formed between the first and the second gate electrodes.

12. The method of manufacturing a semiconductor device according to claim 7,
wherein as the first through the fourth side wall isolation films, a silicon oxide film is used.

13. The method of manufacturing a semiconductor device according to claim 7,
wherein the first through the fourth side wall isolation films are formed by a vapor-phase deposition method.

14. The method of manufacturing a semiconductor device according to claim 7,
wherein the semiconductor substrates is a silicon substrate,
wherein the first semiconductor layer is a Si—Ge mixed layer,
wherein the second semiconductor layer is a silicon layer,
wherein the first and the second semiconductor layers are epitaxially grown on the silicon substrate.

* * * * *